(12) United States Patent
Gullicksen et al.

(10) Patent No.: US 11,867,901 B2
(45) Date of Patent: Jan. 9, 2024

(54) MOTION CAPTURE FOR REAL-TIME CONTROLLER AND HUMAN POSE TRACKING

(71) Applicant: Reavire, Inc., Mountainview, CA (US)

(72) Inventors: Jeff Gullicksen, Mountain View, CA (US); Wil Fabrick, San Francisco, CA (US); Ameya Lonkar, San Jose, CA (US)

(73) Assignee: Reavire, Inc., Mountain View, CA (US)

( * ) Notice: Subject to any disclaimer, the term of this patent is extended or adjusted under 35 U.S.C. 154(b) by 0 days.

(21) Appl. No.: 17/836,418

(22) Filed: Jun. 9, 2022

(65) Prior Publication Data

US 2022/0308342 A1 Sep. 29, 2022

Related U.S. Application Data

(63) Continuation of application No. 17/397,498, filed on Aug. 9, 2021, now Pat. No. 11,640,055, which is a
(Continued)

(51) Int. Cl.

| | |
|---|---|
| *G01S 5/02* | (2010.01) |
| *G01S 5/06* | (2006.01) |
| *G02B 27/00* | (2006.01) |
| *G02B 27/01* | (2006.01) |
| *G01R 33/07* | (2006.01) |

(Continued)

(52) U.S. Cl.
CPC ....... *G02B 27/0093* (2013.01); *G01R 33/072* (2013.01); *G01S 5/0226* (2013.01); *G01S 5/06* (2013.01); *G01S 11/026* (2013.01); *G02B 27/0172* (2013.01); *G02B 2027/0138* (2013.01); *G02B 2027/0161* (2013.01);
(Continued)

(58) Field of Classification Search
CPC ............ G02B 27/0093; G02B 27/0172; G01R 33/072; G01S 5/0226; G01S 5/06; G01S 11/026
USPC ........................................................ 342/407
See application file for complete search history.

(56) References Cited

U.S. PATENT DOCUMENTS

| | | |
|---|---|---|
| 4,742,300 A | 5/1988 | Lenz et al. |
| 5,917,449 A | 6/1999 | Sanderford et al. |

(Continued)

FOREIGN PATENT DOCUMENTS

| | | | | |
|---|---|---|---|---|
| CN | 104902564 | | 9/2015 | |
| CN | 106255943 A | * | 12/2016 | ........... G02B 27/017 |

(Continued)

OTHER PUBLICATIONS

T. von Marcard et al., "Sparse Inertial Poser: Automatic 3D Human Pose Estimation from Sparse IMUs" (EUROGRAPHICS 2017 / L. Barthe and B. Benes, vol. 36 (2017), No. 2).

*Primary Examiner* — Harry K Liu
(74) *Attorney, Agent, or Firm* — BainwoodHuang

(57) ABSTRACT

A method of tracking wearable sensors attached to respective body parts of a user includes acquiring multiple yaw measurements from a wearable sensor by measurement circuitry within the wearable sensor, calculating errors in the yaw measurements based on comparisons of the yaw measurements with one or more yaw references, and correcting the yaw measurements by removing the errors.

19 Claims, 15 Drawing Sheets

Related U.S. Application Data continuation of application No. 16/422,073, filed on May 24, 2019, now Pat. No. 11,086,124.

(60) Provisional application No. 62/803,075, filed on Feb. 8, 2019, provisional application No. 62/684,586, filed on Jun. 13, 2018.

(51) Int. Cl.
  *G01S 11/02* (2010.01)
  *G06F 3/01* (2006.01)
  *G06F 3/0346* (2013.01)
  *H01Q 21/28* (2006.01)

(52) U.S. Cl.
  CPC ...... *G02B 2027/0187* (2013.01); *G06F 3/012* (2013.01); *G06F 3/0346* (2013.01); *H01Q 21/28* (2013.01)

(56) References Cited

U.S. PATENT DOCUMENTS

| | | |
|---|---|---|
| 5,964,701 A | 10/1999 | Asada et al. |
| 5,999,208 A | 12/1999 | McNerney et al. |
| 6,249,680 B1 | 6/2001 | Wax et al. |
| 7,116,105 B1 | 10/2006 | Zhang |
| 7,692,532 B2 | 4/2010 | Fischer et al. |
| 8,150,384 B2 | 4/2012 | Abifaker et al. |
| 8,203,487 B2 | 6/2012 | Hol et al. |
| 8,965,582 B2 | 2/2015 | Pechev |
| 9,001,120 B2 | 4/2015 | Steedly et al. |
| 9,001,129 B2 | 4/2015 | Rhee et al. |
| 9,041,622 B2 | 5/2015 | McCulloch et al. |
| 9,084,217 B2 | 7/2015 | Wax et al. |
| 9,288,632 B2 | 3/2016 | Yang et al. |
| 9,516,503 B2 | 12/2016 | Berns et al. |
| 9,523,576 B2 | 12/2016 | Bellusci et al. |
| 9,843,772 B2 | 12/2017 | Lee et al. |
| 10,415,975 B2 | 9/2019 | Bellusci et al. |
| 10,503,351 B2 | 12/2019 | Gullicksen |
| 11,054,638 B2 | 7/2021 | Gullicksen et al. |
| 2002/0060648 A1 | 5/2002 | Matsui et al. |
| 2004/0080412 A1 | 4/2004 | Smith et al. |
| 2004/0155962 A1 | 8/2004 | Marks |
| 2005/0093887 A1 | 5/2005 | Shouji |
| 2006/0022815 A1 | 2/2006 | Fischer et al. |
| 2006/0143292 A1 | 6/2006 | Taubenheim et al. |
| 2009/0278791 A1 | 11/2009 | Slycke et al. |
| 2010/0293607 A1 | 11/2010 | Hall et al. |
| 2011/0246908 A1 | 10/2011 | Akram et al. |
| 2013/0141419 A1 | 6/2013 | Mount et al. |
| 2013/0172007 A1 | 7/2013 | Wax et al. |
| 2013/0196772 A1 | 8/2013 | Latta et al. |
| 2013/0230211 A1 | 9/2013 | Tanabiki et al. |
| 2013/0244684 A1 | 9/2013 | Kadous et al. |
| 2013/0326364 A1 | 12/2013 | Latta et al. |
| 2013/0328762 A1 | 12/2013 | McCulloch et al. |
| 2014/0160129 A1 | 6/2014 | Sako et al. |
| 2014/0204077 A1 | 7/2014 | Kamuda et al. |
| 2014/0295878 A1 | 10/2014 | Yang et al. |
| 2014/0306891 A1 | 10/2014 | Latta et al. |
| 2015/0091790 A1 | 4/2015 | Forutanpour et al. |
| 2015/0121465 A1 | 4/2015 | Berns et al. |
| 2015/0355462 A1 | 12/2015 | Saito et al. |
| 2016/0026253 A1 | 1/2016 | Bradski et al. |
| 2016/0041391 A1 | 2/2016 | Van Curen et al. |
| 2016/0066847 A1* | 3/2016 | Sales ............... A61B 5/1116 600/595 |
| 2016/0093108 A1 | 3/2016 | Mao et al. |
| 2016/0127372 A1 | 5/2016 | Unterschuetz |
| 2016/0133230 A1 | 5/2016 | Daniels et al. |
| 2016/0205352 A1 | 7/2016 | Lee et al. |
| 2016/0360970 A1 | 12/2016 | Tzvieli et al. |
| 2017/0032207 A1 | 2/2017 | Yoon et al. |
| 2017/0052373 A1 | 2/2017 | Memmott et al. |
| 2017/0072316 A1 | 3/2017 | Finfter |
| 2017/0193289 A1 | 7/2017 | Karmon et al. |
| 2017/0221379 A1 | 8/2017 | Onda |
| 2017/0315620 A1 | 11/2017 | Johri |
| 2017/0329419 A1 | 11/2017 | Dearman et al. |
| 2018/0005445 A1 | 1/2018 | McCulloch et al. |
| 2018/0082565 A1 | 3/2018 | Braiman |
| 2018/0108325 A1 | 4/2018 | Schwarz et al. |
| 2018/0161624 A1 | 6/2018 | Wrigg |
| 2019/0018047 A1 | 1/2019 | Fukuhara et al. |
| 2019/0130167 A1* | 5/2019 | Ng ..................... G06V 40/166 |
| 2019/0356848 A1* | 11/2019 | Rydberg .............. A63F 13/212 |
| 2019/0375424 A1* | 12/2019 | Aiuto ................. B60W 40/105 |

FOREIGN PATENT DOCUMENTS

| | | | |
|---|---|---|---|
| CN | 106530890 A | * 3/2017 | .......... G02B 27/017 |
| CN | 112610408 A | * 4/2021 | |
| KR | 1020160000873 | 1/2016 | |
| WO | 2003075125 | 9/2003 | |
| WO | 2013028908 | 2/2013 | |

\* cited by examiner

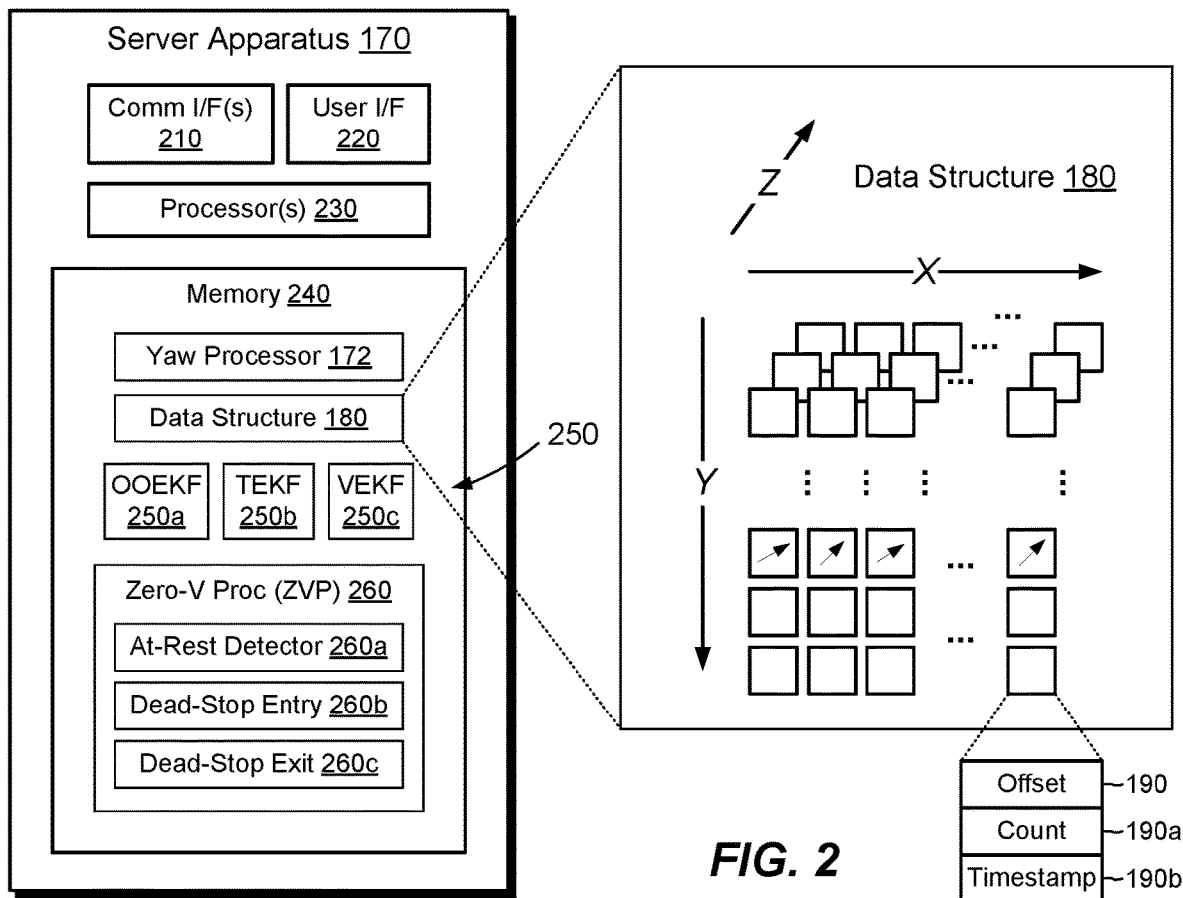
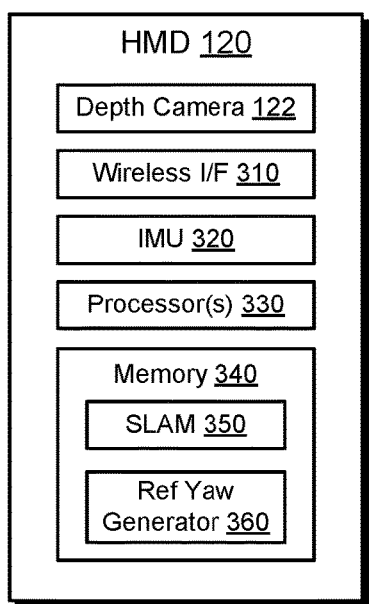
FIG. 3
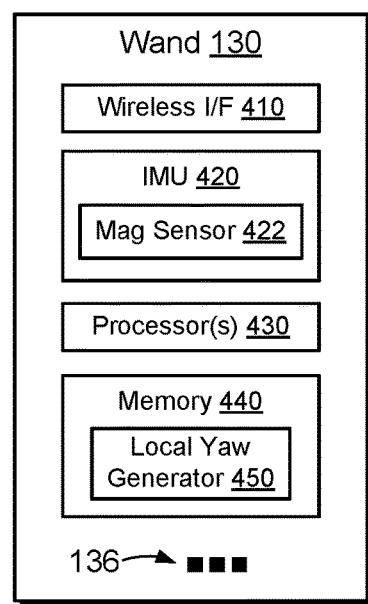
FIG. 4

MOTION CAPTURE FOR REAL-TIME CONTROLLER AND HUMAN POSE TRACKING

CROSS-REFERENCE TO RELATED APPLICATIONS

This application is a continuation of copending U.S. patent application Ser. No. 17/397,498, filed Aug. 9, 2021, which is a continuation of U.S. patent application Ser. No. 16/422,073, filed May 24, 2019, which claims the benefit of U.S. Provisional Application No. 62/684,586, filed Jun. 13, 2018, and of U.S. Provisional Application No. 62/803,075, filed Feb. 8, 2019. The contents and teachings of each of the above applications are incorporated herein by reference in their entirety.

BACKGROUND

Motion capture (MoCap) is a long-established art. Multi-camera systems that track markers on the body for applications such as motion pictures have been in use for decades. So-called markerless systems were developed more recently to eliminate the extensive setup requirements of camera-based systems. Markerless systems have been developed and optimized for applications as diverse as biomechanics and VR (virtual reality) gaming. Companies such as IKI-NEMA (body motion for film and more recently VR applications), Xsens (motion capture solution) and Bodykinetix (wireless motion-capture system) are established companies in this market.

VR systems (such as Vive and Oculus) use 3-point tracking to generate an avatar. The three points tracked in this type of system are: (1) Controller held in the right hand; (2) Controller held in the left hand; and (3) Head-mounted VR display.

Some systems use a small number of IMU (inertial measurement unit) sensors on the body. An example of this type of system is defined by T. von Marcard et al., "Sparse Inertial Poser: Automatic 3D Human Pose Estimation from Sparse IMUs" (EUROGRAPHICS 2017/L. Barthe and B. Benes, Volume 36 (2017), Number 2). This paper describes a full-body motion capture system with six IMUs.

SUMMARY

Unfortunately, there are deficiencies with the above-described approaches. With VR systems that use 3-point tracking, it is only necessary to generate a realistic-looking avatar, not necessarily to track pose accurately. Also, both hand-held controllers must remain in view of the cameras on the head-mounted VR display in order for these systems to function. The Sparse Inertial Power (SIP) system provides impressive results, but limitations still exist, such as: (1) Non-real-time performance for pose tracking; (2) No solution for controller tracking; (3) No flexibility in how avatars are skinned. (For the SMPL body model case.); and limitation to outdoor use.

In contrast with prior approaches, certain embodiments are directed to an improved technique that accurately tracks pose without reliance on cameras, supports more real-time operations, and is not limited to outdoor use.

Certain embodiments are directed to a method of tracking wearable sensors attached to respective body parts of a user. The method includes acquiring multiple yaw measurements from a wearable sensor by measurement circuitry within the wearable sensor, calculating errors in the yaw measurements based on comparisons of the yaw measurements with one or more yaw references, and correcting the yaw measurements by removing the errors.

Other embodiments are directed to a method of tracking wearable sensors attached to respective body parts of a user. The method includes acquiring multiple yaw measurements from a wearable sensor by measurement circuitry within the wearable sensor, calculating errors in the yaw measurements based on comparisons of the yaw measurements with a direction of motion of the user in a physical space, and correcting the yaw measurements by removing the errors.

The above-described techniques may be embodied as methods. They may also be embodied as one or more computerized systems constructed and arranged to perform any of the above-described methods. Such methods may further be embodied as a computer program product. The computer program product stores instructions which, when executed on control circuitry of a computerized apparatus, cause the computerized apparatus to perform any of the above-described methods.

The foregoing summary is presented for illustrative purposes to assist the reader in readily grasping example features presented herein; however, this summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments, as illustrated in the accompanying drawings, in which like reference characters refer to the same or similar parts throughout the different views. The drawings are not necessarily to scale, emphasis instead being placed upon illustrating the principles of various embodiments.

FIG. 2 is a block diagram of an example server apparatus used in the environment of FIG. 1.

FIG. 3 is a block diagram of an example head-mounted display (HMD) used in the environment of FIG. 1.

FIG. 4 is a block diagram of an example device (e.g., wand) used in the environment of FIG. 1.

DETAILED DESCRIPTION

Embodiments of the improved technique will now be described. One should appreciate that such embodiments are provided by way of example to illustrate certain features and principles but are not intended to be limiting.

This disclosure is presented in the following sections:
Section I describes example techniques for measuring a yaw direction of a device in space;
Section II describes example techniques for detecting a velocity state of a device; and
Section III describes example techniques for locating objects in a World Coordinate System (WCS).
Section IV describes example motion capture techniques for tracking human pose.

Section I: Yaw Measurement

This section describes an improved technique for measuring yaw (left-right direction) of a device. The technique includes obtaining a first measurement of an orientation of the device relative to a local magnetic frame of reference (FoR) and a second measurement of the orientation of the device relative to a spatial FoR, with both measurements made while the device is disposed at a known location and in the same orientation. The technique further includes computing an offset between the two measurements and storing the offset in connection with the known location. When the device later returns to the same location, the yaw direction of the device is determined based on acquiring a new measurement of the device's orientation in the local magnetic FoR and applying the offset as a correction.

Figure 1:
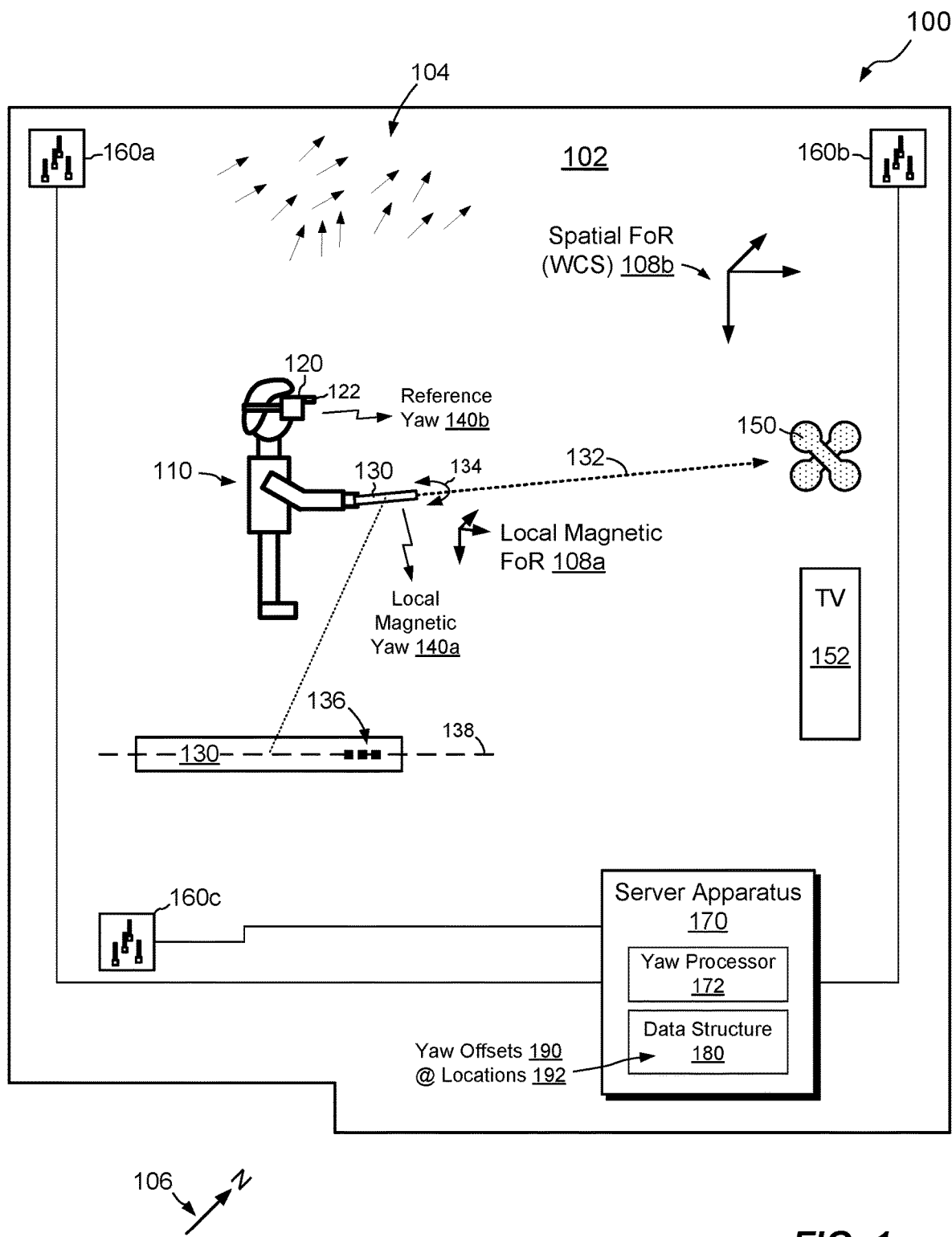
FIG. 1 is a block diagram of an example environment in which embodiments of the improved technique can be practiced.

FIG. 1 shows an example environment 100 in which embodiments of the improved technique can be practiced. As shown, the environment 100 includes a physical space 102, such as a room, building, or other indoor or outdoor area. The space 102 is permeated by a magnetic field 104, which tends to vary over space, as shown by the differently-pointing arrows. Although depicted for neatness over only a small patch of the space 102, the magnetic field 104 extends throughout the entire space 102 and roughly aligns with the Earth's magnetic field 106. Variability in the magnetic field 104 as measured in the space 102 may arise from nearby objects that have magnetic properties. To the extent that these objects do not change location or operating state over time (an appliance might produce different magnetic effects when on than when off), the magnetic field 104 remains stationary, varying over space but not significantly over time. The magnetic field 104 in the space 102 can thus be regarded as quasi-stationary.

As further shown, a user 110 in the space 102 wears a head-mounted display (HMD) 120 and holds a device 130. The HMD 120 may be VR (Virtual Reality) goggles, AR (Augmented Reality) goggles, MR (Mixed Reality) goggles, or the like, with suitable examples including the Microsoft HoloLens, Oculus Rift, or Magic Leap. The HMD 120 may include a camera, such as a wide-field depth camera 122, which the HMD 120 uses for imaging its surroundings in three dimensions. For example, the depth camera 122 generates images and projects pulses of light in the environment 100. The depth camera 122 uses reflections of those pulses to detect depth, such that pixels in the generated images have associated depth values. The field of view of the depth camera 122 is typically wide enough to include the device 130, even if the user 110 is not looking directly at the device 130 through the HMD 120. Embodiments are not limited to depth cameras, to depth cameras that operate as described, or even to cameras, however.

Both the HMD 120 and the device 130 are capable of wireless communication, such as using Wi-Fi and/or Bluetooth. The device 130 includes an IMU (Inertial Measurement Unit) configured to measure the device's orientation in space, e.g., using a gravity sensor and a magnetometer. The magnetometer is configured to sense the local magnetic field 104 and to establish a local magnetic frame of reference (FoR), which enables the device 130 to orient itself in a yaw (left-right) direction 134, such as by measuring its own yaw angle with respect to the direction of local magnetic north. In a particular example, device 130 is a wireless pointing device configured to project a virtual ray 132 for selecting and controlling objects, such as hologram 150 (a virtual object) or TV 152 (a physical object). Ideally, the virtual ray 132 aligns with a long axis 138 of the device 130. The pointing device 130 may construct the virtual ray 132 based on knowledge of its own location and knowledge of the angle in which it is pointing. An example of a pointer device that meets this description is disclosed in U.S. patent application Ser. No. 15/655,489, filed Jul. 20, 2017, the contents and teachings of which are incorporated herein by reference in their entirety. Embodiments are not limited to this type of pointing device, however, but rather may include any type of device capable of sensing and reporting its own yaw direction relative to a local magnetic field. Many common devices satisfy these requirements, such as certain smart phones, tablet computers, PDAs (Personal Data Assistants), gaming consoles, remote controls, and the like.

Disposed at one or more locations around the space 102 are antenna arrays 160. Three antenna arrays 160a, 160b, and 160c are shown, but the space 102 may include any number of antenna arrays 160, including only a single antenna array. Each antenna array 160 includes one or more antennas and connects to a server apparatus, or simply "server," 170. Details of the antenna arrays 160 are not critical for purposes of yaw correction, as any conventional Wi-Fi (IEEE 802.11) or Bluetooth antenna will suffice. In some examples, an antenna array 160 is integrated with the server 170 in a single assembly. As shown, server 170 includes a yaw processor 172 and a data structure 180.

In example operation, the user 110 moves around the space 102, wearing the HMD 120 and holding the device 130. The user 110 may wish to use the device 130 as a pointer to various objects, such as hologram 150 or TV 152 (the HMD 120 may render the hologram 150 to the user). A problem arises, however, in that the device 130 on its own can only determine its yaw direction 134 relative to its own local magnetic north, e.g., based on magnetic north as measured by the magnetometer in its IMU. The magnetometer in device 130 may be accurate for measuring local magnetic north, but that local magnetic north may not be pointing to true magnetic north and typically varies from one place to another within the space 102. Given that the pointing accuracy of the virtual ray 132 is only as good as the knowledge of yaw direction 134, erroneous knowledge arising from variations in magnetic field 104 can cause large pointing errors.

To address these errors, embodiments map the local magnetic field 104 over portions of the space 102. Mapping may be accomplished by obtaining measurements of the device's orientation in a local magnetic FoR 108a and comparing them with measurements, made by a separate instrument, of the device's orientation in a spatial FoR 108b, thus producing respective yaw offsets 190. In an example, the local magnetic FoR 108a is based on a magnetic sensor and a gravity sensor in the device 130, and the spatial FoR 108b is based on geometry of the space 102. Spatial FoR 108b is expressed in a coordinate system of the space 102, which we call a World Coordinate System, or "WCS." The WCS may be an X-Y-Z coordinate system, or some other spatial coordinate system. We refer to an orientation measurement made in the local magnetic FoR 108a as a "local magnetic yaw" 140a, and to an orientation measurement in the spatial FoR 108b as a "reference yaw" 140b. Each yaw offset 190 can thus be regarded as a difference between a reference yaw 140b and a local magnetic yaw 140a. The server 170 stores yaw offsets 190 in data structure 180 in connection with corresponding locations 192. Later, when the device 130 returns to the same locations, the server 170 may apply the yaw offsets 190 to correct new measurements of local magnetic yaw 140a at the same locations, without the need to obtain new measurements of reference yaw 140b. Over time, the data structure 180 realizes an offset map that enables devices to estimate their true yaw directions merely by measuring their own local magnetic yaw 140a and applying offsets 190 for the respective locations as corrections.

Reference yaw values 140b may be provided by any observer that is capable of imaging the device 130 and expressing its spatial yaw in the spatial (WCS) FoR 108b. We have found that the depth camera 122 is well-suited for this task, as the HMD 120, which contains the depth camera 122, generally has possession of its own location and orientation in the spatial FoR 108b. By imaging the device 130 using the depth camera 122, the HMD 120 can process the image and calculate values of reference yaw 140b of the device 130 relative to the spatial FoR 108b.

Certain optimizations may facilitate this task. For example, the device 130 may be equipped with markings 136, such as shiny black regions, which the depth camera 122 interprets as distant areas or holes. The depth holes left by the markings 136 enable the HMD 120 to calculate the location and orientation of the device 130 relative to a local FoR of the HMD 120, and to translate that location into the spatial FoR 108b. One should appreciate that embodiments are not limited to devices having markings or to the use of depth cameras. For example, other cameras or imaging instruments having known locations may be used, and those instruments may rely on features other than markings 136 for locating and orienting the device 130.

As the user 110 moves to different locations in the space 102, the magnetic sensor in the device 130 measures yaw directions of the device 130 and the device 130 processes those yaw directions to produce values of local magnetic yaw 140a. At the same locations, the HMD 120 captures respective images of the device 130 using the depth camera 122 and generates respective values of reference yaw 140b. The two measurements 140a and 140b for a given location preferably derive from an image and a magnetic sample acquired simultaneously, or nearly so, so that each measurement pair {140a, 140b} reflects the same location 192 and the same physical orientation of the device 130. In an example, device 130 sends its measurements of magnetic yaw 140a to the server 170, and HMD 120 does likewise for its measurements of reference yaw 140b. For each pair of measurements {140a, 140b}, the server 170 computes a respective yaw offset 190 (e.g., as 140b minus 140a) and stores the yaw offset 190 in connection with the respective location 192, i.e., the location of the device 130 at which the image and magnetic sample for that measurement pair were acquired.

Over time, the server 170 fills the data structure 180 with offset values 190 for the respective locations 192. As individual offset values are likely to have significant noise, the server 170 may apply averaging to promote smoothness. For example, if a location 192 is visited more than once, the server 170 may generate a new offset 190 for that location and average the new offset with the existing one. In some examples, the data structure 180 maintains a count of the number of visits to each location 192 and computes the average as a weighted average. For instance, if the current visit to a location is the tenth visit to that location, the new offset may be given a weight of one-tenth. In some examples, old values of offset are given lower weights than newer ones, allowing the data structure 180 to adapt to changes in local magnetic field 104 by aging out older values. In some examples, the data structure 180 also stores a timestamp that indicates the last time a new offset at each location 192 was generated. Very old entries, as indicated by timestamp, may be aged out more aggressively than newer ones.

In some examples, particularly those in which pointing accuracy is especially critical, the server 170 waits for some level of offset averaging to occur before it allows offsets to be used for yaw correction. For example, the server 170 may wait for the count at a current location to exceed a threshold, may wait for a certain amount of time to pass (as measured by a difference between the current time and the timestamp for that location), and/or may wait until the offset at the current location changes by more than a specified amount.

In some examples, the server 170 also uses averaging when responding to offset requests. For example, when the device 130 enters a previously-visited location, the device can measure its local magnetic yaw 140a and contact the server 170 for the corresponding offset for that location. Rather than responding with only that one offset value (the one stored for the current location) the server 170 may instead compute a spatial average of the current offset with offsets of its neighbors, where a "neighbor" is a location adjacent to the current location. Depending on the dimensional granularity of the data structure 180, only immediately adjacent neighbors may be averaged together, or neighbors within a specified bounding region may be averaged together. The averaging need not be uniform. For example, closer offsets may be given higher weights in the averaging than more distant ones, and offsets with higher counts and/or more recent timestamps may be given higher weights than those with lower counts and/or older timestamps, which are less likely to be reliable.

Sometimes, the device 130 enters a location 192 for which no offset 190 has been stored, but the depth camera 122 or other instrument is blocked (or otherwise unavailable) and cannot image the device 130. In such cases, the server 170 may estimate an offset for the current location based on offsets of the current location's neighbors. For example, the server 170 may average neighboring offsets, giving higher weights to closer, newer, and/or more-often visited locations than to those that are less so. Thus, the server 170 is capable of producing a corrected yaw measurement for a location, even in the absence of any reference yaw 140b of the device 130 at that location.

Over time, acquiring measurements of reference yaw 140b (e.g., from depth camera 122) may become less necessary, as offsets in the data structure 180 tend to stabilize. Then, the device 130 may rely on offsets 190 as being correct and simply apply the offsets to its local magnetic yaw measurements 140a to generate corrected values of yaw, checking them with new reference yaw measurements 140b only occasionally. In some examples, the server 170 may perform spatial averaging of offsets as a general rule when responding to offset requests. Such spatial averaging has the effect of smoothing pointer direction when the device 130 is moving and helps to prevent sudden jumps. In some examples, the particulars of spatial averaging depend on detected motion. For example, if it is known that the device 130 is stationary (e.g., using the techniques described in Section II), the spatial averaging may be uniform in direction and may cover only a small region surrounding the current location. However, if it is known that the device 130 is moving in a particular direction, then spatial averaging may be biased in favor of the known direction, giving more weight to offsets at locations in the direction of motion than to offsets in other directions.

Although the server 170 may generate each value of offset 190 based on a single image and a single magnetic sample, some embodiments use multiple images and/or magnetic samples to generate a single offset value. For example, the server 170 may provide one or more Kalman filters to estimate and smooth measurements of local magnetic yaw 140a and/or reference yaw 140b. Also, if the device 130 is known to be stationary at a particular moment, the server 170 may leverage this knowledge of the stationary state to narrow the variance of the Kalman filter(s) and/or to perform other averaging, filtering, and/or processing, for improving the accuracy of the offset value by reducing its noise.

FIGS. 2-4 show more detailed views of the server 170, HMD 120, and device 130, respectively. As shown in FIG. 2, the server 170 includes one or more communication interfaces 210, such as Wi-Fi and/or Bluetooth interfaces and an Ethernet interface, a user interface 220 (e.g., mouse, keyboard, monitor, etc.), a set of processors 230 (e.g., one or more processor chips, co-processors, and/or assemblies), and memory 240. The memory 240 may include both volatile memory, such as random-access memory (RAM), and non-volatile memory, such as one or more disk drives, solid state drives, or the like. The set of processors 230 and the memory 240 form control circuitry, which is constructed and arranged to carry out various methods and functions as described herein. Also, the memory 240 includes a variety of software constructs realized in the form of executable instructions. When the executable instructions are run by the set of processors 230, the set of processors 230 carry out the operations of the software constructs. Although certain software constructs are specifically shown and described herein, it is understood that the memory 240 typically includes many other software constructs, which are not shown, such as an operating system, various applications, processes, and daemons.

As further shown in FIG. 2, the memory 240 "includes," i.e., realizes by execution of software instructions, the above-mentioned yaw processor 172 and data structure 180, as well as extended Kalman filters 250 and a zero-velocity processor (ZVP) 260.

The extended Kalman filters (EKFs) 250 are configured to estimate and smooth measures of device orientation and motion in the presence of noisy inputs. In this example, extended Kalman filters are preferred over conventional ones, as extended Kalman filters are better at handling non-linearity, which is common in cases of rotational movement. In the example shown, the EKFs include an orientation-only EKF (OOEKF) 250a, a tracking EKF (TEKF) 250b, and a velocity EKF (VEKF) 250c. The OOEKF 250a is configured to receive values of local magnetic yaw 140a and to track orientation of the device 130 in its local magnetic FoR 108a, preferably tracking no other characteristics of the device 130, such as its position or velocity. Limiting the application of the OOEKF 250a to orientation-only promotes stable tracking of device orientation in the local magnetic FoR 108a. In addition to providing a filtered version of local magnetic yaw 140a, for purposes of yaw correction, the OOEKF 250a also provides input to the ZVP 260, e.g., to help determine a velocity state of the device 130.

The TEKF 250b is configured to receive values of reference yaw 140b, as well as IMU input, and to track both orientation and location of the device 130 in the spatial FoR 108b. The TEKF 250b provides a processed version of reference yaw values 140b for performing yaw correction. It also provides estimates of full device orientation (e.g., yaw, pitch, and roll) and device locations 192, which inform the server 170 as to the locations 192 at which offsets 190 are to be stored and/or retrieved.

The VEKF 250c is configured to track the full pose (position and orientation) of the device 130 in the local magnetic FoR 108a. In an example, the VEKF 250c performs no direct role in yaw measurement but is rather relevant to determination of velocity state, which is described more fully in Section II.

Shown to the right of FIG. 2 are further example details of the data structure 180. Here, data structure 180 may be arranged as a spatial data structure, e.g., as one that provides a respective index for each spatial dimension, such as X, Y, and Z, which may correspond to the dimensions of the WCS. Arranging the data structure 180 in this manner promotes fast lookups and provides a simple basis for locating neighbors, e.g., for purposes of averaging offset values.

As shown at the bottom-right of FIG. 2, each element of the data structure 180 may include the computed offset 190 for the respective location, as well as a count 190a and a timestamp 190b. In an example, the count 190a stores the number of offset values that have been averaged together to produce the respective offset 190. The timestamp 190b reflects the time of last update of the respective offset 190.

The data structure 180 may represent the space 102 at any desired level of granularity, such as 10-cm cubes, 1-cm cubes, and so forth, limited only by the stability of the WCS. In some examples, the data structure 180 is arranged hierarchically, with cubes representing regions and each region including multiple elements. Many variations are contemplated.

FIG. 3 shows certain features of the HMD 120 in additional detail. As shown, HMD 120 includes the above-described depth camera 122, as well as a wireless interface 310 (e.g., Wi-Fi and/or Bluetooth), an IMU 320, a set of processors 330, and memory 340. The memory 340 may include a SLAM (Stabilization, Localization, and Mapping) system 350 and a reference yaw generator 360. The SLAM system 350 is configured to locate and orient the HMD 120 in space, e.g., based on inputs from the depth camera 122 and IMU 320. The reference yaw generator 360 is configured to analyze images of the device 130, as acquired by the depth camera 122, to apply computer-vision techniques to determine the yaw direction of the device 130 relative to a local FoR of the HMD 120, and to transform that yaw direction into values of reference yaw 140b relative to the spatial FoR 108b. The processor(s) 330 and memory 340 form control circuitry, which is constructed and arranged to carry out the functions of the SLAM system 350 and reference yaw generator 360.

FIG. 4 shows certain features of the device 130 in additional detail. As shown, device 130 includes a wireless interface 410 (e.g., Wi-Fi and/or Bluetooth), an IMU 420, a set of processors 430, and memory 440. The IMU 420 includes a magnetic sensor 422, such as a magnetometer, and the memory 440 includes a local yaw generator 450. The local yaw generator 450 is configured to receive input from the magnetic sensor 422 and to produce values of local magnetic yaw 140a. The processor(s) 430 and memory 440 form control circuitry, which is constructed and arranged to carry out the functions of the local yaw generator 450. The device 130 may also include markings 136, as were introduced in FIG. 1.

Figure 5:
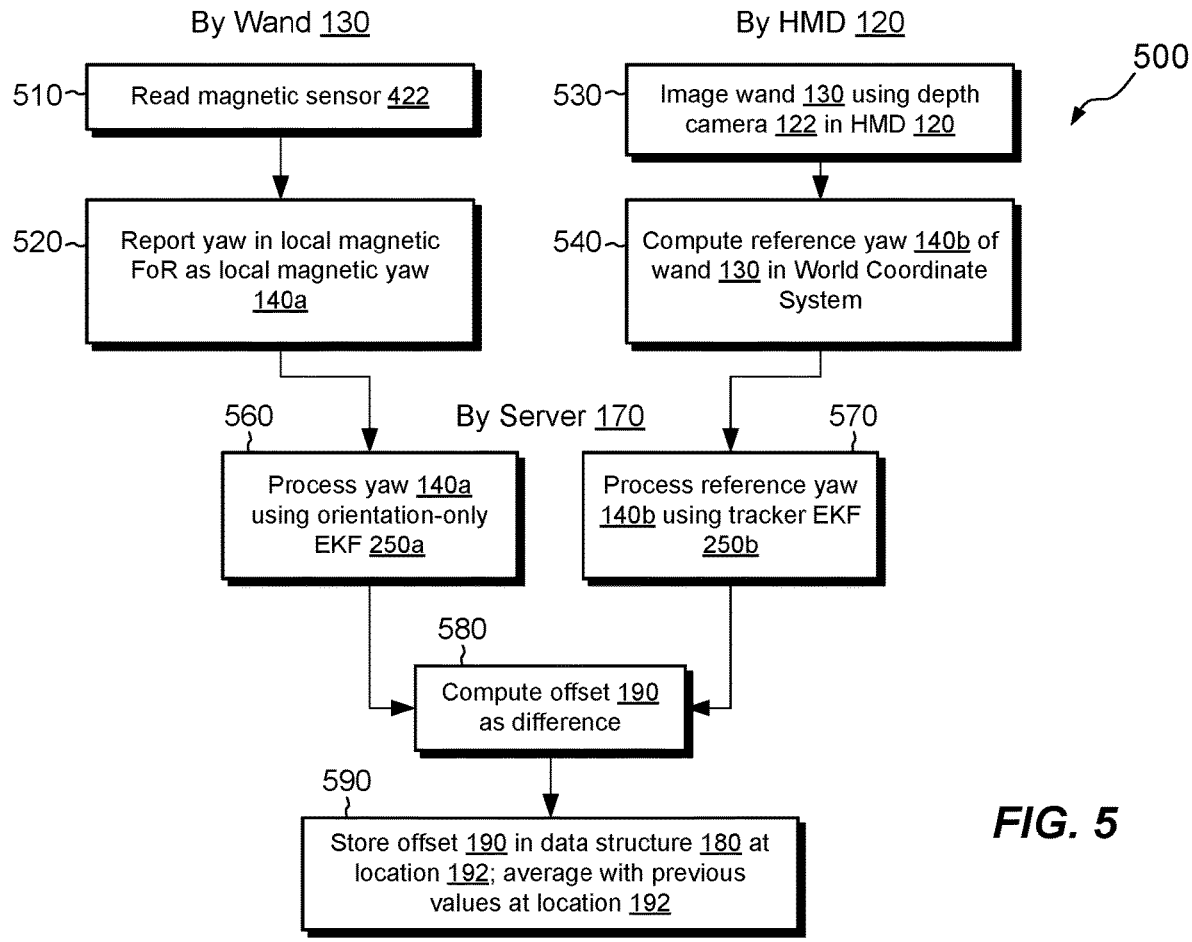
FIG. 5 is a flowchart showing an example method of generating an offset that represents a difference between a spatial direction of a device and a local magnetic field direction as reported by the device.

FIG. 5 shows an example method 500 for generating yaw offset values and involves activities performed by the device 130, the HMD 120, and the server 170. Although the acts of method 500 are shown in a particular order, the order shown is merely an example, as the method 500 may be performed in orders different from that shown, which may include performing some acts simultaneously.

At 510, the device 130 (e.g., the "wand") obtains its yaw direction relative to local magnetic north as detected by the magnetic sensor 422. At 520, the local yaw generator 450 in the device 130 processes the input from the magnetic sensor 422 and generates a measure 140a of local magnetic yaw, which it reports to the server 170. The measure 140a of local magnetic yaw is referenced to the local magnetic FoR 108a, which is based on the device's own measure of magnetic north and on its observed direction of gravity, e.g., as read by its IMU 420.

At or about the same time that the device 130 is performing these functions, the HMD 120 performs corresponding functions 530 and 540. At 530, the HMD 120 images the device 130 using the depth camera 122. At 540, the reference yaw generator 360 computes the reference yaw 140b of the device 130 in the spatial FoR 108b.

At 560, the server 170 receives the local magnetic yaw 140a and processes the local magnetic yaw 140a using the OOEKF 250a. Likewise, at 570 the server 170 receives the reference yaw 140b and processes the reference yaw 140b using the TEKF 250b. At 580, the server 170 computes the offset 190, e.g., as the difference between the processed versions of the reference yaw 140b and the local yaw 140a.

At 590, the server 170 stores the newly computed offset 190 in the data structure 180, e.g., in an element of the data structure 180 that corresponds to the X-Y-Z location of the device 130 when the acts 510 and 530 were performed. If an offset value is already present in this element of the data structure 180, the server 170 updates the current offset to reflect an average of the current offset with the new one, optionally weighting the average as described above.

Figure 6:
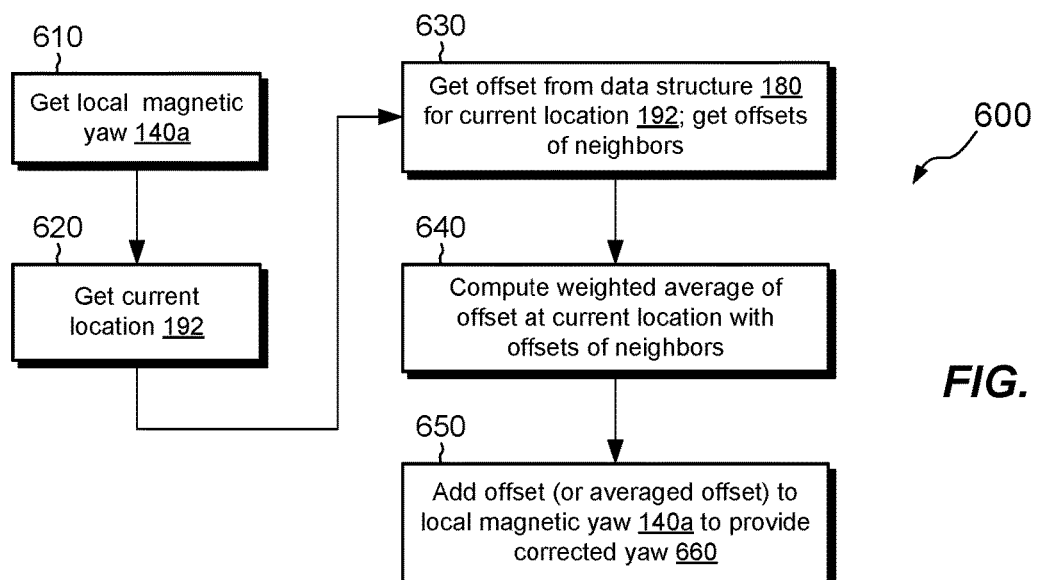
FIG. 6 is a flowchart showing an example method of applying an offset, such as the offset generated in FIG. 5, to correct a pointing direction of a device given the direction of the local magnetic field as reported by the device.

FIG. 6 shows an example method 600 for applying offset values stored in the data structure 180. As above, the order shown is merely illustrative and should not be construed as limiting.

At 610, device 130 reads its magnetic sensor 422 in the IMU 420 and provides a measurement of local magnetic yaw 140a.

At 620, the server 170 provides a current location 192 of the device 130. For example, the TEKF 250b tracks the location of the device 130 based on input from the HMD 120, IMU 420, data structure 180, and ZVP 260, computing each next location based at least in part on the current one.

At 630, the server 170 performs a lookup into the data structure 180, e.g., using the current location 192 as X-Y-Z indices, and obtains the offset 190 at the specified location. In some examples, the server 170 also obtains offset values from neighboring locations, e.g., at adjacent indices or regions in the data structure 180.

At 640, the server 170 computes a weighted average of offsets, which includes the offset at the current location and the offsets of its neighbors. This act may be skipped if averaging is not performed.

At 650, the server 170 adds the offset, which may be averaged, to the local magnetic yaw 140a obtained at 610, to provide a corrected yaw direction 660. Such addition may be accomplished, for example, by operation of the TEKF 250b, which may apply the yaw offset in a measurement function to enable the TEKF 250b to track the device 130 in the spatial FoR 108b. With the corrected yaw direction 660 in hand, the server 170 can accurately orient the device 130 in yaw, such that any virtual rays 132 from the device 130 align with the axis 138 of the device 130, thereby enabling the device 130 to be used as an accurate pointer.

Figure 7:
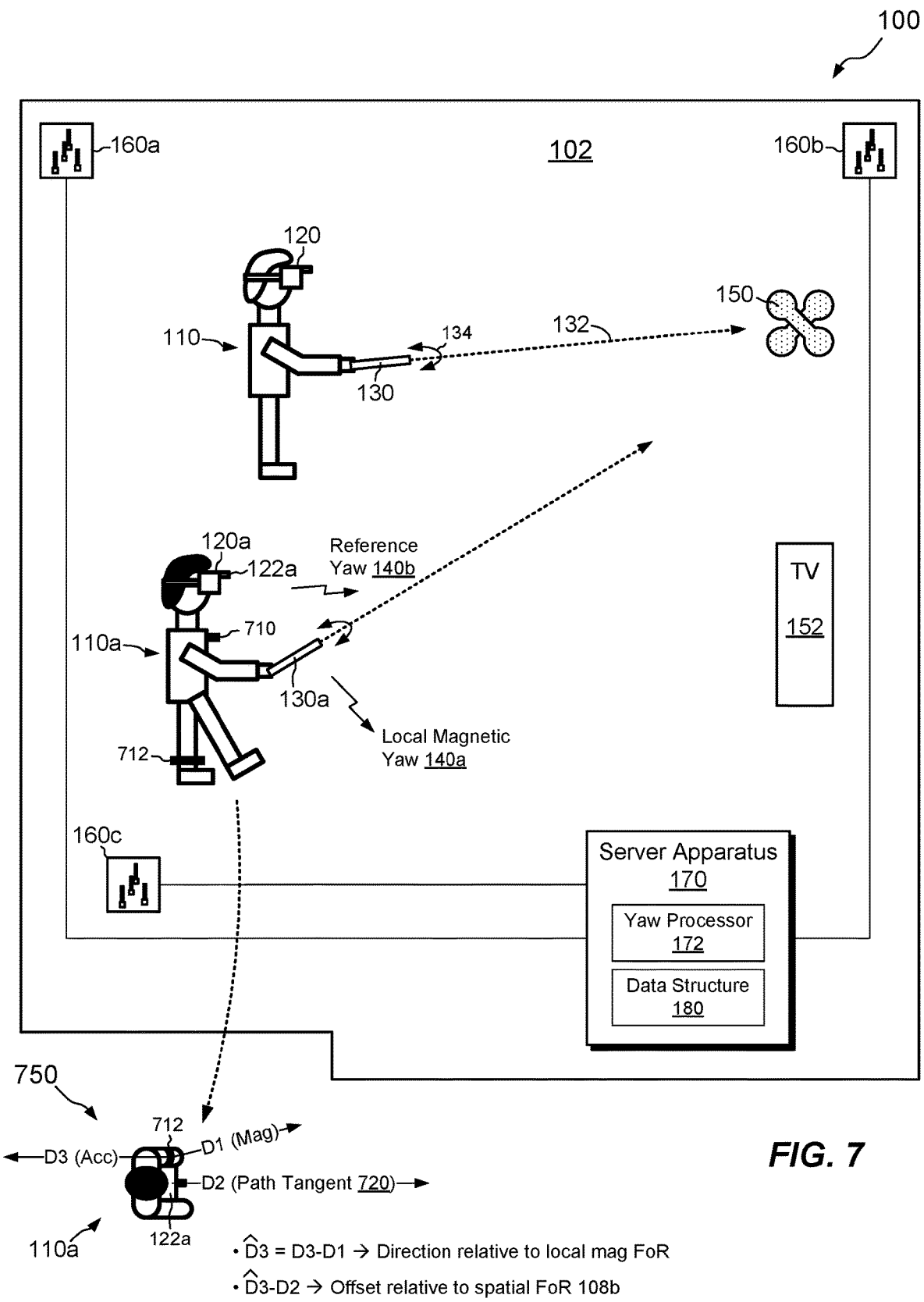
FIG. 7 is a block diagram of the example environment of FIG. 1, further showing a sharing of offsets among devices and/or users.

FIG. 7 shows an arrangement similar to that of FIG. 1, but here the user 110 shares the space 102 with a second user 110a. The second user 110a wears an HMD 120a, which may have its own depth camera 122a, and carries a device 130a, which may be similar to the device 130. In the example shown, the second user 110a is outfitted with additional devices, such as a chest sensor 710 and an ankle sensor 712. Each of these sensors 710 or 712 may have its own Wi-Fi interface and its own IMU, which includes a magnetic sensor, gyroscopes, and/or accelerometers. The sensors 710 and 712 may thus have similar capabilities in relevant respects to the devices 130 and 130a. For example, each sensor or device may be capable of generating its own measures of local magnetic yaw 140a. Unlike the devices 130 and 130a, however, the sensors 710 and 712 may not easily be visualized using the depth camera 122a. Accordingly, sensors 710 and 712 may be consumers of offsets 190 in the data structure 180 but need not be providers of offsets, as there may be no yaw references 140*b* to be used for comparison. The sensors 710 and 712 may still benefit from yaw correction, however, by applying offsets 190 already stored in the data structure 180 to their own measurements of local magnetic yaw direction 140*a*.

One should appreciate that yaw offsets 190 are not specific to any device or user, but rather are applicable to any device operated by any user. As the magnetic field 104 is quasi-stationary, offsets generated for one device may be applied to any other device. Rather than reflecting properties of devices, the offsets 190 are intended to reflect properties of the space 102, which may be accessed for correction by any device that uses a magnetic field to orient itself.

Just as consumers of offsets 190 need not also be providers of offsets, neither do providers of offsets also need to be consumers. Some devices or sensors may be both providers and consumers, however.

In some examples, the server 170 infers the pointing direction of a device or sensor from other devices or sensors. For example, knowledge of normal body mechanics may be applied to draw inferences about sensor orientation.

Consider a case where user 110*a* is walking forward (to the right in the perspective of the figure). It may be possible to infer the yaw direction of the chest sensor 710 and/or ankle sensor 712 based on a known yaw direction of movement of the user 110*a*. The server 170 may determine this yaw direction based on input from the HMD 120*a* and/or device 130*a*. The server 170 may then apply that direction of movement, which we call a "path tangent" 720, as a reference for other sensors. For example, the path tangent 720 may serve as a reference yaw 140*b*, e.g. for the chest sensor, given that it provides an independent measure of yaw direction in the WCS FoR 108*b*. In some examples, the server 170 generates new offsets based on path tangents 720, which it applies as measures of reference yaw 140*b*, and on local magnetic yaw 140*a* as measured in the local magnetic FoR of the respective device. Operation proceeds in a similar manner to that shown in FIG. 5, except that path tangents 720 are used as sources of reference yaw 140*b* rather than images from the depth camera.

A top view 750 of user 110*a* (bottom of FIG. 7) shows another example use of path tangent 720. Here, it may be desired to provide an accurate measure of yaw direction of the ankle sensor 712, which is not easily visualized by the depth camera 122*a*. To this end, the server 170 may estimate a current path tangent 720 (D2) from chest sensor 710 or HMD 120*a*. At or about the same time, the accelerometer in the angle sensor 712 may indicate a direction D3, based on the direction of force applied by the user's ankle, and may further generate a local magnetic yaw 140*a*, having direction D1. The server 170 may then calculate a direction D3 relative to the local magnetic FoR of the ankle sensor 712, and then subtract D2 to produce an offset 190 of the ankle sensor 712 in the spatial FoR 108*b*.

Figure 8:
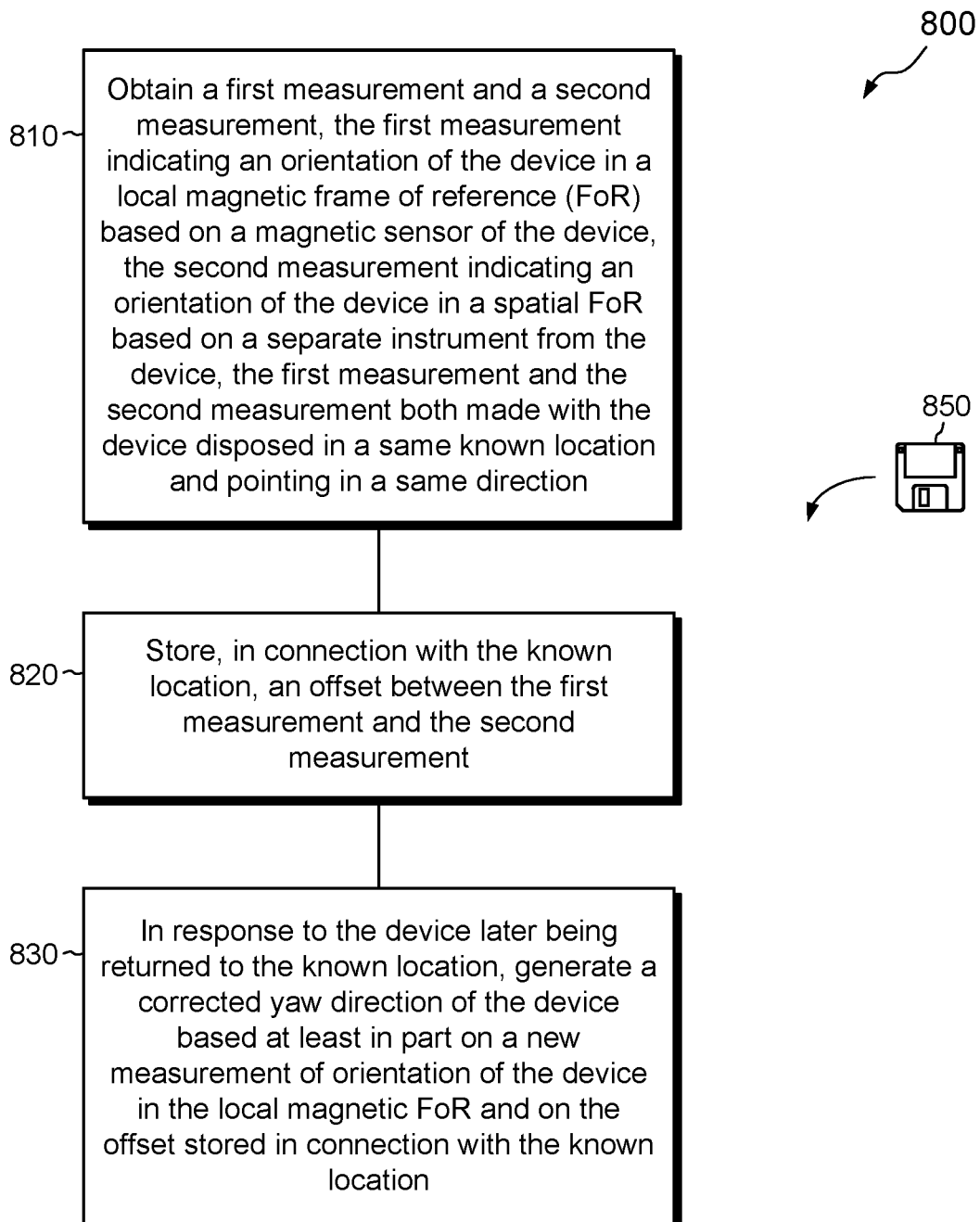
FIG. 8 is a flowchart showing an example method of measuring a yaw direction of a device in a space.

FIG. 8 shows an example method 800 that may be carried out in connection with the environment 100 and summarizes some of the features described above. The method 800 is typically performed, for example, by the software constructs described in connection with FIGS. 2-4. The various acts of method 800 may be ordered in any suitable way. Accordingly, embodiments may be constructed in which acts are performed in orders different from that illustrated, which may include performing some acts simultaneously.

At 810, a first measurement 140*a* and a second measurement 140*b* are obtained. The first measurement 140*a* indicates an orientation of a device 130 in a local magnetic frame of reference (FoR) 108*a* based on a magnetic sensor 422 of the device 130, and the second measurement 140*b* indicates an orientation of the device 130 in a spatial FoR 108*b* based on a separate instrument from the device 130, such as a depth camera 122 or path tangent of HMD 120. The first measurement 140*a* and the second measurement 140*b* are both made with the device 130 disposed in the same known location 192 and pointing in the same direction.

At 820, an offset 190 between the first measurement 140*a* and the second measurement 140*b* is stored in connection with the known location 192, e.g., as an element in the data structure 180.

At 830, in response to the device 130 later being returned to the known location, a corrected yaw direction of the device 130 is generated based at least in part on a new measurement 140*a* of the orientation of the device 130 in the local magnetic FoR and on the offset 190 stored in connection with the known location 192.

An improved technique has been described for measuring yaw of a device 130. The technique includes obtaining a first measurement 140*a* of an orientation of the device relative to a local magnetic FoR and a second measurement 140*b* of the orientation of the device 130 relative to a spatial FoR, with both measurements made while the device is disposed at a known location and in the same orientation. The technique computes an offset 190 between the two measurements and stores the offset in connection with the known location 192. When the device 130 is later returned to the known location, the yaw direction 660 of the device is determined based on acquiring a new measurement 140*a* of the device's orientation in the local magnetic FoR 108*a* and applying the offset 190 as a correction.

Having described certain embodiments, numerous alternative embodiments or variations can be made. For example, although certain functions have been described as being performed by the server 170, this description is illustrative rather than limiting, as the same functions could be performed by the HMD 170 (acting as the server) or in some other component. Although the server 170 is shown as a single component, one should appreciate that the server 170 may be implemented with any number of computers and that at least some of the computers need not be local.

Section II: Device Velocity State Detection

This section presents an improved technique for detecting a velocity state of a device, such as whether the device is moving, at rest, or at a dead stop. Embodiments of the technique presented herein may be practiced in the environment of Section I but do not require yaw measurements as described in Section I. The improvements of Section I and Section II may each benefit from the other. For example, detection of an at-rest state of a device may promote accuracy when generating yaw offsets 190. Similarly, detection of a change in yaw may alert the ZVP 260 (FIG. 2) that a device that was previously in the dead-stop state is now in motion. Particular features described as required for yaw measurement may be optional for at-rest detection, and vice-versa. Therefore, a statement that any element is required in one section should not be taken to mean that the same element is necessarily required in the other section.

As described herein, an improved technique for detecting a velocity state of a device includes generating multiple phase measurements for each of multiple packets emitted by the device and monitoring differences between phase measurements made for different packets. The technique further includes asserting a particular velocity state of the device based on a condition of the monitored differences. In some examples, detecting the particular velocity state of the device can trigger a correction for IMU drift.

Figure 9:
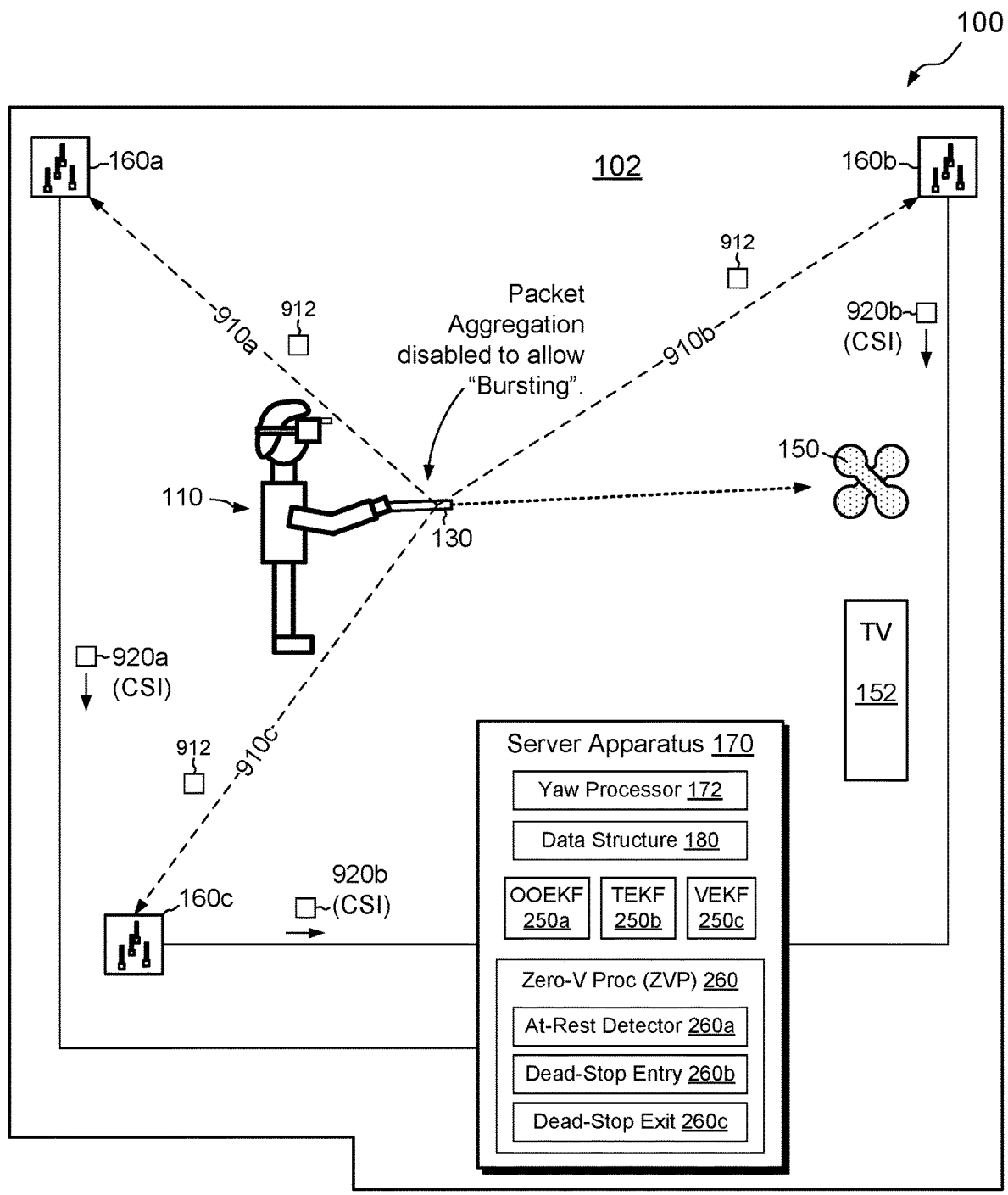
FIG. 9 is a block diagram of the example environment of FIG. 1, further showing a detection of an at-rest state of a device based at least in part on signals emitted by the device.

FIG. 9 shows the example environment 100 of FIG. 1, with particular features emphasized to depict aspects of velocity state detection. In example operation, the user 110 holds the device 130, and the device 130 emits packets, such as Wi-Fi packets. The packets travel through space 102 and impinge upon antenna arrays 160. For example, a packet 912 may traverse paths 910a, 910b, and 910c to antenna arrays 160a, 160b, and 160c, respectively. Although shown as following simple paths, the packet 912 spreads out from device 130 in all directions and typically follows many paths to each antenna array 160. Multipath effects arise from reflections from walls, ceilings, floors, furniture, and so forth, and can be quite complex. Typically, each antenna of each antenna array 160 receives the packet 912, and associated processing circuitry generates CSI (Channel State Information). The CSI typically contains information about the multipath signal received, such as its phase. Each antenna array 160, in response to receiving a packet, sends the CSI 920a, 920b, or 920c of its constituent antennas to the server 170, where the ZVP 260 analyzes changes in the CSI across different packets and determines a velocity state of the device 130. Typically, each antenna sends respective CSI, such that an antenna array 160 having four antennas sends four sets of CSI.

Continuing with reference to FIG. 9, the ZVP 260 is configured to track velocity of the device 130, assigning the device 130 to one of the following velocity states:
  A Moving State, which indicates that the device 130 is in motion;
  An At-Rest State, which indicates that the device 130 is either stopped or nearly stopped; and
  A Dead-Stop State, which indicates that the device is at a complete stop.

The dead-stop state may be regarded as a sub-state of the at-rest state, as a device that is at a dead-stop is also at rest. The two states differ in their degree of certainty, however, with the dead-stop state indicating a higher degree of certainty that the device is at a complete stop than the at-rest state. To track the state of the device 130, the ZVP 260 includes an at-rest detector 260a, a dead-stop entry assessor 260b, and a dead-stop exit assessor 260c. The at-rest detector 260a is configured to determine whether the device 130 is in the moving state or the at-rest state. The dead-stop entry assessor 260b is configured to detect when the dead-stop state has been entered. Both the at-rest detector 260a and the dead-stop entry assessor 260b operate primarily (and in some cases solely) based on Wi-Fi signals emitted from the device 130, optionally receiving additional input from the HMD 120, the OOEKF 250a, and/or the VEKF 250c. The dead-stop exit assessor 260c is configured to detect when the dead-stop state has been exited, i.e., when it can no longer be determined with a sufficiently high level of confidence that the device 130 is at a true dead stop. The dead-stop exit assessor 260c preferably takes input from all relevant sources, including Wi-Fi, HMD 120, IMU 420, and EKFs 250a and 250c.

Although the environment 100 shows three antenna arrays 160a, 160b, and 160c, the at-rest detector 260a may work effectively with as few as one antenna array 160. Performance may improve, however, with additional antenna arrays 160, and three antenna arrays 160 appear to be optimal in most cases. Preferably, each antenna array 160 includes multiple antennas.

Figure 10:
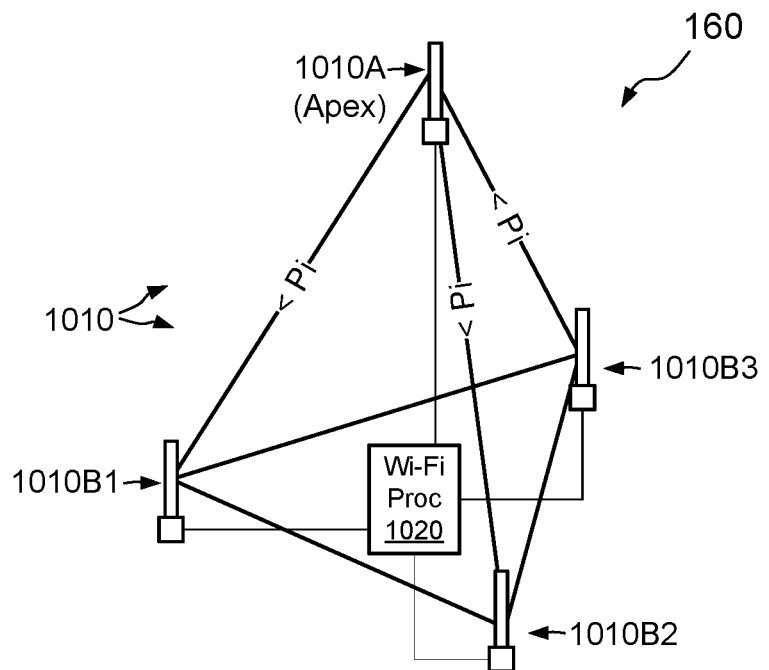
FIG. 10 is a perspective view of an example antenna array of FIG. 9.

FIG. 10 shows an example antenna array 160 in additional detail. The antenna array 160 may be representative of antenna arrays 160a, 160b, and 160c. The antenna array 160 is seen to include an apex antenna 1010A and multiple base antennas 1010B1, 1010B2, and 1010B3. Other numbers of base antennas may be used. The antennas 1010 are preferably spaced apart such that the distance between the apex antenna 1010A and each of the base antennas is less than Pi radians at Wi-Fi frequency. Assuming 5 GHz Wi-Fi signals, Pi radians works out to approximately 3 cm. Thus, the maximum distance between the apex antenna 1010A and each base antenna is preferably less than 3 cm. The actual distance is preferably barely less than 3 cm, however, as making the distance much smaller might cause interference between antennas and degrade measurement accuracy. The distance between different base antennas is not critical, but it is preferably on the same order. Also shown in FIG. 10 is a Wi-Fi processor 1020. The Wi-Fi processor 1020 uses a common reference clock for generating CSI for all of the antennas 1010. For example, Wi-Fi processor 1020 includes a 4×4 Wi-Fi chip capable of handling the four antennas. Use of a common clock prevents device-frequency errors from arising between antennas 1010 in array 160. No effort need be made to synchronize clocks across antenna arrays 160, however. One should appreciate that the terms "apex" and "base" are merely names that facilitate description and that different terms may be used for different types of antenna arrays.

Figure 11:
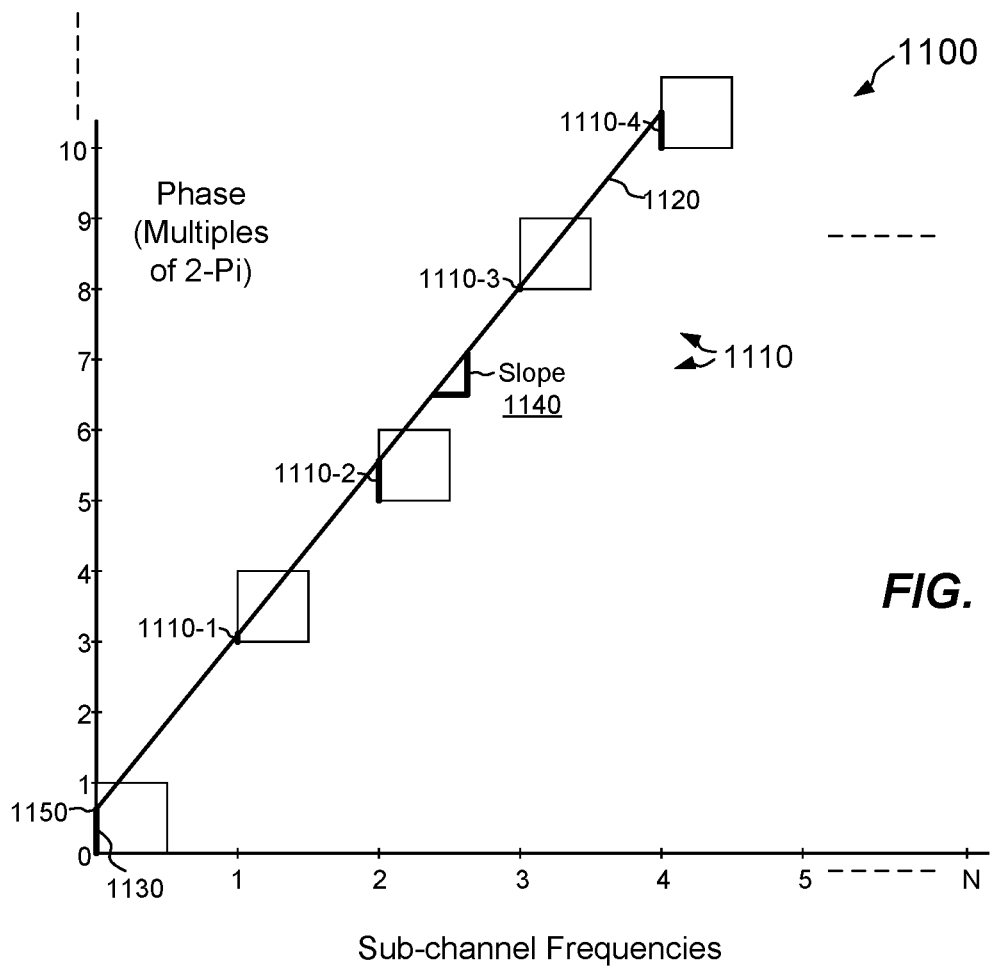
FIG. 11 is a graph of unwrapped CSI (Channel State Information) phase, as derived from any of the antennas in the antenna array of FIG. 10.

FIG. 11 shows an example graph 1100 of unwrapped CSI phase versus sub-channel frequency. In an example, data of the graph 1100 is generated by Wi-Fi processor 1020 in an antenna array 160 in response to one of its antennas 1010 receiving a wireless packet. In an example, the CSI of each antenna 1010 forms the basis for a respective graph 1100. The graph 1100 shows phase as measured by multiple Wi-Fi sub-channels, which are labeled 1-N, where "N" is the number of sub-channels. Some implementations represent sub-channels from −N/2 to N/2. This is merely a convention. Multiple phase measurements 1110-1 through 1110-4 (collectively, 1110) are shown, with the line in each illustrated square representing a phase measurement. A phase 1130 of the 0-th sub-channel is not directly measured but is rather inferred from other phase data.

It can be seen that the unwrapped CSI phase has a slope 1140 and a y-intercept 1150. The slope 1140 corresponds to the integer part of a number of wavelengths traveled by the Wi-Fi signal from the device 130 to the antenna 1010. The y-intercept 1150 corresponds to the fractional part of the number of wavelengths traveled. Thus, the slope 1140 provides a course measure of distance traveled, whereas the y-intercept 1150 provides a fine measure of distance traveled. The y-intercept 1150 may vary between 0 and 2−Pi radians (or equivalently, between −Pi and +Pi radians).

Our experiments have shown that neither the slope 1140 nor the y-intercept 1150 of the unwrapped CSI phase is consistent from one packet to the next, even when distances are kept constant. The slope changes on account of variable packet-detection delays found in commercially-available Wi-Fi devices, whereas the y-intercept changes on account of device-frequency offset. However, we have recognized that differences in y-intercepts 1150 as measured between different antennas 1010 of an antenna array 160 still provide useful information for detecting whether a device is moving or at rest.

Figure 12A:
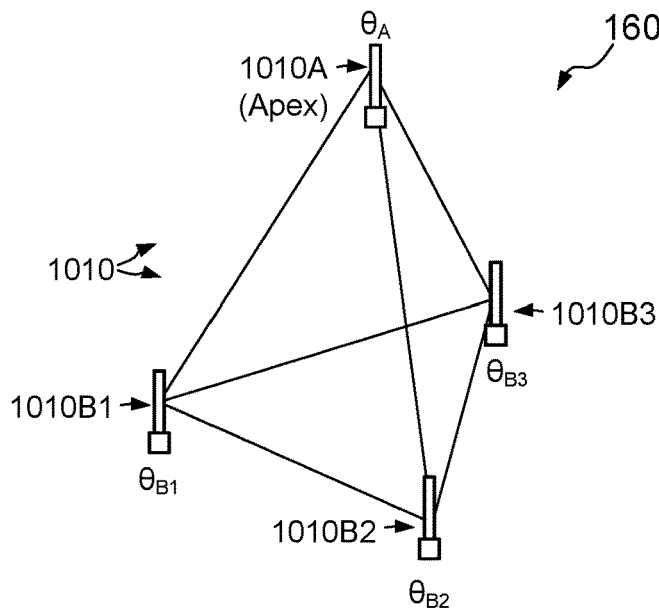
FIGS. 12a and 12b respectively show another perspective view of the antenna array of FIG. 10 and a flowchart showing a method of processing CSI phase to detect an at-rest condition of a device.
Figure 12B:
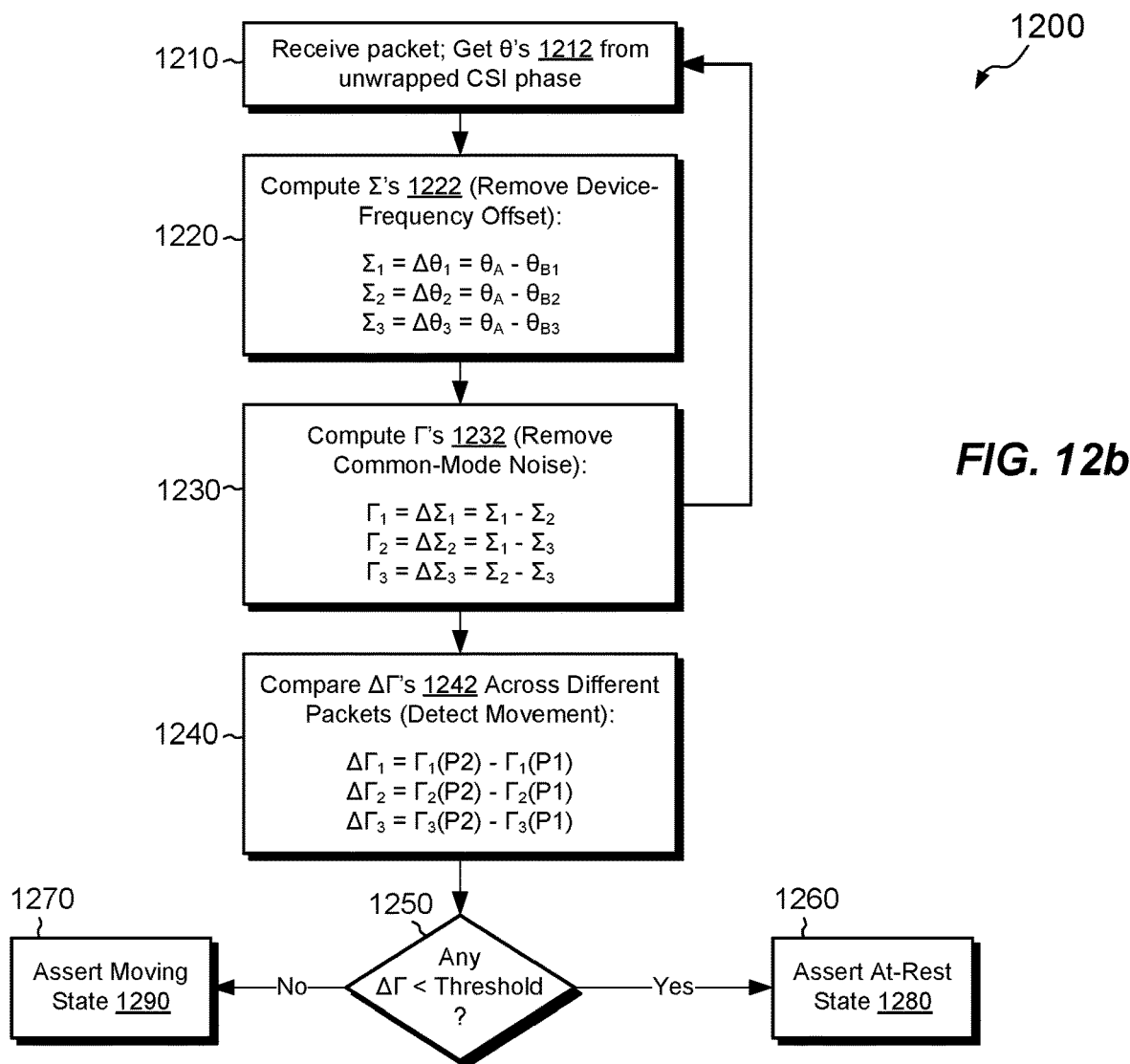

FIGS. 12a and 12b show an example arrangement for detecting a velocity state of a packet-emitting device based on measurements of CSI phase by an antenna array 160. FIG. 12a shows an example antenna arrangement, and FIG. 12b shows an example method 1200. The at-rest detector 260a typically performs the method 1200, with help from one or more antenna arrays 160, to effectively determine whether the device 130 is in the at-rest state or the moving state.

At 1210 of FIG. 12b, the antenna array 160 receives a packet, and each of the antennas 1010 in antenna array 160 generates respective CSI for that packet. From the CSI of each antenna 1010, a respective y-intercept 1150 is identified, e.g., from the respective unwrapped CSI phase. We refer to each y-intercept as a "theta" ($\Theta$), with $\Theta_A$ (FIG. 12a) being the y-intercept derived from apex antenna 1010A and $\Theta_{B1}$ through $\Theta_{B3}$ being the y-intercepts of the respective base antennas 1010B1 through 1010B3.

At 1220, the server 170 computes values of delta-theta ($\Delta\Theta$) as differences between $\Theta_A$ of the apex antenna 1010A and each of the $\Theta_B$'s, as shown. The results are three $\Delta\Theta$'s, which we call "sigmas" ($\Sigma$'s), e.g., $\Sigma_1$, $\Sigma_2$, and $\Sigma_3$. By computing each $\Delta\Theta$ (or $\Sigma$) value, the server 170 acts to remove device-frequency offset, i.e. slight differences in Wi-Fi frequencies between the packet-emitting device and the antenna array 160. We may assume that all antennas 1010 in any antenna array 160 share a common reference clock, although clocks between antenna arrays may differ. Values of X are thus corrected for device-frequency offset.

At 1230, common-mode noise is removed by computing differences between $\Sigma$ values. For example, providing three $\Sigma$ values ($\Sigma_1$, $\Sigma_2$, and $\Sigma_3$) means that there are three unique pairs of $\Sigma$ values, $\{\Sigma_1, \Sigma_2\}$, $\{\Sigma_1, \Sigma_3\}$, and $\{\Sigma_2, \Sigma_3\}$, which we can use as a basis for computing $\Delta\Sigma$'s. At 1230, we compute these three $\Delta\Sigma$ values, shown as $\Delta\Sigma_1$, $\Delta\Sigma_2$, and $\Delta\Sigma_3$. These $\Delta\Sigma$'s are also referred to herein as "gammas" ($\Gamma$'s) with act 1230 producing three $\Gamma$'s: $\Gamma_1$, $\Gamma_2$, and $\Gamma_3$. At the completion of 1230 (or in parallel therewith), operation returns to 1210, whereupon another packet is received and processed per acts 1210, 1220, and 1230.

Once two, preferably consecutive, packets from the device 130 have been processed, operation proceeds to 1240, whereupon the server 170 computes $\Delta\Gamma$'s between the two packets, P1 and P2. For example, $\Delta\Gamma_1$ is the difference between Fi for packet P2 and $\Gamma_1$ for packet P1, and likewise for the other $\Delta\Gamma$'s. The packets P1 and P2 may be separated in time by approximately 20 milliseconds, a short-enough interval to allow small changes in velocity to be detected, but not so small that differences are unlikely to be detected. Other time intervals between packets may be used, however.

Operation next proceeds to 1250, whereupon the method 1200 tests whether any of the $\Delta\Gamma$'s computed at 1240 falls below a predetermined threshold. If so, at 1260 the device is at rest and the server 170 asserts the at-rest state 1280. If not, the at-rest detector may determine that the device is in the moving state 1290 (act 1270). In some examples, assertion of the at-rest state 1280 may be delayed until it is determined that at least one $\Delta\Gamma$ from among all those computed remains less than the threshold for some number of packets. As an example, a variable may be set to an initial value when the device is moving. The variable may be decremented for each packet that produces at least one $\Delta\Gamma$ below the threshold and may be incremented for each packet that produces no $\Delta\Gamma$ below the threshold. The variable may be limited between minimum and maximum values. With this scheme, the at-rest state 1280 is asserted when the variable reaches the minimum value.

It should be noted that the at-rest state 1280 may be asserted using only a single antenna array, as described above, but performance may improve by using additional antenna arrays 160. Should multiple antenna arrays 160 be used, acts 1210 through 1240 of the method 1200 may be performed for each of them. But rather than comparing, during act 1250, the $\Delta\Gamma$'s for a single antenna array 160 for detecting the at-rest state 1280, act 1250 instead looks across all antenna arrays 160. For example, assuming three antenna arrays 160 are used, if any of the resulting nine $\Delta\Gamma$'s computed across the three antenna arrays 160 is below the threshold, the device is considered to be at-rest, even if the threshold is exceeded by any or all of the other $\Delta\Gamma$'s across the antenna arrays 160. Making the at-rest decision in this fashion reflects the fact that movement of the device usually affects CSI as measured by all antenna arrays 160 by a relatively large amount, whereas movement of a person or object usually affects CSI as measured by only a subset of antenna arrays and to a lesser amount. If one or more of the $\Delta\Gamma$'s shows little or no change, then probably the disturbance is not caused by device motion.

Although the at-rest detector 260a is configured to determine whether the device 130 is moving or at rest, accumulated errors may cause the at-rest detector 260a to assert the at-rest state when the device 130 is moving very slowly. The at-rest detector 260a is particularly robust against noise and is expected to improve with additional variance tuning of the extended Kalman filters 250. Although not a perfect dead-stop detector, the at-rest detector 260a has been shown to produce an error of less than a few cm/sec (such as 7 cm/sec), using CSI-based techniques only. For purposes of at-rest detection, the device 130 is considered to be "at-rest" if it is stopped or moving at a velocity less than this speed.

Detection of the at-rest state confers significant benefits, even if it is not true dead-stop detection. For example, the server 170 may use the assertion of an at-rest state to trigger operation of the dead-stop entry assessor 260b, which is expected to detect a true dead-stop more reliably than the at-rest detector 260a. Also, detection of an at-rest state may allow the server 170 to adjust inputs to the extended Kalman filters 250, to best tailor their operation for current circumstances. For instance, the server 170 may apply a zero-velocity measurement function to the TEKF 250b in response to an at-rest detection and provide the TEKF with an increased variance, so as to reflect a lower level of confidence that the velocity is actually zero. When operating in the dead-stop state 1280, the server 170 may provide the same measurement function to the TEKF 250b, but with a very small variance, so as to reflect higher confidence that the velocity actually is zero. Both the TEKF 250b and the VEKF 250c may update their respective measurement functions each time the at-rest detector 260a detects the at-rest state 1280. In addition, and given that the TEKF 250b tracks device location, improving the accuracy of the TEKF 250b promotes more accurate measures of device location. In so doing, the ability to detect the at-rest state 1280 improves yaw measurements (Section I). The overall effect of at-rest detection is thus to leverage knowledge of zero or near-zero velocity to increase accuracy of both tracking and yaw measurements.

One should appreciate that any movement of the device 130 within the space 102 changes the CSI phase of signals received by the antenna arrays 160. Typically, device movement causes all path lengths and therefore all CSI phase values to change for all antenna arrays 160. In contrast, changes in the environment, e.g., caused by people or objects moving around, tend to affect CSI phase much more for some antenna arrays 160 than for others. For example, the antenna array 160 that is closest to the moving person or object is likely to be affected more than antenna arrays 160 that are further away, especially if the person or object is located between the device and the closest antenna array.

Given this difference in phase behavior between a moving device and a moving person or object, the server 170 is able to differentiate between the two cases based on how CSI phase changes from the different antenna arrays 160. In particular, one can say whether the device 130 is merely at rest or has entered a dead-stop state by applying different thresholds for phase stability, as measured by the different antenna arrays 160.

In an example, the dead-stop entry assessor 260*b* (FIG. 9) receives the same delta-sigmas (ΔΣ's) that are used by the at-rest detector 260*a* in method 1200. Rather than analyzing differences in ΔΣ's between two consecutive packets, however, the dead-stop entry assessor 260*b* looks for stability in ΔΣ's over multiple consecutive packets, such as three or more packets, for example, which may arrive over an interval of 60 or more milliseconds (assuming 20-millisecond packet spacing). Preferably, the dead-stop entry assessor 260*b* looks at ΔΣ's from all antennas 1010 of all antenna arrays 160 that are in use, e.g., nine antennas 1010 for a three-array setup. In an example, the dead-stop entry assessor 260*b* uses a combination of deviation thresholds and voting to determine whether the device 130 should enter the dead-stop state. Accordingly, the dead-stop entry assessor 260*b* may work solely on the basis of Wi-Fi signals (CSI). However, some embodiments augment CSI with input from other sources, such as IMU 420, EKFs 250, and HMD 120.

Operation of the dead-stop exit assessor 260*c* is generally simpler than that of the dead-stop entry detector 260*b*, as any significant change in position or orientation of the device from any source (e.g., IMU 420, HMD 120, CSI, or yaw) can cause the device to exit the dead-stop state. Also, certain embodiments employ a more conservative standard for entering a dead-stop state than for exiting it. Given that some or all of the EKFs 250 may be tuned differently when the device 130 is in a dead-stop state than when it is in the other states, optimal performance may depend on not being wrong when declaring the dead-stop state. However, the consequences in terms of user experience of wrongly declaring that a device is not in the dead-stop state are typically less severe.

Given the reliance of certain embodiments on CSI for asserting the various states (moving, at-rest, and dead-stop), accurate performance may depend on the CSI being valid. In some examples, validity of CSI is verified through the use of packet bursting. For example, Wi-Fi settings of the device 130 may be configured to disable packet aggregation and therefore to permit packet bursting. Enabling or disabling aggregation is typically a device-driver setting of the Wi-Fi component, but details of the setting may vary across manufacturers. We have experimented successfully with disabling packet aggregation using Wi-Fi devices obtained from Laird Technologies, Inc., of Chesterfield, MO By disabling Wi-Fi packet aggregation, the device 130 is able to send separate packets in very quick succession, on the order of once every 200 microseconds. In an example, all the packets within each burst carry the same payload. Bursting thus provides redundancy at high speed, which enables the ZVP 260 to operate more robustly. Different bursts, conveying different payloads, may be sent approximately every 20 milliseconds.

We have recognized that multipath characteristics of the space 102 are unlikely to change by measurable amounts within the span of a single burst, which may last only a few hundred microseconds or less. The space 102 typically remains stable within that timeframe. Any large change in CSI within a burst then almost certainly indicates a hardware error or other anomaly. If a burst contains two packets for which CSI differs by more than a threshold amount, the server 170 may compare the CSI of the two packets with the CSI of a packet from an immediately previous burst. If the CSI of one of the two packets from the current burst matches the CSI of the packet from the previous burst to within a threshold difference, the other of the two packets from the current burst is discarded as erroneous. If the CSI of both packets of the current burst differs from the CSI of the packet from the previous burst by more than a threshold, all the packets of the current burst may be discarded. Discarding packets that convey erroneous CSI prevents that CSI from degrading the quality of velocity-state detection. In an example, the CSI features that are the subject of the above-described comparison are the delta-sigma (ΔΣ) values, as described in connection with FIG. 12*b*.

Figure 13:
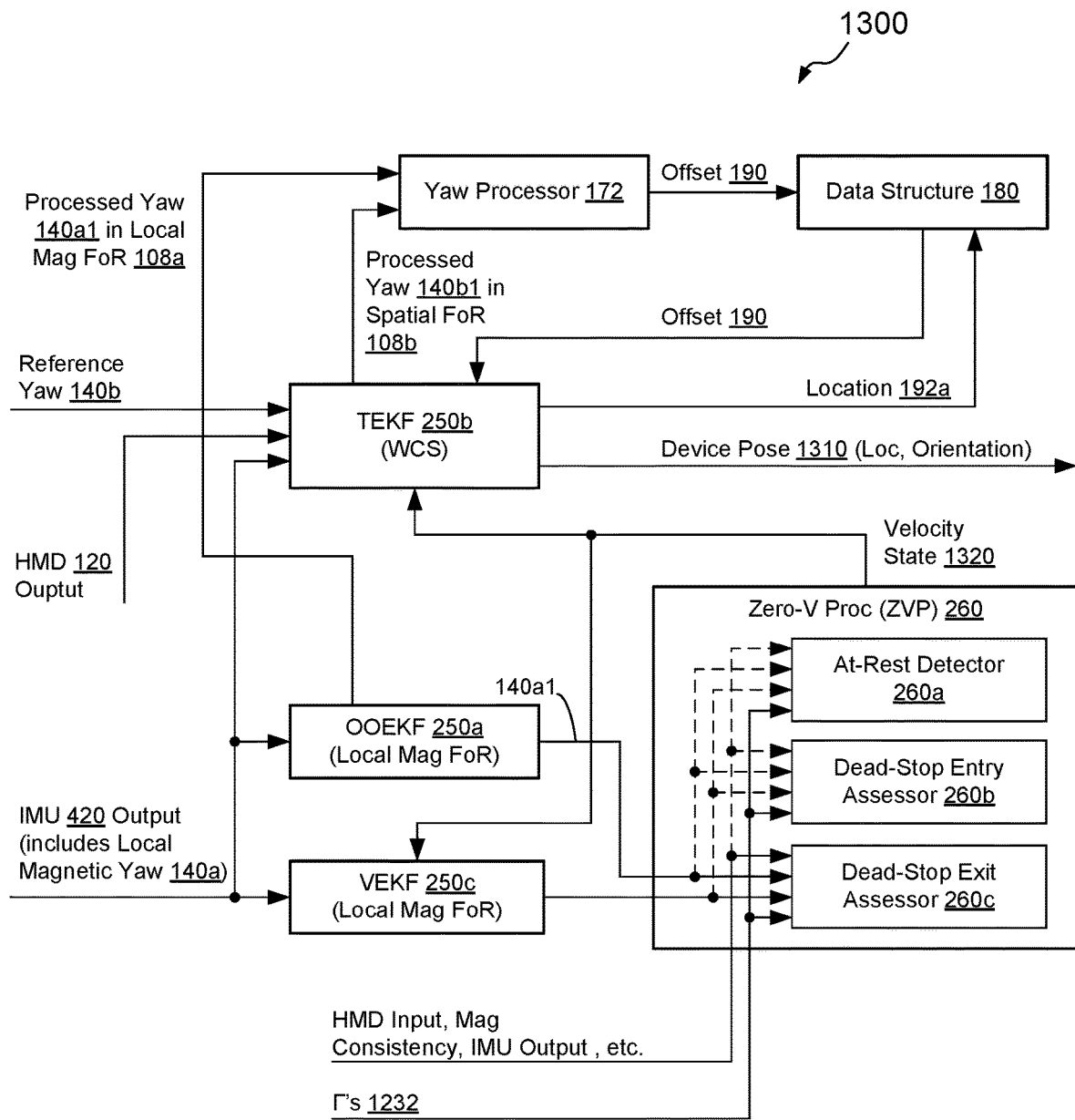
FIG. 13 is a block diagram of an example arrangement for determining when a dead-stop state is both entered and exited.

FIG. 13 shows in greater detail certain components of the server 170 that support both yaw measurement (Section I) and velocity-state detection (this Section II). Operative connections are shown among the EKFs 250, the ZVP 260, the yaw processor 172, and the data structure 180.

To support yaw measurements, the orientation-only EKF (OOEKF) 250*a* receives input from the IMU 420 in the device 130. The input includes measures of local magnetic yaw 140*a*, i.e., measurements of yaw in the device's local magnetic frame of reference (FoR) 108*a* (FIG. 1). OOEKF 250*a* processes the input 140*a* to generate output 140*al*, which provides a processed version of the local magnetic yaw 140*a*. As OOEKF 250*a* tracks only orientation of the device 130, output 140*al* provides a very stable view of device orientation in the local magnetic FoR 108*a*.

At or about the same time that OOEKF 250*a* is processing a measurement of magnetic yaw 140*a*, the tracking EKF (TEKF) 250 receives and processes a measurement of reference yaw 140*b*, e.g., from the HMD 120 (FIG. 1). From this input, the TEKF 250*b* generates an output 140*b*1, which provides a processed version of the reference yaw 140*b*. In an example, the TEKF 250*b* uses an orientation measurement function into which the offset 190 from the data structure 180 is applied, enabling the TEKF 250*b* to track the device 130 in the spatial frame of reference 108*b*.

As shown, the TEKF 250*b* also receives input from IMU 420, offsets 190 from data structure 180, and velocity state 1320 from ZVP 260. It may further receive additional spatial inputs from the HMD 120. Based on the received information, TEKF 250*b* generates a location estimate 192*a* of the device 130, as well as an output for device pose 1310, which includes both device location and orientation. In some examples, the data structure 180 receives the location estimate 192*a* as the location 192 of the device 130 and uses that location estimate 192*a* for storing and/or retrieving offsets 190. The TEKF 250*b* is continually computing the next location estimate 192*a* based at least in part on the current location 192.

In some examples, the server 170 adjusts the variance of the TEKF 250*b* based on the nature of the offset 190 that is applied to the TEKF's orientation measurement function. For example, the server 170 sets a high variance (lower confidence) for an offset 190 that is based on a single image acquired from the HMD 120, whereas the server 170 sets a lower variance (higher confidence) for an offset based on an average of many samples. In some cases, the variance may scale with the count 190*a* (FIG. 2) of samples averaged together at the current location 192.

Continuing with reference to FIG. 13, the yaw processor 172 receives both the processed yaw 140*al* (from OOEKF 250*a*) and the processed yaw 140*b*1 (from TEKF 250*b*). From these inputs, the yaw processor 172 generates an offset

190, which may be stored in the data structure 180 in connection with a corresponding location estimate 192*a*.

As further shown, the velocity EKF (VEKF) 250*c* provides input to the ZVP 260 for assisting in the determination of velocity state 1320. In an example, the VEKF 250*c* tracks the full pose (location and orientation) of the device 130 in the local magnetic frame of reference 108*a*. Significantly, position and velocity as tracked by the VEKF 260*c* are both biased toward zero in all directions. For example, the VEKF 250*c* is tuned to detect changes in position and/or velocity from a quiescent state of all zeroes. The VEKF 260*c* then uses a zero-velocity measurement function to drive the velocity to zero. The variance used by this measurement function depends on the velocity state 1320. As with the TEKF 250*b*, variance is smaller in the dead-stop state and much larger in the at-rest state. In an example, the dead-stop exit assessor 260*c* monitors output from the VEKF 250*c*, e.g., in the form of position, velocity, and in some cases accelerometer bias of IMU 420. The dead-stop exit assessor 260*c* then exits the dead-stop state if the output changes by more than a threshold amount, as such changes indicate that the device 130 has started to move.

In the depiction of the ZVP 260, dashed lines indicate optional connections. Preferably, the dead-stop exit assessor 260*c* uses inputs from all sources: OOEKF 250*a*, VEKF 250*c*, and CSI (Gammas) 1232, as well as input from HMD 120, magnetic sensor 422, other IMU output, and the like. The at-rest detector 260*a* and the dead-stop entry assessor 260*b* both rely upon Gammas (Γ's) 1232, but may each receive additional input from the various sources to assist with their respective functions.

With the depicted arrangement, the server 170 may correct for drift in the IMU 420. For example, detection of an at-rest or dead-stop state can trigger a re-referencing of location as measured by the IMU 420 to the current estimate 192*a* of device location, e.g., as provided by the TEKF 250*b*. Such correction improves the trustworthiness of output from the IMU 420, at least in the short-term, as a determinant of location of the device 130. Detections of at-rest and/or dead-stop states are expected to occur frequently. Thus, consequent corrections of IMU drift can keep the IMU 420 generally accurate over time. Detections of both the at-rest and dead-stop states may trigger IMU correction, with dead-stop detections expected to produce more accurate corrections than at-rest detections on account of the generally more accurate location estimates 192*a* from the TEKF 250*b* during dead-stop than during at-rest. In addition to providing opportunities to correct for IMU drift, detections of at-rest and/or dead-stop states also allow the server 170 to average position estimates from multiple sources to build up highly accurate position values.

Given that the device 130 may be provided as a virtual pointer, such as the one described in incorporated U.S. patent application Ser. No. 15/655,489, it is essential for best user experience that orientation of the device 130 be measured accurately, as even small pointing errors can produce unsatisfactory results. It is also crucial to user experience that the velocity state 1320 of the device 130 be determined with as much certainty as possible.

Figure 14:
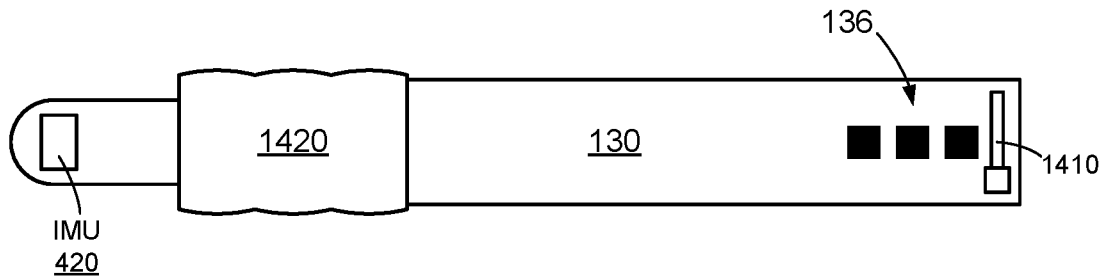
FIG. 14 is a top view of a device that is adapted for accurate measurements of orientation and movement.

To these ends, FIG. 14 shows a particular arrangement of components of device 130 that helps to promote accurate readings of both orientation and velocity. One should appreciate that the depiction of device 130 in FIG. 14 is merely illustrative of relevant features. No effort has been made to show the device 130 as it might eventually appear in a commercial product.

Here, the device 130 has a handle or hand grip 1420. A user (not shown) positioned to the left of the figure, might be expected to hold the device 130 with fingers wrapped around the grip 1420 and with the user's hand extending to the right. With this arrangement, the IMU 420 in the device 130 aligns approximately with the location of the user's wrist joint, such that the IMU 420 remains approximately stationary as the user pivots the wrist (assuming the user is otherwise stationary). In this manner, changes in orientation of the device 130 can be measured with a minimum velocity component.

The device 130 also includes an antenna 1410, which sends Wi-Fi packets from which the above-described CSI is generated. The antenna 1410, although functioning as a packet transmitter, may nevertheless be regarded as a velocity sensor, given that the server 170 determines the velocity state 1320 of the device 130 based on packets emitted by the antenna 1410.

As shown, the antenna (or velocity sensor) 1410 is located at the extreme end of the device 130, where it typically moves more than any other part of the device 130 in response to wrist rotation by the user. The antenna 1410 is thus optimally positioned for sensing velocity of the device 130, as any rotation of the user's wrist is amplified over the distance to the antenna 1410.

Although the depicted arrangement of components in FIG. 14 may be regarded as optimal, it is certainly not required. Other embodiments may use different arrangements.

Figure 15:
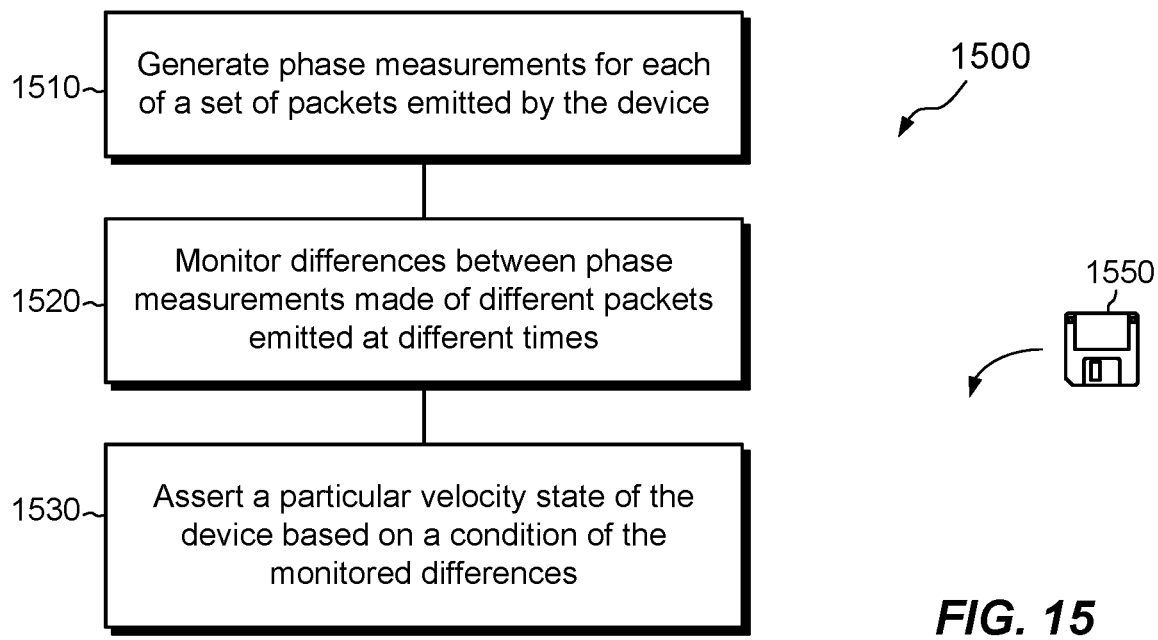
FIG. 15 is a flowchart showing an example method of detecting a velocity state of a device.

FIG. 15 shows an example method 1500 that may be carried out in connection with the environment 100 and summarizes some of the features described in this section. The method 1500 is typically performed, for example, by the software constructs described in connection with FIGS. 2-4. The various acts of method 1500 may be ordered in any suitable way. Accordingly, embodiments may be constructed in which acts are performed in orders different from that illustrated, which may include performing some acts simultaneously.

At 1510, phase measurements are generated for each of a set of packets emitted by the device 130. In an example, such phase measurements are theta values (Θ) based on CSI or other readings from the antenna arrays 160.

At 1520, differences are monitored between phase measurements made of different packets emitted at different times. For example, the at-rest detector 260*a* computes delta-theta (ΔΘ) values, which remove device-frequency offset, and computes delta-sigma (ΔΣ) values, which remove common-mode noise. Differences between ΔΣ values (ΔΓ's) are then determined between packets arriving at different times, such as 20 milliseconds apart.

At 1530, a particular velocity state 1320 of the device 130 is asserted based on a condition of the monitored differences. For example, the at-rest state 1280 may be asserted if any of the ΔΓ's falls below a threshold (FIG. 12*b*). Alternatively, the moving state 1290 may be asserted if all of the ΔΓ's exceed the same threshold. The dead-stop state may be asserted if the dead-stop entry assessor 260*b* detects stability in ΔΣ's over multiple packets.

An improved technique has been described for detecting a velocity state 1320 of a device 130. The technique includes generating multiple phase measurements (e.g., Θ values) for each of multiple packets 912 emitted by the device 130 and monitoring differences (e.g., ΔΘ's and ΔΣ's) between phase measurements made for different packets. The technique further includes asserting a particular state 1320 of the device 130 based on a condition of the monitored differences.

Having described certain embodiments, numerous alternative embodiments or variations can be made. For example, although certain velocity states have been shown and described, embodiments hereof may include a greater or lesser number of velocity states, or other velocity states not specifically described, such as a high-velocity state, a spinning state, a medium-velocity state, and the like. Further, although a computational approach based on CSI has been described, embodiments hereof may work with phase measurements made using other approaches, such as time-of-arrival, time-of-flight, mixed time-of-flight, angle-of-arrival, and the like. Further, although the illustrated embodiments make no assumption about packet-detection delays in Wi-Fi devices, the approach as described herein may be used advantageously in the event that Wi-Fi manufacturers start providing devices with constant (or consistent) packet-detection delays. Indeed, embodiments under such circumstances may be simpler that those illustrated, as constant packet detection delays may obviate the need to correct for device-frequency offset. Also, although detecting velocity state of a device has been described in connection with correcting for IMU drift, this is merely an example. Other uses of velocity detection include improving yaw measurement and, more generally, improving user experience by enabling a game or other application to represent movement of a device or user more realistically.

Section III: Locating Objects in a World Coordinate System (WCS)

This section presents a technique for locating objects in a World Coordinate System (WCS). The technique described in this section may be with the embodiments described in Sections I and II, but it may also be used independently.

Existing AR systems use computer vision to create a spatial understanding map of the user's environment and create spatial anchors for hologram placement. Each spatial anchor is the origin of a coordinate system, and its position is adjusted over time relative to other spatial anchors in the user's environment. The purpose of spatial anchors is to anchor holograms in 3D space and re-localize the hologram to adjacent spatial anchors if the user moves the hologram through space. Each spatial anchor is also a point in every other spatial anchor's coordinate system, thus establishing what can be considered an overall coordinate system. However, there are two problems with spatial anchors:

The relationship between spatial anchors is imprecise.
The relationship between spatial anchors shifts continually with time.

These problems produce some side effects:
1. System errors in hologram placement can be especially large when the hologram is not close to the user.
2. Application developers may need to expend a lot of extra effort to create applications such that holograms will be attached to multiple anchor points.
3. Application developers may need to accept significant limits on resource availability because spatial anchor management (creation and maintenance by the system) is computationally intensive.

An additional responsibility of computer vision systems for AR is to identify when a user is gazing at a hologram that is outside of the user's field of view (behind a wall or other physical object) so that the hologram should rightly be hidden from view or occluded. Due to the aforementioned problems with spatial anchors, occlusion often works poorly for rendering holograms that are not near the user. In addition, enabling hologram occlusion is computationally intensive for the computer vision system (because it would need to continually scan a user's environment to provide hologram placement with occlusion as a feature set). Consequently, application developers are cautioned to use the feature set sparingly.

What is needed is a stable Cartesian World Coordinate System (WCS) that could describe an entire home (and adjacent areas), a commercial building, or a corporate campus, including walls, floors, ceilings, and furnishings. The WCS could be used to realize the system described in U.S. Patent Publication No. 2018/0061127, filed Jul. 21, 2017, and entitled "Managing Virtual Content Displayed to a User Based on Mapped User Location," the contents and teachings of which are incorporated herein by reference. For AR applications, it would provide the following:

Minimize hologram placement and occlusion errors inherent in current AR systems.
Enable the use of techniques to improve the user's visual perception of hologram location.
Simplify the process of re-localizing (the holograms of) multiple users within the same physical environment.
Reduce runtime computational load to free additional resources for game developers.
Free game developers to create applications that take full advantage of the entire physical environment without cumbersome management of spatial anchors.

Finally, body tracking is an example that highlights the need for a WCS. If a player's body movements were being tracked through space to create a holographic avatar, there would be a problem in existing systems at the boundaries between local coordinate systems (those relative to two different anchor points). Position errors would create a highly distorted avatar while passing through the boundary because different parts of the body would be tracked relative to different coordinate systems. With a single WCS, there are no such boundaries.

Solution

Today, AR system vendors enable multiple players in the same physical environment to share spatial understanding maps so all players can see the same holograms. Third party AR Cloud providers enable interoperability (between AR systems from different vendors) by creating an additional computer vision layer on top of what the AR system vendor provides. AR Cloud systems take a bottoms-up approach to these matters.

By contrast, Reavire takes a top-down approach.
Abstractly defines a World Coordinate System (WCS).
Each Device Family synchronizes to this world coordinate system (e.g., HoloLens, Magic Leap, etc.)

The WCS is a fundamental part of the Reavire AR gaming system because:

Avatars depend on WCS to avoid working errors in avatar movement.
Since the LPS is tied to avatar generation, the LPS can be trained to the WCS as an error bound on the generation of the avatar.
Reavire is empowering AR game developers to use standard 3D game engine development processes unencumbered by spatial anchor management or bandwidth-intensive map sharing.

LPS as Independent Observer

We use a Local Positioning System (LPS) as an independent observer. A suitable example of an LPS is disclosed in PCT Publication No. WO/2018/039339, the contents and teachings of which are incorporated herein by reference. The physical wireless access points (WAPs) or other physical markers define an abstract coordinate system that is the WCS. Augmented reality HMDs or mobile phones are synchronized to the WCS using the defined physical markers and Relocation Anchor Points (RAPs), system-created and managed anchor points as defined in the Key Terms section below. With Relocation Anchor Points we eliminate the need for device-specific anchor points. The basic operational characteristics of these RAPs can be introduced as follows:

Any one device out of a device family can synchronize to the WCS on behalf of all members of that device family.

Each device family synchronizes to the WCS independently.

Once devices in a device family are synchronized, communication about location occurs in the WCS layer. How this WCS layer eliminates the need for device-specific anchor points will be further discussed below.

This allows multiple device families (e.g., HoloLens or Magic Leap) to play in the same game.

Furthermore, the LPS system bounds errors and helps prevent error conditions typical of computer vision systems (e.g., low light, bright light, ghosting, dark corners, visually indistinct environments).

The WCS as Independent Layer

The Reavire WCS is an independent layer on top of the underlying computer vision layer within the AR systems. By decoupling these layers, we provide a stable coordinate system interface and free game developers from anchor point management.

The standard primitives needed to synchronize to and build the WCS include:

1. Anchor Points: Any AR system that aims to tie content (holograms) to real space will support the concept of anchor points.
2. Downloadable geometry: Any AR glasses that are designed to work with third party game engines such as Unity must be able to download mesh models of the observed geometry. These mesh models are derived from but not equivalent to the spatial understanding maps. Mesh models can be anything from surface meshes to higher order geometry derived from these surface meshes. Uploading geometry to the glasses is the same as uploading any hologram to the glasses and, hence, always supported.
3. Observed Location of Headset: This is preferably a requirement for all applications.
4. Observed Location of Real Objects: Application developers expect support for tools such as Vuforia to locate real objects, so all AR vendors support the ability to visually identify a 3D object.
5. Low level networking control: The LPS system may require that packets be sent on a specific channel separate from the data-carrying channel. Channel selection support is standard for WiFi. Even if the device cannot support our LPS protocol for some reason, we can work around this by adding an extra sensor clipped to the headset.
6. Time Stamps: These time stamps need to be on the order of milliseconds in order to measure human movement. This is well within normal standards.

With the support of AR system vendors, additional functionality can be implemented to make the overall WCS more robust:

SLAM Input: Our LPS system is an independent observer that can locate the headset (for example, to 6 cm accuracy). Examples of benefits (that would be difficult or impossible for the AR glasses to solve on their own) are as follows:

a. Show Virtual Content During Periods of Tracking Loss: The gaming experience would be greatly improved by enabling the glasses to continue to show Virtual Content during periods of loss of visual tracking. There can be many causes of tracking loss (e.g., low light, bright light, dark corners, lack of distinct geometry). One example is covered by PCT/US2018/020888, filed Mar. 5, 2018 and entitled "Maintaining Localization and Orientation of Electronic Headset After Loss of SLAM Tracking", which is incorporated herein by reference. In that example, the glasses would use a combination of IMU, texture data from the nearby wall, and the LPS system to perform image stabilization. In other examples, LPS data alone is sufficient.

b. Disambiguation of Visually Similar Spaces: The LPS system enables the glasses to disambiguate visually similar spaces.

c. Eliminate Ghosting: Ghosting can occur when a room is initially mapped; then, in the process of mapping the space, tracking errors build up as a larger space is mapped. Then, when visiting the initially mapped room, the tracking errors are large enough that the AR system remaps the room again. The prior map remains as a "ghost" in an apparently different space determined by the accumulation of tracking errors. Ghosting can be eliminated by the AR system using the LPS as a secondary comparison point to bound tracking errors.

d. Search Scope Reduction: Re-localization algorithms based on visual data alone are usually fast enough to satisfy the requirements of the user. However, using LPS as an additional input reduces the scope of the search and, hence, reduces the total amount of compute power used. AR devices are generally limited in compute power so any improved efficiency frees up resources an application developer can use. Battery life is also an important consideration.

Note that LPS training does not need to be complete for game play to start. Only minimal training is normally required at the start of game play.

A major benefit of the WCS is that anchor points do not need to be exposed to game designers. Game designers can use a single stable coordinate system for every scene of their game and will not have to worry about the complication of which anchor point to attach a game object to in order to make it appear stable to the users. This permits games running on the Reavire network to place content anywhere within the user's environment without needing to understand the precise geometry of that environment (i.e., the game engine may place a hologram in a location that no device is currently viewing and that location could have been rearranged from the last time a device has seen it).

Key Terms

The following key terms are used in this document to describe example functionality:

1. World Coordinate System (WCS): The world coordinate system is defined by the placement of fixed identifiable objects within the house (for example wireless access points used for the LPS). A three-dimensional Cartesian coordinate system involves an origin and two direction vectors.

a. One fixed object is defined as the origin.
b. Gravity defines the first direction vector as up/down.
c. The projected line onto a horizontal plane between two fixed objects defines the second direction vector. This does preferably require that the two objects not be placed in a direct vertical line. The larger the horizontal spread, the more accurate the direction definition will be.

The World Coordinate System is fixed and distinct from any particular device's world coordinate system. We distinguish the two by simply referring to the latter as the device coordinate system, e.g. device, HoloLens, Magic Leap, or Unity coordinate system.

2. Coordinate System Synchronization: This is the process of synchronizing the device coordinate system to the World Coordinate System (WCS.) The precise method depends on the exact capabilities of the device. We cover example detection and calibration procedures in detail below.

3. Mapping: This is the process of making a three-dimensional virtual model of the house in the World Coordinate System (WCS).

4. Relocation Anchor Point: A Relocation Anchor Point (RAP) is a detectable point in real space that is attached to a physical location. It is labeled with a position (x, y, z) in the WCS and it has an orientation that is an estimate of the WCS's orientation. The RAP provides an estimate of the WCS that is valid locally. The RAP is labeled. A device observes a RAP and allows translation of the device coordinate from the device's coordinate system into the WCS for use by the game engine (game logic) dynamically during game play.

5. PlayZone Definition: The PlayZone is a simplified subset of the virtual model of the house. See the above-referenced U.S. Patent Publication No. 2018/0061127 for a full description of the PlayZone.

Part A: Creation and Management of the WCS
Existing State of the Art: Anchor Points Anchor points provide a method for a local coordinate system to be attached to a specific physical point or area. The precise implementation of an anchor point is not material for our discussion. Roughly speaking, an anchor point is a piece of point cloud map big enough to permit the anchor point to be accurately placed within that point cloud map. An origin and orientation vectors are algorithmically generated from the anchor point data itself. In this manner, a local coordinate system can be attached to virtually any physical location.

As part of the Simultaneous Location and Mapping (SLAM) system, each pair of AR glasses is responsible for generating its own point cloud map. Two pairs of glasses share a local coordinate system by sharing an anchor point. Although the anchor point data was created by one of the glasses, the algorithms for placement of the anchor point within an independently generated map are good enough for a second pair of glasses to place the anchor point very close to the position and orientation of the first. With a little consideration, it is easy to see that after an anchor point is generated, whether it is placed in a map by the first or second user is immaterial. The same types of errors will occur. The reason for this is that the SLAM system is continuously updating its map. Therefore, after some time, both devices will have evolved their understanding of the space. Hence, the anchor point will slightly change position and orientation within these evolved maps. It is particularly the slight change in orientation that causes the validity of the anchor point's coordinate system to be spatially limited. The lever arm effect of angular error quickly adds up to a noticeable error. Position error is typically, but not always, small. Positional error is also constant over the area of interest. Hence, positional error of the placed origin is typically not a large source of noticeable error in the associated coordinate system and hence placement error of associated holograms.

The following facts about anchor point should be considered when using them to anchor holograms to a physical location.

Anchor points are periodically repositioned as the device's understanding of the world changes.

A device may reposition an anchor point even if the anchor point is not presently in view of the device.

A device constantly locates itself in the environment. Hence, if an anchor is not in view but an associated anchored hologram is, then an equivalent amount of hologram positional error will occur even if the anchor point itself is not repositioned.

Devices such as the Microsoft HoloLens attempt to provide certain benefits within the limitations of the device. In the HoloLens, a "master" anchor point exists called the sharing stage. The HoloLens stores metadata for user-generated anchor points that permit those anchor points to be roughly placed before the space has been mapped. The sharing stage anchor point provides the rough estimate of the global coordinate system. Although this does not provide a world coordinate system, it does allow a new user to see all holograms even if they have not mapped the entire playable area yet. For room-sized games, a single anchor point may be sufficient, and, in this case, a single coordinate system covers the entire area of interest.

In outdoor environments, GPS is combined with anchor points to give the illusion of a global coordinate system. If GPS can locate the device within the range of validity of an anchor point, this method functions. The extent of validity of an anchor point is several meters, which roughly corresponds to the accuracy of GPS. The word "illusion" is used because the location of a device in this coordinate system is composed of the tuple, GPS coordinate, Anchor Point ID, and Local Coordinate. Orientation in this coordinate system can use gravity and magnetic north as direction vectors, and/or the local orientation of the anchor point.

Reavire WCS

A world coordinate system is the logical equivalent of using a single perfect anchor point to provide a stable, uniform, accurate, and precise coordinate system available throughout the entire playable area. By "perfect" we mean one that has no position or orientation error associated with it. Since perfect anchor points do not exist, the Reavire WCS is constructed in a different manner.

The Reavire WCS is abstractly defined and tied to the real world so that any device may synchronize to it. As mentioned, device families work together so that the entire synchronization procedure does not need to be repeated by each member of the family.

The Reavire WCS is constructed independently for each device family that connects to it. The construction process is broken into two main phases:

Phase 1. The synchronization phase where a device in the device family synchronizes to the abstractly defined WCS.

Phase 2. That same device continues to build a network of Relocation Anchor Points (RAPs). The purpose of this network is to provide a robust framework for device position and orientation correction with respect to the WCS.

Synchronization to the WCS

Every gaming location is different—different layout, different furniture, etc. The one constant that can be counted upon is the presence of Reavire Wireless Access Points, WAPs. These WAPs are used to define the coordinate system for the location. This process describes a typical home installation of three WAPs, but very large installations with hundreds of WAPs are possible. In cases with more than three WAPs, three adjacent ones would be selected for initial training, then the same process used to train the third WAP would be repeated for the remainder. One WAP is defined as the origin. The pair of WAPs with the largest horizontal plane distance between them is used to define the North vector. The second orientation vector is gravity and is provided by each of the devices. The WAPs are enhanced with registration marks and utilize line lasers to project a visible pattern that is easily visible by an AR device from far away.

A device uses machine vision object recognition techniques to locate each WAP in the device's local coordinate system. The device makes repeated measurements and is required to visit each WAP at least twice to ensure that the positions of the WAPs are detected in the device's local coordinate system with sufficient accuracy and precision. That is, a WAP's location is measured and then remeasured to ensure that the relative position of three WAPs are accurately known. The number of iterations required for convergence of this process is primarily determined by the quality of the SLAM system of the device. The following summarizes the process of synchronizing to the WCS.

1. User turns on device and is instructed to locate one of the WAPs. Which WAP is immaterial; the system has no ability to guide the user at this point. For notational purposes we call this WAP0.
2. The user visually captures the position of WAP0 using machine vision object recognition techniques.
3. The device creates an anchor point associated with WAP0. We call this Anchor0. Now we define three different positions. WAP0.$p$ is the position of WAP0 in the local coordinate system of the device, as measured by the vision system. Anchor0.$p$ is the position of Anchor0 in the device's local coordinate system.
   a. Anchor0 is uniquely identifiable by the device.
   b. At time of creation of Anchor0, the relative position of Anchor0.$p$ to WAP0.$p$ is defined at this point. We call this relative position Delta0. The device may drift causing both positions to drift in the device's local coordinate system. Anchor0 may also shift, but this can be differentiated from device drift using machine vision location of WAP0 and the fact that Delta0 is fixed.
   c. The above two facts imply that every time the device returns to the proximity of Anchor0, the device's drift can be measured and accounted for. This is explained in detail in a subsequent section.
4. The user is instructed to walk to another WAP. We will call this WAP1. As with WAP0 we create Anchor1, and measure both WAP1.$p$ and Anchor1.$p$. Hence Delta1 is known and fixed at this point.
5. The user is then instructed to walk the third and final WAP. We call this WAP2. Once again, we create an anchor, this time Anchor2 and take measurements Anchor2.$p$ and WAP2.$p$ thus defining Delta2.
6. The system determines the role of the various WAPs. The two WAPs with the furthest horizontal separation are used to define the North direction vector. One of these two will arbitrarily be made the origin of the WCS. Each of the anchor points is given a label, Anchor0.1, Anchor1.1 and Anchor2.1, indicating its position in the WCS. The initial values of the labels are as follows. For simplicity of presentation, we assume Anchor0 is the origin and Anchor1 defines the North vector.
   a. Anchor0: Anchor0.1 is set (0,0,0). This label does not change over time.
   b. Anchor1: Anchor1.1 is set to (0,0,r) where r is the initial estimate of the distance between Anchor0 and Anchor1. We use a left hand coordinate system with y pointing upward. During the WCS definition process only z coordinate may change. The zeroes are immutable by definition. Anchor1 lies on the z-axis of the WCS coordinate system. The North vector is a direction vector parallel to the z-axis.
   c. Anchor2: Anchor2.1 is set to (x, y, z) which is the initial estimate of the WCS position after definition of the origin and North vector. These values will likely move a lot during the synchronization process to the WCS.
7. The user is instructed to go the origin. Once Delta0 is measured to be stable, the origin is considered stable and the user's position is calibrated.
8. The user is instructed to go to Anchor1 to define the North vector. Measurements are taken such that Delta1 is calculable. When Delta1 is stable and Anchor1 correctly identifies WAP1.$p$, the distance from Anchor0 to Anchor1 is calculated. The process of going back and forth between Anchor1 and Anchor0 is repeated until the error in the distance between them is sufficiently low. The distance is measured in the local coordinate system of the device. The device's drift is measured at each return to the origin and subsequent measurements are taken with the new drifted starting value. This is important because the correction process ensures that the device accurately places Anchor0 in its local coordinate system, which we assume is subject to an arbitrary amount of drift. The system may use a running average of the distance measurement to determine when the Anchor0 to Anchor1 distance is sufficiently calibrated.
   a. Anchor1.1 is now set and remains immutable unless the user restarts the WCS synchronization process. The WCS is defined at this point; however, the synchronization procedure is not complete. The system calibrates the North vector by calculating the position of Anchor1 in the coordinate system of Anchor0 and then using the result to calibrate the North vector with respect to the local coordinate system of the device. Anchor1 may now be used to correct the position of the device in the same way as Anchor0 is used. It should be noted that the "North" is orthogonal to gravity. The device performs calibration for the up/down direction as it has the IMU necessary for it to measure and react to gravity. Calibration is performed on a continual basis. The rate at which calibration is updated depends on the device.
9. The user is instructed to walk to Anchor2. The same process used to define the label of Anchor1 is performed for Anchor2. The only difference is that this time the user may walk back and forth between Anchor2 and either Anchor1 or Anchor0 or both. The values of the label are calculated in the WCS at each visit to Anchor2. The same running average algorithm may be used on a per coordinate basis of the label, i.e., x, y and z.

The WCS synchronization procedure is now complete. LPS system training and the building of the network of relocation anchor points (RAPs) commence.

Device Drift Correction via Optically Enhanced Anchor Points

To measure the location of one WAP relative to another quickly and accurately, while simultaneously calculating a measurement error bound, typically requires that device drift be corrected. In this method we use an optical identification system to locate the WAP and an anchor point to provide a local coordinate system around/near the WAP. The act of locating of the physical WAP ensures that the measurement is taken from the same location each time, while the coordinate system provided by the anchor point ensures we can correct for device drift. The device is locatable without drift inside the local coordinate system. There are two logically equivalent places to start the measurement from: the origin of the anchor point and the location of the WAP. For consistency with anchor points built later in the process, we choose measuring from the origin of the anchor point's coordinate system. The pair of the anchor point and optically detected location can be checked for self-consistency before each measurement is taken. Taken together, the above implies that it is perfectly valid to say that the device takes the measurement from the same location each time, even though the user may be standing in a different position each time the measurement is taken.

To measure device drift is then simply the act of measuring the perceived drift of the anchor point when the device returns to the local coordinate of the anchor point.

Validation of Optically Enhanced Anchor Point

We start with the device close enough to a WAP to make the measurement WAP.p at time T1. Repeated measurements are taken to ensure the location is accurately known. As soon as the measurement is considered stable, the device creates Anchor and measures Anchor.p. Both WAP.p and Anchor.p are in the same device coordinate system at time T1. Neither one of these numbers is an invariant unto itself. If the device were to move away and come back, the device will have drifted, and hence the measured values of Anchor.p and WAP.p will be different. For robustness we make no assumption about the amount of drift in either position or orientation. Hence, at time T2 the device's coordinate system is best considered as independent of the one at time T1. The difference between Anchor.p and WAP.p, which we call Delta, is an invariant, however, as those two numbers can be measured in a sufficiently short time such that drift will not accumulate in between the measurements. A simple comparison for Delta between two successive samples is |Delta|. The magnitudes of Delta from time T1 and T2 are directly comparable without having to find a coordinate transform between the two.

Now assume that the device has made the measurements at times T1 and T2 and the Deltas have been calculated. Since we required repeated measurements to validate WAP.p was accurately measured in the device coordinate system we can use |Delta| to indicate if the anchor point has moved to a different location at time T2. Hence, if |Delta| at T2 is different than at T1, the anchor point is not in the same place. Two things can be done: the user can look around in attempt to get the anchor point to pop back into position or the anchor point can be rebuilt. In the second case it causes a restart for the measurement being taken. If |Delta| has not changed, then we can inspect the position WAP.p in the anchor point's coordinate to see if it has changed. It is possible, however unlikely, that the location of the WAP was measured to be equidistant to the anchor point but not in the same relative location. Likewise, ignoring the check on |Delta| incurs the slight risk that the anchor point and device both drifted in such a way that the position WAP.p in the local coordinate of the anchor remains the same even though the anchor point has shifted.

WAP1 Location Measurement

Now let us examine the process of measuring the distance from Anchor0 to Anchor1. During this process every measurement is validated as above. This ensures that at each measurement step we are in fact measuring from the correct physical location. Importantly, this reduces the number of iterations required for convergence to the average, and hopefully true, value of the measurement. Each iteration corresponds to the end user walking between WAP0 and WAP1; hence minimizing the number of trips is an important goal.

Figure 16:
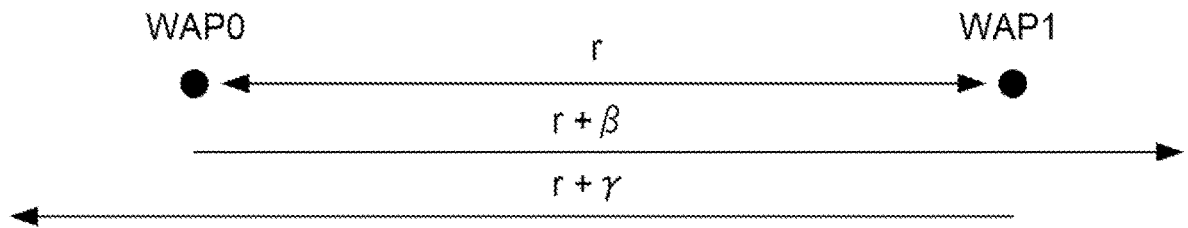
FIG. 16 is a diagram showing an example of drift that a device experiences in movement from between first and second WAPs.

FIG. 16 shows example drift that a device experiences in movement from WAP0 to WAP1. In FIG. 16, $\gamma$ and $\beta$ are drifts that the device experiences when it moves between WAP0 and WAP1. Since we locate the device compared to a physical point at the extremes of each measurement, we do not have appreciable measurement error of the location of the start and end of the path. Hence, we can calculate the estimated distance as $$r_{est} = \frac{\overline{r+\beta}+\overline{r+\gamma}}{2} = r + \frac{\overline{\beta}+\overline{\gamma}}{2} = r + \overline{\beta}.$$

Here we assume that $\overline{\beta}=\overline{\gamma}$, because the path lengths the device moves are approximately equal. Please note that the path length is different than the measurement; the user walks a path to take the measurement. The bar represents average value. We also assume that $\overline{\beta+\gamma}\neq\overline{\beta}+\overline{\gamma}$. In fact, it is quite likely because the two variables are not likely to be independent. We do know however that $\overline{\beta+\gamma}\leq\overline{\beta}+\overline{\gamma}$.

The next goal is to find an upper bound on $\overline{\beta}$ that is directly measurable. The value of $\beta+\gamma$ is trivial to measure, but the above inequality shows its lack of utility in achieving a measurable upper bound on $\overline{\beta}$.

Figure 17:
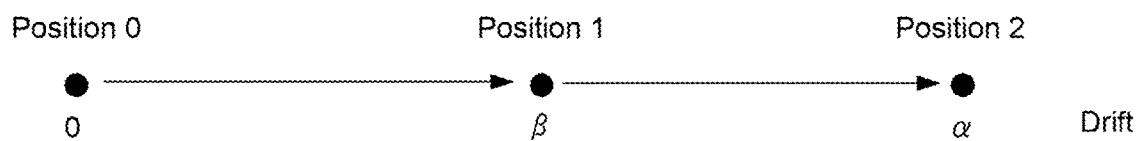
FIG. 17 is a diagram showing an example of accumulate drift.

FIG. 17 shows an example of accumulated drift. In FIG. 17 we assume that the device starts at Position 0 with no drift.

The device moves to Position 1 and experiences a drift of $\beta$. The device then further moves to Position 2 and accumulates a total drift of a. For a quality device the averages of the two are most likely 0, i.e., $\overline{\beta}=\overline{\alpha}=0$. However, if the device does not perform any active drift correction that biases the results based on position we can safely assume that $\overline{|\beta|}\leq\overline{|\alpha|}$. We do expect that all quality devices will perform drift correction, just not in a way that biases a specific location.

Figure 18:
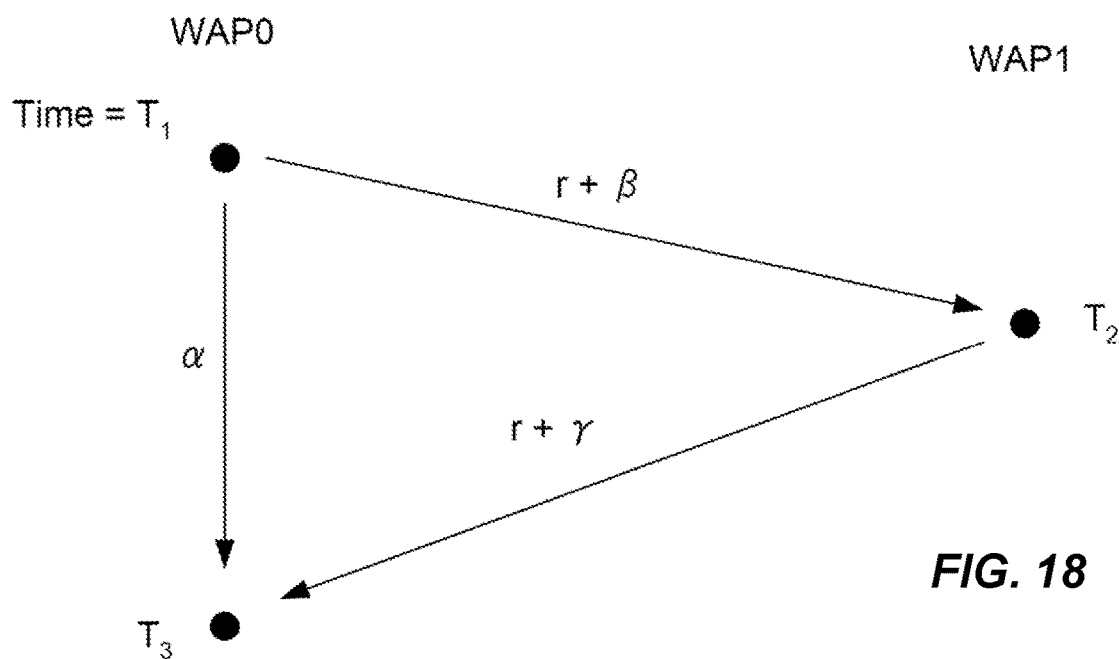
FIG. 18 is a diagram showing an example device drift correction method.

FIG. 18 shows a result of redrawing the FIGS. 16 and 17, with Position 0 & 2 at the location of WAP0 and Position 1 being the location of WAP1.

Our device drift correction method enables us to calculate a directly. Combine this with the well-known fact that $\overline{\beta}\leq\overline{|\beta|}$ yields the upper bound we desire, i.e., $\overline{\beta}\leq\overline{|\beta|}\leq\overline{|\alpha|}$.

From a training perspective the user takes enough measurements to stabilize the estimate of $\overline{\beta}$. To measure the error bound may require more measurements before the estimate of $\overline{|\alpha|}$ stabilizes.

WAP2 Location Measurement

Next, we consider locating WAP2 in the WCS. This WAP performs two important functions. First, it allows for a direct measure of the stability and robustness of the WCS as defined by the first two. This is needed so that the network of relocation anchor points can be accurately placed. Secondly, after training, this WAP will provide another physical location with a known WCS position. Hence, when the device is near this WAP, it will be able to calculate its WCS position with tremendous accuracy. Having three such points available as opposed to two makes the process of creating relocation anchor points take less time.

The WCS position of WAP2 is Anchor2.1. As we saw above, there is no restriction to the values of the three coordinates. Hence, simple magnitude distance measurements will not suffice to determine its location in the WCS. The same mathematics hold in calculating the position of WAP2 as in WAP1. The only difference is that we define R as a vector. The relationship $|\overline{\beta}| \le |\overline{\alpha}|$ still holds and still provides a bound to the measurement error.

Calculating the WCS "North" Vector

Figure 19:
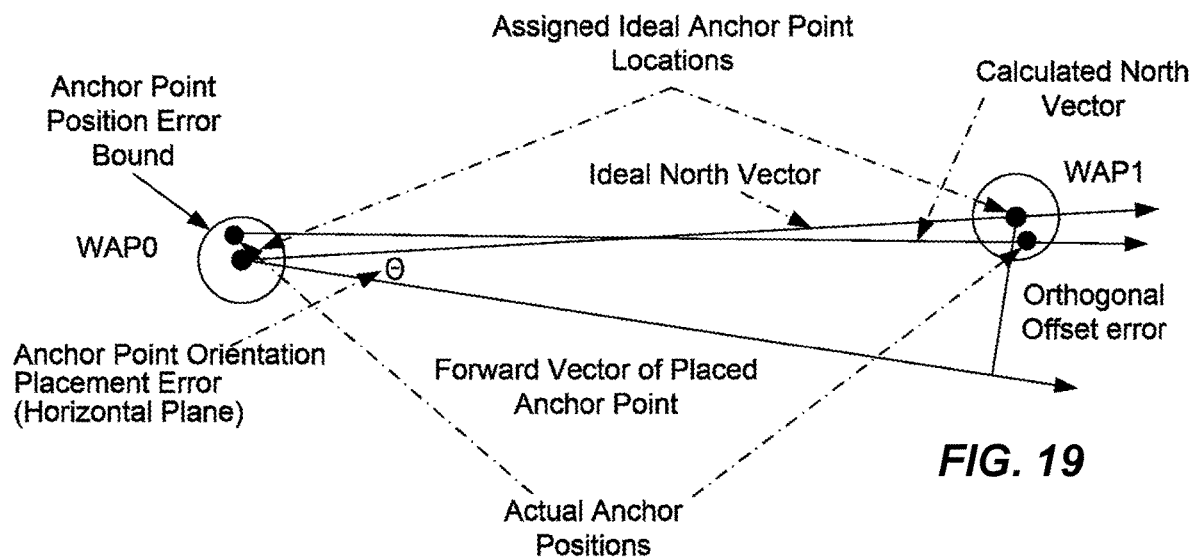
FIG. 19 is a diagram showing example anchor point position and orientation errors.

The WCS "North" vector was defined in the WCS synchronization process as the vector from an anchor point located near WAP0 to an anchor point located near WAP1. The behavior of anchor points is such that every time an anchor point is relocated in the point cloud map, its position and orientation slightly change. An anchor point defines a local coordinate system. One can set the orientation of that coordinate system so that it points in the direction of the "North" vector. FIG. 19 illustrates the anchor point position and orientation errors.

The device is also subject to drift and may relocate itself at any time for any reason. Hence, the error bound around the ideal location of the anchor point is the sum of multiple errors. These errors include:

Location error of fitting anchor point into point cloud map.

Relative drift error, if it exists, of the device compared to the anchor point. Device drift itself is not a problem because the drift cancels out in the calculation of the direction vector.

Anchor position estimate error due to device relocation.

At anchor point creation time the forward vector of the anchor point's local coordinate system is set to the ideal "North" vector. When the anchor point is placed inside the point cloud map, the anchor point orientation is subject to a small amount of error. This causes the forward vector of the placed anchor point to be off by an angle of θ compared to the ideal. Even with all of the various sources of positional error it has been found experimentally that, when the anchor points are sufficiently far apart, the calculated north vector is closer to true than the forward vector of the placed anchor point. The calculation of the "North" vector is simply the subtraction of the head point (e.g., WAP1) minus the tail point (e.g., WAP0).

If two devices have a good estimate of the "North" vector, then the holograms displayed in those devices will appear in the same location. Experimentally we have found that holograms spread at tens of meters are not subject to noticeable positional error due to the lever arm effect of mismatched north vectors. This is due to the inability of two users to share a precise measurement. Obviously, if one user could look through two devices at the same time, smaller errors would become perceptible. This is exactly the problem that occurs, however, when one of the underlying anchor points defining the "North" vector goes bad. A new pair can be immediately chosen, but the new estimate will be slightly off from the old and a slight pop in positions of holograms occurs. This is unacceptable. For this reason, we employ a simple averaging technique.

One could average either the forward of vectors of the placed anchor points or the calculated north vectors in order to obtain an estimate of the true north vector. The forward vectors would simply require more samples than the calculated north vectors because the variance of the directional error of the forward vector has been observed to be higher. Therefore, we use the average of the calculated north vectors over a collection of pairs of anchor points. The calculation of this average is quite simple to perform.

1. Calculate the angle φ of the direction vector calculated between the WCS position values of two anchor points. This calculation is performed on a horizontal plane. Height values of the two anchor points are ignored. In normal operation the WCS values of an anchor point don't change; hence, φ can be calculated and stored for repeated use. Φ is the angle between the calculated direction vector and the "North" vector (which is also a direction vector).
2. Get the position of the anchor points in the local coordinate system of the device and create the direction vector in local coordinates to the device. The device natively supports giving the position of the anchor points in its local coordinate system.
3. Rotate the direction vector in local coordinates of device by the angle (p. This yields a sample calculated north vector.
4. Average over all sample calculated north vectors to create the estimate of the "North" vector.

Utilizing this averaging technique implies that when an anchor point goes bad and any sample associated with it is removed from the averaging calculation, the resulting new average value will not noticeably change from the previous "North" vector estimate.

Calculating Device WCS Position

One of the goals of the WCS is for devices to be drift free when measured in WCS. We can do nothing about a device's local coordinate system drifting. Another goal is that smooth movement of the device results in smooth changes in the measured WCS position of that device. To eliminate drift, we use an anchor point that is close to the device to perform the transform from the local coordinate of the device to that of the WCS. To eliminate pops or ensure smooth measured WCS we take an average of the measured WCS from multiple nearby anchor points. The estimated "North" vector from above along with the device's view of gravity completes the information required to perform the transforms.

By using a good quality estimate of the "North" vector, we can use an arbitrary number of anchor points in the average, up to and including all of them. In practice, it is best to use a few close by anchor points that have the lowest measured $|\overline{\alpha}|$ as defined earlier as those anchor points will have the best position estimates.

Device Capture into WCS

We describe how a device determines its WCS position on startup or after the WCS has been lost. We call this process device capture. We assume that a collection of relocation anchor points has already been created. Capture is complete when the device has created a "North" vector and validated a minimum set of anchor points.

On startup, the system downloads all the anchor points for the device. Once they have been downloaded, they can be visualized by the user with the help of an attached hologram. Using the holograms as a guide, the system guides the user to walk around. The user is instructed to visit the holograms in order to collect mapping data to help accurately place the holograms. The process is complete when the anchor points have been determined to be in the correct place. This determination is made possible by the fact that each of the anchor points is labeled with its WCS coordinate value. At the start of the process, the "North" vector has not been estimated. Therefore, in order to determine if an anchor point is valid, we check consistency with neighboring anchor points. The local coordinate system of every anchor point is an estimate of the WCS. Given any anchor point, Anchor, we check the location of nearby anchor points in Anchor's local coordinate system. If the labeled WCS value of a nearby anchor point closely matches the WCS estimate in Anchor's local coordinate system, we say that those two anchor points are consistent with each other. When a sufficiently large network of self-consistent anchor points has been located, the system generates an estimate of the "North" vector and the device is considered captured.

The density of anchor points determines the ability of the system to detect bad anchor points. If three anchor points are within range of each of other to make accurate estimates, then one bad anchor point is detectable. In general, if N anchor points are within range of each other, then N−2 anchor points can be determined to be bad. This is based on the likelihood of a subset of anchor points shifting together in the same way being unlikely. The caveat for this statement is that the anchor points should be created far enough away from each other such that the device does not optimize and combine anchor points to save device system resources.

It has been noticed experimentally that all anchor points can shift together when the spatial understanding map is corrupted. In this case it is unlikely that the holograms will appear in a reasonable location. If the LPS system is trained, it can be used to immediately detect this error. If LPS is not available, feedback from the user could be used to inform the system that all anchor points have shifted. The holograms used to indicate the anchor points could be labeled with meaningful information to help the user determine that they are in the wrong position.

LPS System Training

There are two distinct things being trained in the LPS system: adjacencies and centroids. Because the antenna coordinate system is not smooth, adjacencies cannot be inferred from the numerical values of the antenna coordinate. On the other hand, the only thing required to train adjacencies is a minimum time between adjacent locator packets. If this minimum is met, then we assume that two antenna coordinates are adjacent. Adjacency training is therefore independent of centroid training and may commence as soon as the WAPs are installed. Centroid training on the other hand requires the WCS. The reason for this is simple: the Cartesian centroid of an antenna coordinate is measured in the WCS. A device may train an antenna coordinate's centroid if the following two conditions hold.

WCS "North" vector is defined.
Device is within a specified distance of a good quality anchor point. The specified distance is device dependent, but 3 meters is a good example.

The above begs the question of the definition of a good quality anchor point.

Anchor points are labeled with their WCS coordinate.
The WCS value of a nearby device as measured by the anchor point closely matches the WCS of the device as measured by LPS, i.e., centroid at antenna coordinate of device.
The relative positions of adjacent anchor points are within a defined error bound. The WCS label on each anchor point permits the measure of this error.

Anchor Point Creation

We now fall back and describe how the anchor points are created in the first place. As stated previously, goals of the WCS are to remove device drift and ensure smooth changes in measured WCS value with smooth changes in device position. We also have the goal to reduce positional error as compared to the ideal as much as possible. As seen above, the device plays a major role in the accuracy of the fundamental measurements. We cannot eliminate positional error as provided by the WCS system. We can however calculate the WCS position of anchor points in such a way as to manage the error in the least harmful way possible.

The easiest way to see this is by example. Say we want to create a line of anchor points between WAP0 and WAP1. We could use WAP0 as the reference and work our way out to WAP1 creating anchor points along the way. The issue here is that this might cause the last anchor point to have the largest error in WCS position. WAP1's WCS value is fixed after all. It is this type of bunched up error we view as the most harmful. Positional error should be distributed as evenly as possible so there is less of a chance of a user ever noticing it. We would not for instance want the shape of a player's avatar to change simply because they are in a different position in the WCS.

Another issue is that the layout of the environment and the placement of the WAPs are unique for each installation. Therefore, the algorithm for creating anchor points preferably allows an anchor point to be created at any point within the playable area and the anchor points should be able to be created in any order without adversely affecting the quality of the WCS position.

There exists a small paradox in the process of creating anchor points illustrated by the following two conflicting facts.

The exact position in WCS of an anchor point is trained over time, becoming fixed only at the end of the training process.
Defining the exact position in WCS of an anchor point before construction is desirable because it simplifies the process of synchronizing multiple different versions of the WCS together as well as synchronizing the devices with the WCS manager. The WCS manager is the piece of logic that determines the locations of the anchor points in the first place. This logic may be located on the game console.

Luckily there is a simple solution to this dilemma. The WCS manager simply needs to tell the device where it would like an anchor point to go in the WCS. The device then places the anchor point in that estimated location. Since the WCS is not fully trained at this point, the device is still suffering from drift, and hence the WCS location is an estimate. The device then takes repeated measurements of the anchor point's position in WCS much in the same way it did for the optically enhanced anchor points. When both the observed WCS position and alpha values stabilize, the anchor point is located within the WCS. Because of device drift, the actual value will be close to but not exactly the same as the desired value as given by the WCS manager. To rectify this, we simply use the anchor point for what it is was designed for in the first place. We attach a game object tied to the anchor point at the precise WCS position that the WCS manager wanted the anchor located in the first place. The orientation of this game object is set to face in the direction of the "North" vector. Typically, an anchored object cannot change orientation but because this object is childed to the anchor point, its orientation is not fixed and the orientation may be calibrated if so desired.

Before discussing the process of building further anchor points, the "North" vector must be discussed. During the creation of these new anchor points we have three trained WCS locations. This is not ideal for the averaging method described before. Since the user is actively training the WCS, it is acceptable if loss of tracking of the "North" vector results in a temporary delay of training until tracking is returned. With the three optically enhanced anchor points we have three direction vectors that can be averaged together in the manner previously described. The difference here is that if one of the optically enhanced anchor points is determined to go bad, that anchor point must typically be relocated or rebuilt. Worst case the entire process might have to start from scratch. This unlikely event could happen if the environment around one of the WAPs changes significantly.

When initially placing an anchor point, the location in the device's local coordinate is calculated by taking the weighted average of the estimated location using each of the three optically enhanced anchor points as the origin. The weight is inversely proportional to the distance from the desired location to the respective optically enhance anchor point. After creation, the anchor point is physically fixed in location so now the process changes to measuring the anchor point's location in the WCS. This is performed repeatedly until the WCS location and alpha value both stabilize. The user is instructed to walk through the playable area so that the user passes by the optically enhanced anchor points regularly in order to validate that they have not gone bad. By doing loops such as this, multiple measurements for each anchor point are averaged together until the WCS and alpha value are stabilized. Each measurement is similarly the weighted average of the WCS position of the anchor point by using each of the three optically enhanced anchor points as the origin. The weight is as previously defined. Adjacent anchor points are compared to for self-consistency since neither the LPS nor optical backup is available at the anchor point to check if it has shifted. After the anchor point has stabilized, the child game object is added as described above.

In this way the error in the WCS is spread evenly, and the boundary case of having error bunched up next to an optically enhanced anchor point is avoided.

Rebuilding an Anchor Point

During normal operation of the game system, an anchor point may go bad and need to be rebuilt. It is not acceptable to require user assistance in order to accomplish this; the device must preferably perform the operation in the background. The loss of a single anchor point is easily handled because the density of nearby anchor points is sufficiently high.

1. Choose the WCS position to place the anchor point.
2. Nearby anchor points make an estimate of the WCS location in the device's local coordinate system.
3. The weighted average of the estimate is used to create an anchor point at the desired location. The weights are once again the distance from the new anchor point to the anchor used as the origin.
4. Assign new alpha value to the newly created anchor point. The derivation of the new alpha value is described below.

Over time as anchor points go bad and get recreated, the alpha values will tend to increase. The WCS manager may track the alpha values, and when a threshold is exceeded, user intervention may be requested to rebuild anchor points using the same mechanism to build them in the first place. In this way the alpha value would be reset to a smallest value possible.

Calculating Alpha Value of Automatically Rebuilt Anchor Point

The alpha value for the newly rebuilt anchor point needs to account for both the translation errors of the existing points as well as the lever arm effects caused by estimating the location of the new anchor in each of the existing anchor points' version of the WCS, i.e., "North" vector plus anchor point as origin. The measure of translation error is the alpha value for the i'th anchor point is $\overline{|\alpha_i|}$, as calculated above. The relationship is shown in FIG. 20.

Figure 20:
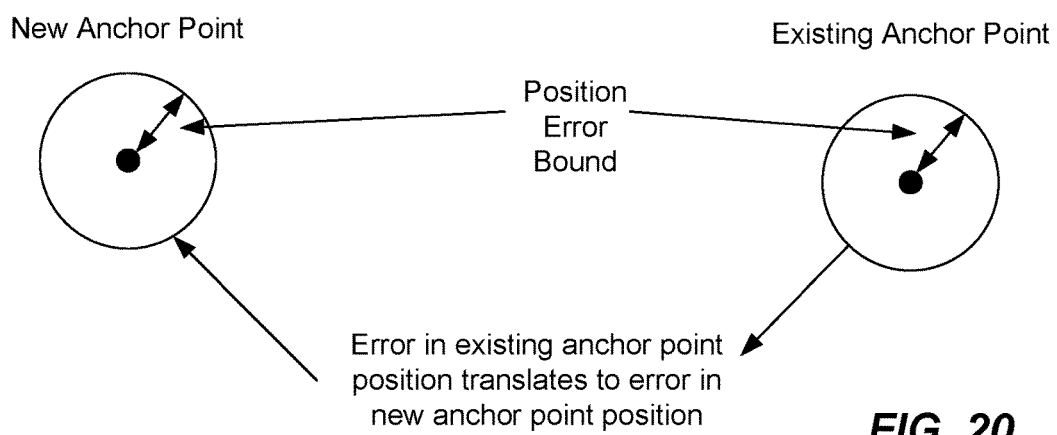
FIG. 20 is a diagram showing an example calculation of an alpha value of an automatically rebuilt anchor point.

In FIG. 20, "Position Error Bound" is $\overline{|\alpha_i|}$.

The alpha value of the new anchor corresponds to the error bound of its location in the WCS. The part due to translation effects is given by $$\alpha_{new} = \frac{1}{N}\sum_{i=1}^{N}\overline{|\alpha_i|}.$$

Figure 21:
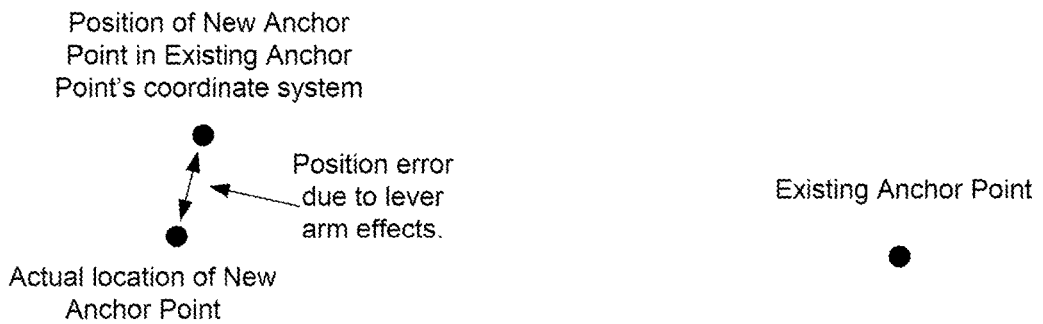
FIG. 21 is a diagram showing an example magnitude of an error caused by a lever arm effect at an i'th existing anchor point.

Let $|\varepsilon_i|$ represent the magnitude of error caused by lever arm effect at the i'th existing anchor point. This is illustrated in the FIG. 21.

We know that the average of $\varepsilon_i$ over all existing anchor points is 0 because that is how the actual location of the anchor point was calculated. To account for the fact that the new anchor point cannot be as accurately located using existing imprecise anchor points we use the heuristic of $$\frac{1}{N}\sum_{i=1}^{N}|\varepsilon_i|$$

to add to the alpha value of the new anchor point. Doing this gives a method for the WCS manager to decide if user intervention should be applied to rebuild the anchor point more accurately. The final alpha value for the new anchor point is therefore, $$\alpha_{new} = \frac{1}{N}\sum_{i=1}^{N}\overline{|\alpha_i|} + \frac{1}{N}\sum_{i=1}^{N}|\varepsilon_i|.$$

Part B: Use of the WCS for Perception Management

The WCS supports many important features that enable it to be used to manage the user's visual perception of holograms within the environment. These include:

1. A common language for devices of different types to communicate in.
2. Placement of holograms independent of environment.
3. Simplified creation and maintenance of virtual models of the environment. Works across device families.
4. Centrally controlled occlusion management.
5. Accurate perception of hologram location.

WCS—The Common Language

Figure 22:
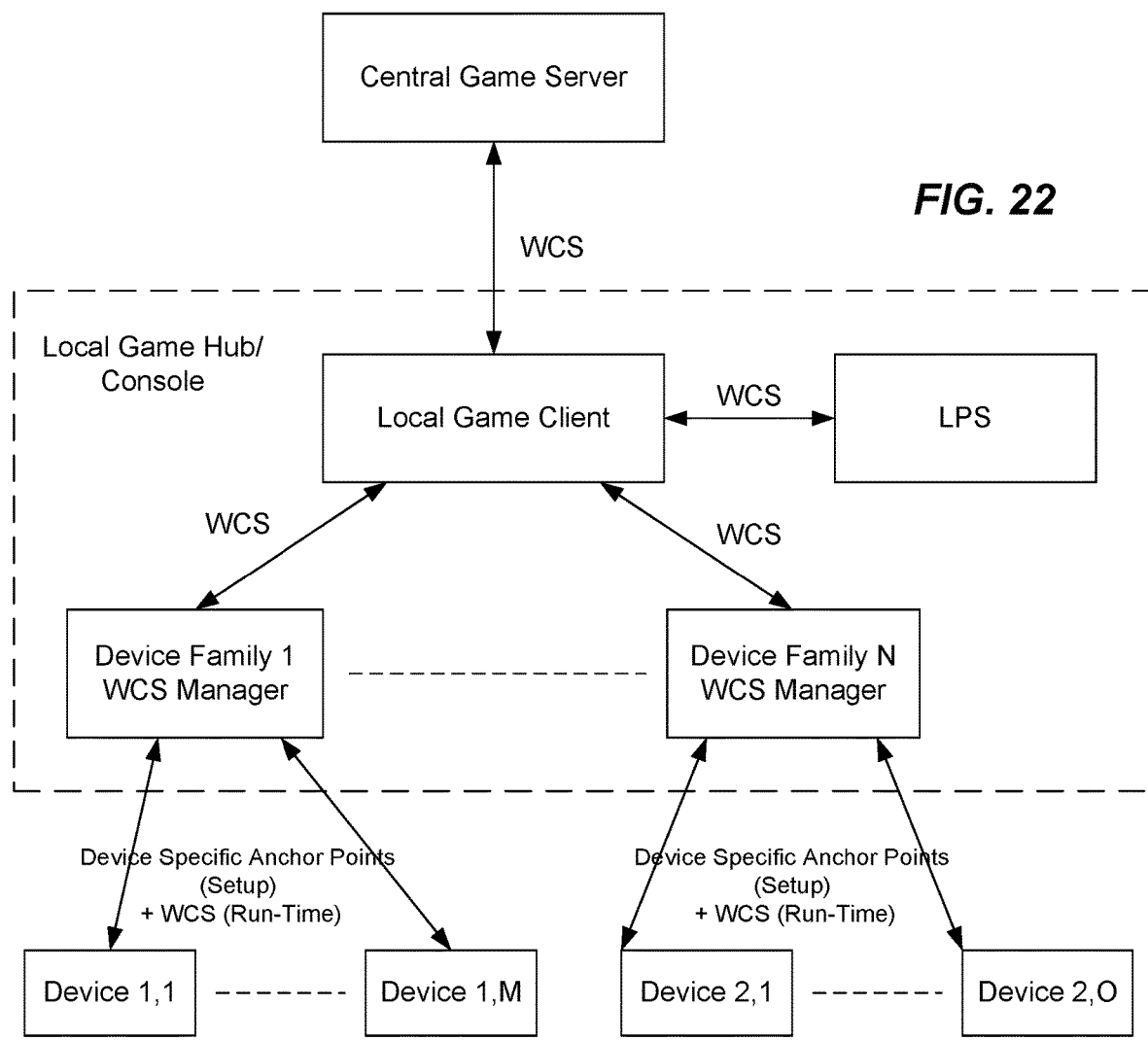
FIG. 22 is a block diagram showing multiple example devices sharing a common language.

Having a coordinate system that is understood by all participating devices/subsystems means that the devices share a common language to communicate about game objects such as holograms and physical players. This reduces the amount of information that must be shared at run time for a game to be supported. FIG. 22 illustrates an example of this arrangement.

During runtime the information exchanged is WCS. This means that even though a multiplayer multilocation AR game is being supported, from an information exchange standpoint it is not much different than a legacy console multiplayer game. Keeping the exchange of detailed anchor point information local and primarily at setup time is a big innovation for Reavire AR games.

Hologram Placement

Figure 23:
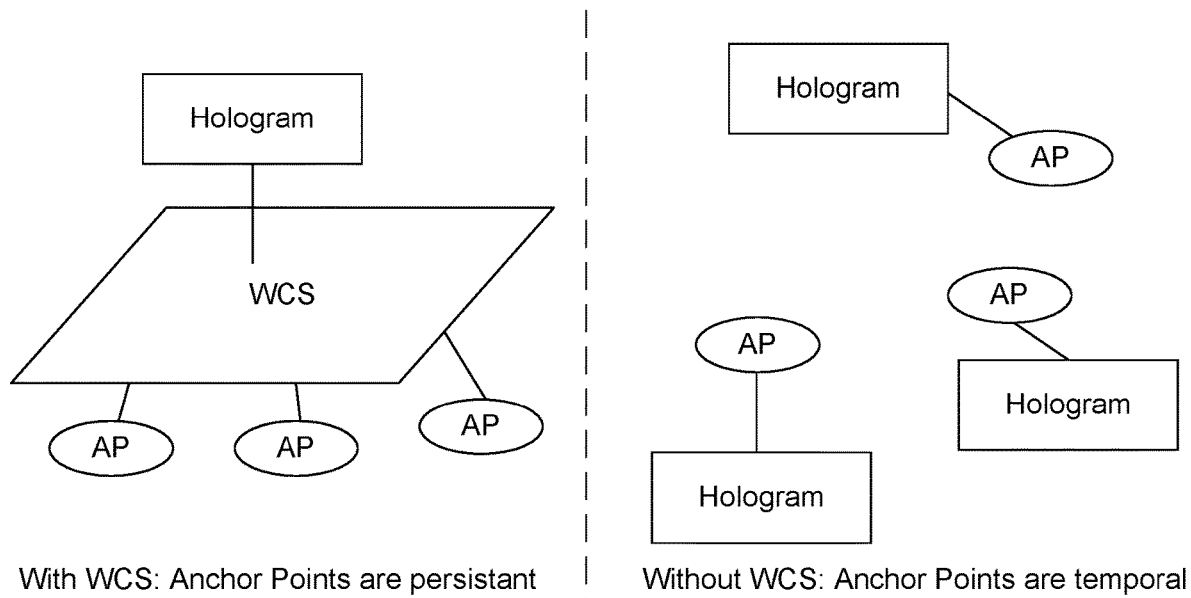
FIG. 23 is a block diagram showing example WCS persistent anchor points vs. non-WCS temporal anchor points.

Holograms are placed in a game in the WCS directly. The implications of this are very important. There is no need to create an anchor point to stabilize the hologram because the WCS is itself actively stabilized. FIG. 23 illustrates and example of this arrangement.

The arrangement of FIG. 23 allows game designers to focus on making fun games and not have to worry about stabilizing holograms and managing anchor points. This makes AR games on the Reavire platform easier to develop than a game directly built on AR glasses. In addition, at run time, Reavire AR games will not have to constantly share anchor points between the local players because they have already been shared pregame and persist throughout the entirety of game play. This is particularly important for high action multiplayer games because the number of holograms is expected to be quite large. In legacy AR games, each new created anchor point needs to be shared with other players leading to possible congestion on the local network, negatively impacting game play.

Another important point is that a centralized game engine can create game objects at will without worry about how they will be placed in a space about which it has very limited knowledge. The only thing the central server needs to know is where holograms can be placed, i.e., a simplified understanding of the playable area.

Additionally, holograms can be placed at great distances from the playable area itself. The WCS is stable enough to show hologram positions accurately at many 10's of meters.

Virtual Models

The creation of virtual models always starts with optical techniques. The device scans the environment and creates a surface mesh of the environment. Most devices include functions or applications to derive higher order geometry from these meshes, such as planes. This in turn is used to detect walls, floor, ceiling, tabletops, etc. The addition of the WCS permits these higher order objects to be efficiently persisted and managed.

In managing an object, e.g., a wall, a user may adjust the control points on a wall object to more closely match the corresponding physical wall. The wall object and its control points are in the WCS so now any other device can load that wall object and have it appear in the correct spot without having to go through the process of identifying and constructing the wall from scratch. In this way the entire playable can be mapped into a virtual model that is defined in the WCS. When a device connects, this virtual model is downloaded to the device and entire virtual model is available to the device without requiring the player to map the playable area before the game ensues. This is in stark contrast to existing AR built on glasses such as the HoloLens, which require the user to scan the area at the beginning of game play. The stability and accuracy of the WCS permit the entire model to precisely match actual geometry even as the player moves around the playable area.

Occlusion

Occlusion is a complicated subject because different devices occlude holograms in different ways. Some devices make occlusion masks, and then use those masks to perform occlusion during the course of the game. Some devices actively occlude all the time, constantly mapping the visible surfaces to create occlusion masks. For devices that create static occlusion masks there is a wide variety of methods in treating the mask after it has been created. The fundamental idea is that the mask is intended to be coherent with the physical objects it is performing the occlusion for. Listed below are three possible methods of managing the premade masks. We assume that the mask is implemented as invisible mesh.

1. The mesh is fit using a best-fit technique similar to how anchor points are fit into the point cloud map.
2. Mask is stored as one big mesh and attached to an anchor point.
3. Mask is broken into pieces and each piece is attached to its anchor point.

Furthermore, the method that the device uses to translate a hologram into its local coordinate to view is a design choice when the holograms are anchored. This affects the position of the viewed holograms. We have no control over either of the above design choices the device made. The static mask method is common because it cuts down the device's computational load in game, saving battery life and improving overall performance.

The problem is that Reavire games are both multi-device and multi-mode. Physical players may use different devices and non-local players view the local terrain in virtual reality mode.

The display behavior of unanchored objects is well defined by devices. The object is defined and shown in the coordinate system of the device. If the device drifts, the object drifts with it. But the relationship between unanchored holograms never changes.

For all these reasons, in the Reavire AR game system, occlusion masks are defined by the simplified virtual model of the playable area. This ensures that all devices behave in the same way and that the game is fair between both physical and virtual players.

Perception

Figure 24:
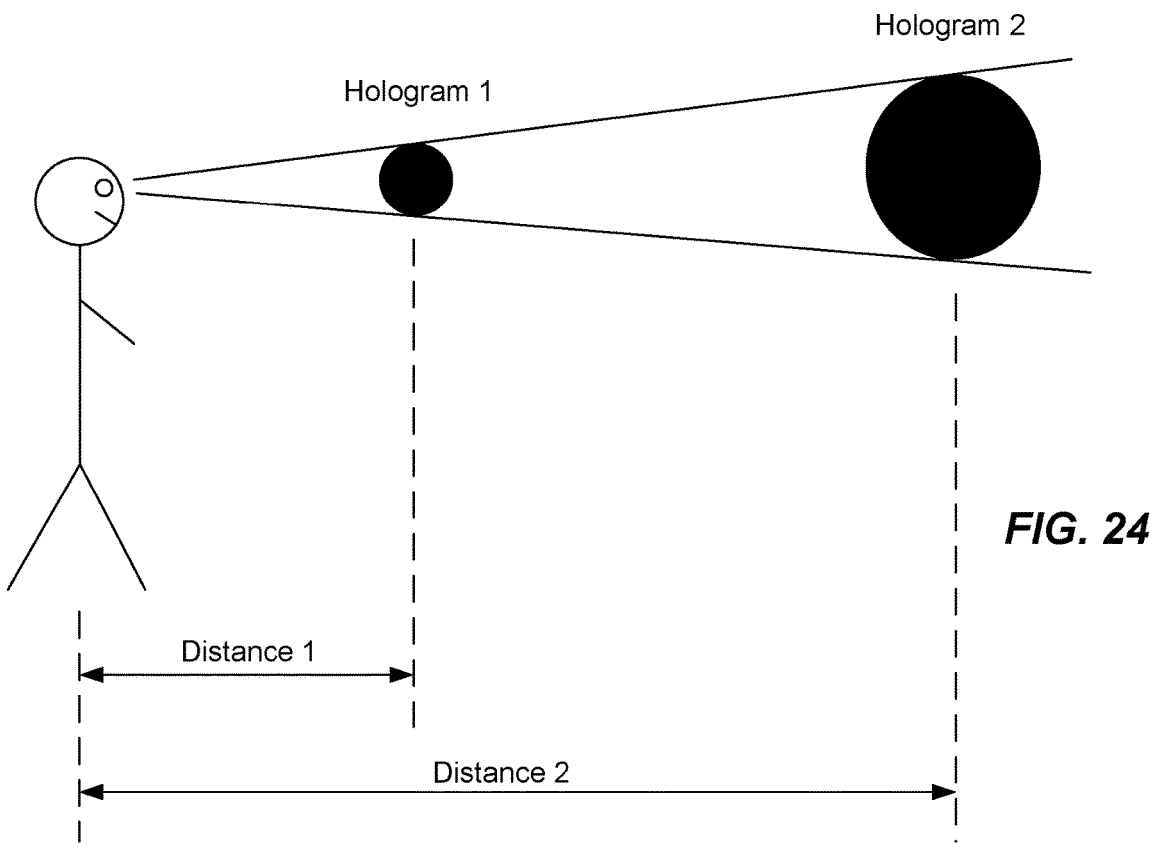
FIG. 24 is a diagram showing a perceived similarity between a small close sphere and a big distant sphere.

The perceived location of any object is aided by many clues: occlusion, lighting, size, etc. The challenge in AR is to provide enough clues such that the player can tell where the hologram is supposed to be. It has been noticed experimentally that without help it is virtually impossible to know where a hologram is when it is past a certain distance from the user. FIG. 24 shows a user looking at a sphere without any contextual clues as to the location.

The user cannot tell if he or she is looking at small sphere close to him or larger sphere farther away because without context they look identical.

Size is an important clue in judging the distance of an object, so if the viewer knows the size of the sphere beforehand, a guess can be made. Experiments have shown that size alone is not enough of a clue to determine the distance.

A very important clue in judging object position is lighting. Physical objects interact with light in the environment and our eyes have become attuned to this, giving us many valuable clues as to the object location. Although it is theoretically possible to add lighting effects to holograms in an attempt to provide these clues, it is a very computationally expensive operation. For this reason, a minimum set of clues is desired to aid the player in determining hologram location.

The simplified virtual model provides an accurate understanding of the location of walls, floors, and ceilings. For the purposes of special clues, the virtual model is not visualized.

It is used for hologram occlusion. Hologram occlusion provided by the virtual model is the first major clue of hologram location.

The next step is to draw lines at the intersection of the walls, floors, and ceilings. This provides a contextual bridge between the real world and the holograms. Grid lines are then added at regular intervals on a subset of these surfaces. This provides distance contextualization. The grid lines tend to work better when they are roughly orthogonal to the user's gaze. Finally, the hologram's location is highlighted on the grid lines either with a grid of its own or a shadowing effect. With this set of clues, it has been experimentally verified that a user can quickly and accurately learn to locate the position of the hologram.

The visuals do not need to be vivid; when they are faint they perform the function well and do not interfere with game play.

Section IV: Motion Capture for Pose Tracking

Part I—Motion Capture Techniques

Sensor Placement Detection

Before a Local Positioning System (LPS) is trained, we cannot use the LPS system to associate a wearable sensor to a body location. In the following sections we discuss yaw correction techniques for sensors at specific body locations. For those methods to work, the identity of the sensors in each body location must be known beforehand. In a fully trained LPS system, it is trivial to detect where each wearable is located because the LPS detects position in a World Coordinate System (WCS). As described in incorporated U.S. patent application Ser. No. 15/656,500, wearables are held in a tray for charging as opposed to leaving the wearables within their straps. This simplifies and reduces the cabling requirements for charging. We assume that the holding tray containing the sensors for a single player is visually identifiable by the AR glasses. The identities of the wearables held in the tray are then known to the controlling software located in the hub. Hence, multiple users can perform the procedure at the same time because each user's set of wearables is known at the beginning. The two classes of sensor position detection are User Interactive and Labeled Hardware.

1. User Interactive: During the avatar training procedure described in U.S. patent application Ser. No. 15/656,500, asymmetric motions can be added to train the sensor locations (e.g., raise right arm/foot or lean to the left or right). As in the Coextensive Reality patent, the user follows along instructions presented to him through the AR glasses. A simple procedure is enumerated below. It should be remembered that the LPS system can perform zero velocity detection before it has been trained.
   a) Lift left arm then right arm. Zero velocity detection makes it trivial to filter out the moving appendage.
   b) Lean chest left and right. If the feet do not lift from the ground, then the waist will not move appreciably. The wrists are already known; hence, the unknown moving sensor must be the one on the chest.
   c) Lift left foot then right foot.
   d) The waist sensor is then known by process of elimination. The system should ask the user to move his waist to test that the device is installed.
2. Labeled Hardware: In this method the straps/sensors are unique to position on the user's body, and each has a unique key that can be read by the system to get the location on the body. The system must verify that the user is wearing the straps. The precise movements are not critical, but each of the sensors should be verified that it is placed in roughly the correct location.

Body Model and Sensor Offsets to Bones and Joints

Since we are capturing the pose of players, we must be able to make a body model for each player. The body model must match the player's physical body because the player's physical movements will be observed through an animated version of the body model. Although there are existing methods for creating a body model, highly precise methods of scanning the user do not scale well to our application. Also, adding cameras solely for the purpose of body model creation is deemed excessive. There exist methods of creating body models by asking the player a series of questions. These are used, for example, by online clothing retailers, as well as researchers in pose detection. Incorporated U.S. patent application Ser. No. 15/656,500 introduced a method for constructing a body model based on the idea that the sensor positions are known (with the help of the LPS system) accurately.

Here we introduce a new method for creating a body model and detecting sensor position. This new method uses the unique capabilities of our system—the combination of the WCS, LPS, AR glasses, and Holographic Mouse. An outline of the main benefits/uses of the various pieces is listed below.

WCS: The WCS not only provides a uniform coordinate system, it also provides knowledge of the space relative to the coordinate system. So, for instance, measuring distance from the floor is trivial with the WCS. The WCS permits the easy integration of multiple devices and device types to work in the same uniform coordinate system.

LPS: The LPS system provides three pieces of vital information: zero-velocity detection, magnetic field direction, and location. Zero-velocity detection, and when indoors magnetic field direction, are particularly important for body model generation.

AR Glasses: Used to measure the body to estimate the body model as well as to provide visualization to the user for instructions and feedback.

Holographic Mouse: When used in body model generation, the mouse is primarily a measurement device. For visualization and to provide feedback, the mouse is used as a general controller.

The body model is built in a specific order, starting at the head and working down from there. Each step builds a new piece of the model. As such, the presentation is in the same order as the user procedure.

Head, Chest, and Waist

The AR glasses along with the WCS provide the location of the user's head in world coordinates. For the purposes of creating the body model, we use the head location as the root of the body model. Each AR glass type (e.g., Hololens) is free to define its local origin for its own coordinate system. We shall describe a typical case in which the origin is on the same horizontal plane as the eyes, centered between them and roughly in line with the front of the eyes. The physical location of the local origin of the AR glasses is the location of the AR glasses in the WCS. We also call this the location of the sensor for the AR glasses, even though the sensor may not physically be there.

The first step of building the body model is to find the location of the ball joint connecting the spine to the neck/head. We can safely assume that the joint is on the centerline of the body, but beyond that measurements are needed. AR glasses are very good at providing a very accurate location, especially differential measurements taken over a short time span. They also are very accurate at measuring orientation. Finally, they provide visualization to the user, which can be used to provide the user with specific, easy to follow instructions. To measure the location of the ball joint, we need two measurements, one to find out how far behind the sensor and one to find how far below. We construct two experiments for the user. The mathematics is as follows. An arc can be defined by a center and radius. Measured points on the arc are used to find a best fit to the center and radius. The first experiment has the user follow by simple head rotation a hologram as it makes a horizontal path in front of the user. The AR glasses can ensure that up to a small error, all rotation is about a vertical axis. The user can be notified and test rerun if the other rotations are detected. Furthermore, the LPS system's zero-velocity detector can be used to ensure that the wearable sensors are not moving, particularly the chest sensor. This experiment makes the measurement of how far back the neck joint is from the head sensor. A second similar experiment is run, this time with the use tracking a hologram moving in a vertical direction, in front of but centered to the user. This experiment yields the straight-line distance from the head sensor to the neck joint. The Pythagorean theorem is then used to get the height difference between the head sensor and the neck joint.

Figure 25:
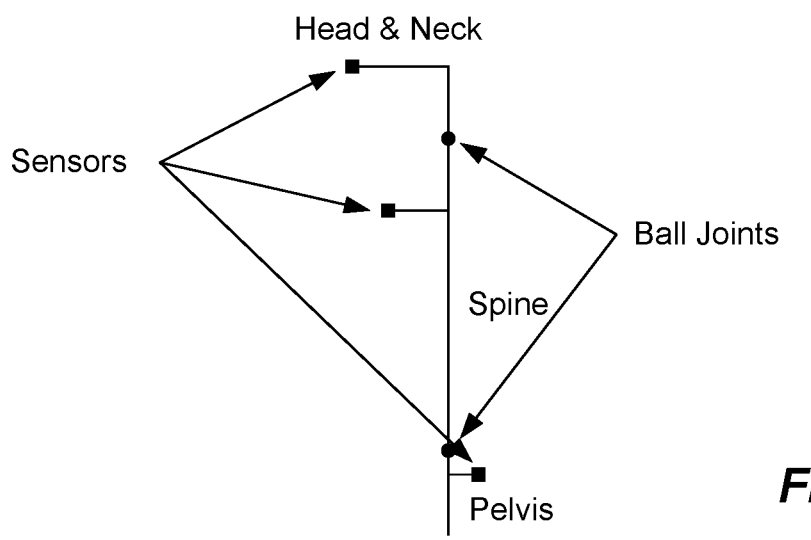
FIG. 25 is a diagram showing an example arrangement for locating ball joints connecting a head and a neck when building a body model.

As shown in FIG. 25, we assume that the ball joint at the bottom of the spine (in the body model) lies directly below the ball joint at the top of the spine. To make this measurement, the user hinges from the hips forward. The same mathematics is used as above (i.e., best fit to arc and Pythagorean theorem). The difficulty here is user error during the movement. A good measurement is achieved when the user can keep his back and neck neutral throughout the movement and keep the waist from shifting back as the user leans forward. The system can easily tell if the waist moves with the zero-velocity enabled Kalman filter tracking that wearable. The user will likely need to rest his back and buttocks gently against a wall with feet slightly away from the wall in order to perform the movement. The head and chest sensors are used to help ensure that the user keeps his spine and neck neutral throughout the movement. The relative angle between the two sensors should not change during the movement.

The sensor positions of the chest sensor and waist sensor are not relevant to the body model for the purpose of pose detection. All that is needed to define the pose for this portion of the body is: chest sensor orientation, waist sensor orientation, and head sensor orientation. However, the chest sensor position and the waist sensor position are needed to train the LPS system.

The chest sensor position is measured with the Holographic Mouse. The mouse is accurately trackable at the chest position. The user simply touches the back end of the mouse to the wearable and presses a button. (The same could be done with the waist sensor, but given its location at the base of the spine and the fact that is not in view of the depth camera of the AR glasses, the measurement would not be as accurate as the chest measurement.)

For a good estimate of the waist sensor position, we can assume that the waist sensor lies directly below the joint at the base of the spine. Since only the height of the sensor is needed, it is also possible to use the mouse to take a measurement on some other part of the strap (in the front) in which case the mouse would be visible to the depth camera. For some body types, this will not work well, but for many it would yield a very good estimate of the waist sensor height.

The orientation offset of these sensors to their corresponding bones is measurable by defining attention position as the neutral or base pose. Attention position is feet together, body upright, head straight forward and arms to the side with palms facing inward. The offset is then the difference between the measured orientation of the sensor and the defined orientation of the bone in this posture.

Shoulders, Elbow, and Wrist Sensors

The next step is to find the shoulder joints. In our simple body model, the shoulder joint position is fixed relative to the spine. Thus, the positions of the shoulder joints are defined by the position and orientation of the head along with the orientation of the spine (chest sensor).

The Holographic Mouse is used as a measuring device to locate the position of the shoulder joints.

The hip joint position is measured directly with the Holographic Mouse (see section below). The same method could be used for the shoulder joint; however, it may be an uncomfortable user experience. Therefore, the following method is recommended.

At this point in the creation of the body model, the following information is available.
Head position and orientation
Spine orientation
Pelvis orientation
Zero-velocity detection of all wearable sensors.

The user holds the Holographic Mouse in its natural use position (i.e., thumb and fingers in position to use the mouse's interface). Similarly to the neck joint, we will have the user move his arm. This time, however, the system will perform a best fit to the surface of a sphere as opposed to an arc. The user holds his arm straight by his side. Then, without bending the elbow or wrist, or changing grip on the mouse, the user moves his arm up/down and side to side through the comfortable range of motion of the shoulder joint. The more position samples the system can collect, the better the estimate of the sphere. The center of the sphere is the shoulder joint position. The averaging provided by the best fit method makes the measurement resilient to minor user error. The system can tell if the user's torso is holding still, both in position and orientation. The user, however, may wish to brace himself against a wall or sit in a chair in order to successfully perform the motion without moving the torso. If the system detects motion, the user would have to rerun the experiment.

The radius of the sphere detected above is the distance from the shoulder joint to the local origin of the Holographic Mouse, not the length of the arm.

The elbow joint position, represented as distance from the shoulder joint, is measured next. We know the chest orientation. We can also detect the position of the Holographic Mouse. Hence, we can detect if the mouse is moving in an arc, and we can detect if the chest direction is parallel to the plane containing the arc movement. The user is also able to brace the elbow against the side of his torso. Therefore, we can be relatively certain that the elbow did not move and a good measurement was taken. We use best fit to the detected arc to get the distance from the elbow to the mouse. We subtract this value from the radial distance measured in the shoulder location experiment above. This yields the distance between the shoulder and the elbow.

It should be noted that the purpose of the system making independent checks ensuring that the user is following instruction is to help the user be successful at creating a body model. The purpose is not to catch people attempting to game the system by adjusting their body model. If the user's body model is not an accurate representation of the user, it is the user who will be hindered. Therefore, the user's incentive is to make the body model as close as possible to his own skeletal representation.

Our pose detection mechanism does not include the hands or the orientation of the wrist joint. However, the location of the wrist is required for a complete body model. The method used is identical to the method for finding the position of the shoulder. The wrist position is found as the length from the shoulder by subtracting off the distance of the wrist to the mouse. The advantage we have in terms of ensuring an accurate measurement is that the user is wearing a wearable sensor on the wrist/forearm and the system can detect if that sensor is still.

In order to get the position of the wearable sensor on the arm, we just need to remember a couple of simple facts. If the arm is held straight and swung through an arc, the accelerometer's output of the sensor will be composed of three accelerations; gravity, tangential, and centrifugal. We know the orientation of both the mouse and the wearable sensor; hence, gravity can be subtracted, leaving just tangential and centrifugal accelerations of the mouse and wearable sensor. But both of these values are proportional to the distance from the center of the arc. The center for both arcs is the same and the mouse distance and both accelerations are known; hence, it is trivial to solve for the distance from the shoulder to the wrist sensor.

The orientation of the wearable sensor on the arm (with respect to the forearm bone) in the body model is the final piece of the puzzle for the arms. Our neutral arm position is arms straight hanging to the side with palms facing each other. This position is chosen for the following reasons:

The system can detect when the user enters this pose even when the sensor positions are lost.

The user can replicate this pose with fairly good precision.

The pose is safe. This pose is used when the user enters into VR anywhere control. As the name suggests, this could happen anywhere in the play space. Keeping the hands at the user's sides reduces the likelihood that the user collides with other users or objects in the environment.

The problem with this pose is that for some users, the arms cannot hang straight down. Therefore, this pose cannot be used for the initial capture of the relative orientation of the wrist sensors. Since the user only needs to train the relative orientation once before play begins, it is reasonable to assume that the user has enough space to extend his arms in any direction. To capture the relative orientation of the sensors, the user extends his arms to the sides or front at shoulder height with the palms facing down. Now when the user places his arms by his sides, the system will accurately reflect the angle of the arms in the neutral position.

Hips, Knees, and Ankle Sensors

The final portion of the body model to capture is the position of the hips and the position of the knees as well as the relative position of the ankle sensors and orientation of the ankle sensors. The leg joints are modeled similarly to the arm. The hip joint is a ball and socket, and the knee joint is a rotating hinge. The difference is that the foot cannot hold onto the Holographic Mouse. For this reason, a more direct approach to measurement of the leg joints is taken.

First, we locate the hip joint relative to the ball joint at the base of the spine. The user stands upright with his feet touching (or as close as he can comfortably place them side by side). The user lines up the Holographic Mouse with the center of the front of the thigh and pushes a button to instruct the system to take a measurement of the Holographic Mouse's position. The same is done with the user lining up the Holographic Mouse with the center of the side of the leg. The user then sits down, ensuring that the upper leg is roughly parallel to the ground. The same measurements are repeated at the side of the leg (and optionally at the front of the leg also). With these measurements, the system can (1) locate the hip position relative to the user's head then in turn (2) locate the hip position relative to the ball joint at the base of the body model's spine.

The relative position of the knee joints and the relative position of the ankle sensors are measured directly with the Holographic Mouse. The user remains in a seated position to take these measurements insuring not to move the feet during the process.

To find the relative orientation of the ankle sensor to the body model's shinbone, the system places two holograms on the floor at hips width apart. The user stands with feet centered on the holograms. The system can then calculate the relative orientation offset. The user is then instructed to stand with feet together, or as close as possible. This defines the leg position for the neutral position posture.

Pose Detection

Pose detection techniques using a sparse set of sensors exist. The main problems they suffer from are that they are not real-time algorithms and they only work in outdoor environments. We present solutions to both shortcomings. This section focuses on improvements to the algorithm to make it operate faster than real time. Our requirement is that one hub (or computer) captures the pose of up to 4 players. This requires significant speedup compared to the present state of the art algorithms. In order to support pose detection indoors without cameras or a large number of inertial sensors, the magnetic field must be compensated for. Magnetic field compensation is discussed in a later section. This section assumes a constant uniform magnetic field throughout the playable area.

We base our algorithm on Sparse Inertial Poser (SIP) as mentioned above. In the standard SIP algorithm, there are as few as six sensors: ankles, waist, head, and wrists. The SIP algorithm is a smoothing algorithm meaning that it looks forward and backward in time to estimate pose. The algorithm uses orientation, predicted vs. measured acceleration, and body model to perform the pose estimation. All sensors at all time steps are considered together to estimate the pose for each time step.

The following enhancements to the SIP algorithm are introduced to convert it to a real-time filter algorithm. A filter can look into the past but not the future.

AR Glasses: The AR glasses solve the pose problem for the head in real time. In conjunction with our WCS System, the position and orientation of the head is known in World Coordinates over the entire extent of the LPS Zone.

Skeleton Measurement: As described above, the system measures and stores the skeletal model of the user. The user is only required to do this once. In the case of growing children, occasionally.

Sensor Offsets: Each time the user puts on the sensors, the user is guided through a simple process to measure the sensor to bone offsets, and in the case of the chest and waist sensors, the sensor to root joint offsets.

Independent of Skinning Method: The standard SIP algorithm is designed with the SMPL body model in mind. Thus, the SIP algorithm is intimately tied to skinning. Our enhanced SIP algorithm works directly on the measured skeleton, and does not use the SMPL body model. Skinning is a post processing step. Any skinning technique can be used so long as it takes a standard description of skeletal pose as input, i.e., root position and a collection of bone orientations.

Chest Sensor: The addition of chest sensor alone does not structurally change the SIP algorithm. It does, however, make our treatment symmetrical with respect to the arms and legs. All appendages will be treated equally. Structurally, each appendage sensor is separated from its root, shoulder or hip, by a rotating lever joint and a ball and socket joint (i.e., forearm/elbow & shoulder or lower leg/knee & hip).

Simple Spinal Pose Detection: The combination of the AR glasses, WCS system, and a simple spinal model permit us to make very good estimates of the position of the waist and chest sensors using just orientation data from those sensors.

Independent Appendages: The chest, waist, and head sensors are not part of our enhanced SIP algorithm. Rather the waist sensor defines the pose of the root, hip, for each leg. This permits each leg's pose to be estimated independently. Likewise, the chest sensor defines the roots, shoulders, for the arms so that they may be independently tracked. Being a root means that the position and orientation of the root joint is taken as input into the enhanced SIP algorithm. Since the root's pose is fixed, the pose of one appendage cannot affect the estimated pose of any other appendage.

LPS Position: Any amount of position bounding helps in reducing accelerometer drift.

State Based Zero Velocity Detection: Along with roots, this is the other major difference that speeds up the enhanced SIP algorithm versus the standard SIP.

Reset Pose: The WCS permits us to tell if a person is standing fully upright. The simple spinal model tells us if the body is lined up straight and head forward. The orientation of the ankle sensors can tell us if the legs are symmetrical. All told, we can detect attention position, and hence we have a reset pose in case the pose tracking is lost. The standard SIP algorithm has this pose as well; the difference is that in standard SIP, the algorithm is told that the user is in this position; whereas, in enhanced SIP, the system detects when the user is in the pose. The reset pose matches the neutral pose introduced in the body model section.

Arm Reset Motion: The arms have too many degrees of freedom for an orientation to uniquely define an arm position. However, the addition of a simple movement can make the end orientation define a unique position of the arm. An example: Hands held at armpit height with palms facing. Move hands in a straight line down until arms fully extended, palms still facing each other. This yields the standard arms at side attention position. The position of the arm sensors is accurately known at the end of the motion. Furthermore, it would be extremely difficult if not impossible for both arms to follow an identical path from a different starting position and end up with the same orientation. Arm reset is not purely system detected. The user must be involved. But unlike the standard SIP, due to LPS and zero-velocity detection, the relative motion is trackable reliably. Hence, the system can validate the end position to ensure that the reset position has been achieved.

Velocity Term: The standard SIP algorithm uses an acceleration term in their energy function. This is done because of accelerometer drift. We use a velocity term instead. We are able to do this because the LPS system and zero-velocity detector sufficiently control the velocity drift. Because of our enhancements, the algorithm runs real time, and hence we benefit from the fact that it only takes two samples to estimate velocity from the skeletal model; whereas, it takes 3 samples for acceleration. The better estimate of acceleration requires a sample in the future, meaning that the system needs to add delay. For velocity, this is not the case; present and previous positions yield a good estimate for present velocity. Thus, velocity does not incur a sample worth of latency. Using velocity also simplifies the calculations of the Jacobians and related matrix inverses for the update step of the steepest descent algorithm. This is obvious to anyone familiar with the SIP algorithm.

Head and Torso Pose Detection

We use a simple model for the spine and neck. The spine is one large bone connected with a ball joint to the pelvic girdle. The top of the spine is connected to the neck and head with a ball joint. The waist sensor is connected to the pelvic girdle. The sensor is connected with a strap going around the waist like a belt. When the user flexes the spine, the waist sensor does not change orientation unless the pelvic girdle itself has change orientation. The chest sensor is connected to the sternum. The sternum is above the belly and the bone is exposed in most people. That location provides a very good estimate of the spine orientation. Direct connection to the thoracic spine is also a possibility but musculature around the spine makes it difficult for the sensor to maintain a snug fit to the bone. The AR glasses are obviously connected to the head. In this way, each bone of the simple model has a dedicated sensor.

This simple model permits us to use position and orientation of the head along with just the orientation of the chest and waist sensor to accurately estimate the positions of the chest and waist sensors. With simple geometry and good measurements, we get the pose of the spine in real time.

This simple model can be made more realistic with an increase in computational complexity. The ball joint connecting the pelvic girdle to the spine could be replaced with a flexible rod approximately the length of the lumbar spine. The same thing could be done to connect the head to spine.

Limb Pose Detection

Each limb is independently handled using SIP with the enhancements and changes described above. To handle the pose uncertainty of the root, we use the received pose of the root as the mean and an estimated covariance matrix to describe possible deviation from the mean. This pose uncertainty goes into the energy function of the SIP algorithm. It is handled similarly to the anthropomorphic term of the energy function. A bone can then be added to the skeletal model between the spine and root joint in order to account for the new estimated position of the root. This concept is required for the shoulder joint because the user's shoulder joint has more range of motion than the skeleton model used by enhanced SIP. For the hip, this concept is required to account for error in the original measurements of the root location.

Extended Pose Detection

Extended pose detection refers to detecting/estimating the pose of a hand-held device such as a Holographic Mouse or game controller based on the detected pose of the player. The device is held in the hand; therefore, it is tempting to simply extend the SIP detection method one more joint (to the wrist) and let the SIP algorithm detect the pose of the device. The problem with this is that, although the device is held in the hand, its relative pose in the hand is not fixed. The user may change his grip at any time. We don't want the change in grip to affect the pose of the arm. If the grip were changed, and SIP run on the extended arm, that is exactly what would happen.

It is technically possible to put sensors on the device to detect grip position (e.g., CapSense sensors from Cypress Technologies). This could be used to ensure that the grip is in a particular position. An issue is that nothing stops the user from changing the grip position, and the system must still give a best estimate if they did so. Furthermore, mapping detected grip to relative device pose is highly unlikely to improve the pose estimate enough to justify the effort. A simpler method is presented below. A very reasonable and helpful use of grip detection is detecting which hand is holding the device. This is easy to accomplish with capacitive sensors by looking at thumb position. This is particularly valuable when the hands are near each other because in that case position-based methods would be likely to give occasional false results.

Due to our enhancements, the SIP algorithm for the arm runs in real time. This implies that the pose of the wrist is known in real time. The rough distance from the wrist joint to the device is known from the combination of the body model detection procedure. See section above: "Body Model and Sensor Offsets to Bones and Joints." Therefore, given the pose of the forearm from SIP and the orientation of the device from the IMUs and associated orientation output of the Kalman filter, an estimate of the device position is easily made. The estimate of the device orientation will typically be quite good because we have gravity and the corrected magnetic field to control drift on the gyroscope. The position estimate is rough from the point of view of the requirements for a true 3D pointing device, but it is better than the IMU can provide alone due to drift accumulation.

The device position is then fed back into the Kalman filter for the final position estimate of the device. This is done to avoid the complicated mess of separately deciding when to use the pose derived estimate. Mixing multiple estimates together is exactly what Kalman filters are designed to do. Therefore, even though we intuitively only need this position estimate when the device is not detected by the sensors on the AR glasses, the estimate is always given to the Kalman filter because it can only make the final position better.

Magnetic Field Yaw Correction and Magnetic Field Mapping

A pointing device such as the Holographic Mouse or a game controller needs to have very accurate yaw relative to the user's view. In order to support a World Coordinate System, this accurate yaw must be known compared to the "north" direction of the World Coordinate System.

It is well known that the magnetic field is not well suited for yaw correction in an indoor environment. Magnetic materials in the building as well as contents of the building almost always cause variations to the magnetic field as compared to the earth's magnetic field in an outdoor environment. However, these variations within a given building are generally stable over time. Even a slight change in the direction of the magnetic field causes problems when one wants to point at an object from a distance. Consider a player in a game of laser tag pointing at an opponent 6 meters away. If a single direction is used to describe the magnetic field in the structure, it is easy to have locations that are a couple of degrees off (and when next to magnetic material, the error could be even greater). With a 1-degree angle error, a point target at 6 meters will be missed by 10 centimeters. At a 2-degree angle error, the target is missed by about 20 centimeters, and at 3 degrees by about 30 centimeters. At 6 meters, it is quite easy for a person to achieve better than 10-centimeter accuracy in yaw (i.e., left/right error). Hence, even a 1-degree angle error of system-induced yaw error would be noticeable to users.

The largest changes to magnetic field found by the authors were caused by rebar reinforced concrete. It was found that the magnetic field near the feet could be many degrees off in yaw from the magnetic field near the chest and waist. Experimentally, in a given location, it was found to be rare for the direction of the magnetic field at waist height to be significantly different than the direction at chest or head height.

To make matters worse, when using a point device, a single direction describing the magnetic field would imply that sometimes the user would have to correct to the left and sometimes to the right, and by varying amounts. This is clearly unacceptable. The solution is to make a map of the magnetic field within the indoor environment. The LPS system permits us to do this because we can distinguish small regions of space uniquely. In each of the regions we can store the direction of the magnetic field relative to our World Coordinate System.

The system set up procedure will include a training procedure that is primarily based on the use of the Holographic Mouse. It would be very unreasonable to expect that the user should visit every possible LPS region within the LPS Zone. The goal is to have yaw correction performed in the background without user participation being required. This automatic yaw correction works because the system can detect the precise conditions under which it should take a measurement of the changing magnetic field orientation in the constant frame of reference of the World Coordinate System. These precise conditions arise (a) when the depth camera sees the Holographic Mouse or (b) when the system detects that the user is moving forward (described below). As the LPS system is self-trained in this manner (for avatar cohesion and mouse pointing accuracy), it will become exceedingly rare for manual yaw correction to be required of the user. The goal is to have the user play a whole game without the need for user participation in yaw correction training.

Mouse, Controller, or Pointing Device Yaw Correction via Depth Camera

The depth camera found on some AR headsets provides a useful method to detect the yaw of a pointing device. The main benefit of the depth camera over stereo cameras is field of view. Typical stereo cameras have a field of view which is slightly larger than the viewing field for holograms. The depth camera, on the other hand, is intended to map space and detect gestures. Gesture detection is performed at short distances from the AR glasses, within arm's length. The designers of the glasses wanted gestures to be detectable even if they are not in the field of view where holograms are visible. The field of view of the depth camera is sufficiently large to detect our Holographic Mouse when it is resting on the user's lap while the user is sitting. This permits a very natural control posture, unlike pointing devices that must be in the stereo cameras field of view in order to function.

Depth cameras are active in the sense that they transmit a pulse of light and process the reflected signal in order to create a depth map. Each pixel of the depth map contains a value representing how far away the corresponding object is. Objects that are too far away are represented as an infinite distance. We use a unique method to create easily detectable regions within the depth map that in turn are used to determine the yaw of the Holographic Mouse.

It turns out that the depth camera can be fooled into thinking that an object at a detectable distance is not there. If the light from the depth camera that strikes the object in question never returns to the depth camera sensor, the object will not be detected and the distance at that pixel will be infinite. The light can either be absorbed or reflected away by the object. Either way, the object will appear invisible to the depth camera. It has been experimentally determined that a shiny black plastic material works well for repurposing a region of the depth map. The Holographic Mouse must be held at a specific angle for the depth camera to see the sheen of the material on the mouse. We ensure by design that the specific angle needed for the depth camera to successfully view the sheen of the material will depend on a Holographic Mouse orientation not otherwise utilized for game play or training. In other words, the system is designed to minimize the likelihood that the user would ever view the Holographic Mouse with an orientation that might inadvertently interrupt the LPS system's depth camera method for yaw correction.

A pattern (of 2 or more integrated patches) of the material is used on the surface of the mouse. The material is visible to the depth camera at the specific angle in the manner described above.

The rest of the mouse is constructed with material that is visible to the depth camera at all angles.

One example pattern used on the mouse is designed so that it can be robustly detected using simple computer vision techniques. The pattern yields a set of points that lie on a line. The linear least squares technique is then used to get the best linear fit of the points. This is all performed in the depth image. In this manner, only two points need to be projected from the depth image to the 3D space. The line defined by these two points is then projected onto a horizontal plane. The projected line then represents the yaw of the Holographic Mouse in the local coordinate system of the AR glasses. The orientation of the AR glasses is known in the World Coordinate System, permitting the yaw of the Holographic Mouse to be transformed into the World Coordinate System as well.

Detection of the yaw of the Holographic Mouse is lightweight enough to be run as a background task, enabling the yaw of the mouse to remain stable even as the magnetic field direction changes as the user moves around the LPS Zone.

Torso Wearables Yaw Correction

There are several methods to correct for yaw of the chest and waist sensors. The common theme is that when the user is walking forward in an upright posture, the paths of the chest sensor and waist sensor are the same as the head sensor's path, save for a difference in elevation. Furthermore, when the user is walking in normal gait, the yaw orientation of the chest sensor and waist sensor will track the direction of the path. In other words, on average, the instantaneous orientation will match the path tangent. Therefore, if the orientation of the path is known in World Coordinates, then the orientation of the wearables can be known in World Coordinates without the help of the magnetic field. Therefore, the magnetic field can be measured and projected into World Coordinates. The average direction of the magnetic field is then stored for that LPS location. After the location has been trained, any sensor is able to determine its orientation in World Coordinates using the measured local magnetic field.

Tracking the path of a sensor is typically done with the use of Kalman filter. Kalman filters come in many variants, but conceptually perform the same function; they mix together multiple sources of information to come up with the best estimate of the state. In our case, state is physical attributes such as position, velocity, orientation.

Kalman filters use something called measurement functions to incorporate measurements from a source. Any number of measurement functions may be used. Furthermore, the frequency in which measurement functions are called is wildly variable. A measurement function is called when the measurement is available. For instance, a zero-velocity measurement function based on a foot strike is called only when a foot strike is detected. Whereas the zero-velocity function based on our zero-velocity detector can be called as frequently as the receipt of each locator packet, up to 60 times per second in an example system.

The way we use the path information as described above is to create a measurement function that is called whenever the user is detected to be walking forward in an upright position. We call this the forward walk detector function. The information used by this function comes from the WCS, AR glasses, and wearable sensors on the player. The following set of tests are performed by the walk detector function.

Height—WCS, Body Model, & AR glasses: The WCS provides the understanding of the play space (i.e., the height of the floor at the present location). The AR glasses provide the relative from the floor. This differential height is then compared to the Body Model of the player to see if the player is upright.

Upright Detection—Chest and Waist sensors: To detect if the user is upright only requires an understanding of the pitch and roll of the two sensors; the relative yaw orientations do not come into play in determining if the user is upright. Hence, magnetic field is not needed. The gravitational field suffices in stabilizing the gyro for pitch and roll measurements.

Path—AR glasses: The AR glasses must be moving at a minimum rate, and the orientation of the head must not differ from the path tangent by more than a threshold. The purpose of these rules is that the chest orientation is far more likely to stray from the path tangent if the two conditions do not hold. An example where both conditions fail is when the user slows down and pivots. A pivot causes a discontinuity in the tangent of the path. The path must be smooth for detection to work.

Forward Movement—Ankle Sensors: The accelerometer signature of forward walking is significantly different than lateral movement. The peak acceleration values occur in a different axis of the sensors, forward/backward for forward motion and laterally for side-to-side motion.

If all the above tests hold true, then with high confidence the user is walking forward on a smooth path. The WCS and Body Model are state data that is continuously available. The AR glasses and various sensors provide periodic updates. The forward walk detector can trigger the calling of the measurement function at each update. Normally there is an upper bound on the rate of calling the measurement function.

There are several options for information to pass to the measurement function. The following are possible candidates with commentary.

Position: The simplified body model permits the easy estimation of the chest and waist position whether the person is walking forward or not. Hence, it is likely that position is handled by a dedicated measurement function.

Velocity: The forward walk detector outputs via its path detection capability the velocity of the head in 3 dimensions. This is easily translated via the body model to a velocity estimate of the chest and waist sensors. The value of this input is questionable considering that the Kalman filter will make an estimate. Since velocity is derived from the same source as the position, it may not provide better performance for the filter to include it.

Path Tangent: When the path is projected to a horizontal plane, the path tangent is the yaw orientation estimate of the chest and waist in the WCS. Although one could argue that this yaw is derivable by the filter itself given the position updates, the lag time for convergence may be unacceptable. Also, the variance of this estimate can be set lower when the belief in the yaw is higher, e.g., when the path is slowing changing in position.

The output of the Kalman filter does not include an estimate of the magnetic field. The magnetic field is an input to the Kalman filter, typically via measurement functions used to stabilize the gyro. To get an estimate of the yaw of the magnetic field in the WCS, the magnetic field is measured in the location coordinates of the sensor. The orientation of the device is then applied to the magnetic field measurement to get an estimate of the direction of the magnetic field in the WCS. The yaw of the magnetic field is then derived and stored in WCS at the given sensor location.

It has been experimentally noticed that the direction of the magnetic field at a given location does not change much from the chest to head height. The AR glasses have an IMU, hence access to the magnetic field. Using the AR glasses, the direction of the magnetic field in the WCS is estimated. It is a trivial matter to calculate the yaw rotation necessary to convert the sensor measured magnetic yaw into the WCS as well. This yields the full orientation of the chest and waist sensors in the WCS as gravity is a constant.

It is not recommended to use this method during the times when forward walking is detected. No assumption is made on the relative magnetic fields in that method. However, if no other estimate is available, this estimate is typically pretty good and when used for the purpose of avatar generation, sufficient. There are corner cases where the magnetic field is quite different at the 3 heights. These corner cases are common enough that one would not want to base the entire torso yaw correction on the assumption that the magnetic field is the same at the three heights.

Ankle Wearables Yaw Correction

The relationship of the ankle orientation to the path tangent is not as direct as the chest and waist but it is strong nonetheless. Normal human movement is caused by the feet exerting force on the surface underneath them. The feet control the path taken. Roughly speaking, the swing of the leg is in line with the path tangent. This is the fundamental idea behind yaw correction at the ankle. The devil is in the details though. In order to get a good estimate of the magnetic field, we need a measurement. In order to get a good measurement, the system needs to be able to detect the difference between a good swing and a bad one. A good swing is one in which the measured direction of the swing is the same as, or very close to, the path tangent direction.

The first thing we note is that the best estimate of direction usually comes from the foot that is both generating the force and moving. We note three basic step types and describe how the system can detect them.

Normal Step—Good: In a normal step, the foot that provides the force to move the body is also the foot that moves. Since joint movement is required to generate force, we check to make sure that the heel of the moving foot is lifted first. From a zero-velocity state, small movements (in this case upward) are detectable. The direction of the measured acceleration vector should also match the direction of the line connecting the launching point and landing point of the foot. Both of these points are well known. Foot strike detection used for standard zero-velocity detection gives the times to sample the foot's path. The pose tracking software gives the estimate of the foot positions.

Drop Step—Bad: In a drop step, the foot that is moving is lifted, thus carrying the torso upwards with the motion; the person then drops the body in the direction they wish to move. The other foot's heel does not need to be raised up. This type of step is detectable by monitoring the height of the waist sensor. If the waist sensor raises past a threshold, i.e. differential height, then this step type is detected. Another way to detect this type of step is that the lateral motion will occur after the foot has left the ground. Detecting this requires the foot to be lifted a sufficient height such that it could not provide lateral force. Note that a person can technically make a drop step without raising the body or foot first, but steps of this kind will generally pass the tests of a normal step and be good as far as the swing test is concerned. This type of drop step, by necessity happens quickly because the only way to pull it off is to have the feet significantly separated.

Launch Step—Bad: In a launch step, so called because this is typical for the first step of sprinting, the foot that does not move provides the force. In order for the nonmoving foot to provide force, the associated knee must bend. The bend of the knee causes the heel to lift or the waist to drop. Both of these actions are detectable by the system and can be used to declare that the step is bad. The launch step can be used with the normal step to redirect the direction of motion. In this case it will fail the test of a normal step. It is also possible to mix a launch step with a drop step. This type of step is used in some martial arts techniques to generate large amounts of force over a short distance. In many cases this will result in a step that satisfies the conditions for a normal step.

Wrist Wearables Yaw Correction

The wrists have too much freedom of movement to benefit from the path tangent yaw correction methods used for the torso and ankle wearables. We separate the problem into two cases depending on whether the Holographic Mouse is held by that arm.

For the hand that is holding the mouse, we assume that the magnetic field at the wrist sensor is pointing in the same direction as the magnetic field at the mouse. The distance between the mouse and the wrist is short. The user would have to be close to a magnetic object for the field to differ appreciably between the two sensors.

For the hand that is not holding the mouse, we assume the magnetic field at the wrist sensor is the same as the hand that is holding the mouse.

Part II—Control Techniques

Weight Shifting Commands

We discuss here the weight shifting commands for controlling user movement through a virtual environment. To reliably detect weight shifting commands requires the ability to accurately measure the relative weight on the front foot versus the back foot. This in turn requires an accurate understanding of the distance between the feet and angle of the control bones. The LPS system position measurement capability is not fine enough to use raw position of the ankles versus torso to determine the weight distribution. Under certain conditions, we can, however, very accurately measure the position of the waist versus feet. First, here is a very quick review from the Coextensive Reality patent. The feet are placed such that one foot is forward relative to the other. The distance between the feet is known as well as the height of the waist. By measuring the angle of the lower legs, we then know how much weight the front leg is bearing versus the back leg. The more weight the front leg bears, the faster the person moves forward. The same is true in likewise manner for the back leg and backward movement. To avoid having to train the control we need to have an accurate measure of the distance between the feet, so that the angle of the lower legs can be accurately translated into a movement speed. We must also be able to tell the forward direction, so the chest can accurately control turning. A similar method is used for sideways movement.

Position Initialization

As stated above, using weight shifting to control movement in VR mode requires a precise understanding of the user's body position. In AR mode, the system only needs to measure body position accurately enough to render a close approximation to the user's body posture. No direct comparison is available to differentiate between the user's pose and the rendered avatar's pose. In weight shift motion control the precise distance between the feet is required in order to convert bone angles to the amount of weight shift over the front foot. The feet are mostly in a zero-velocity state while the user is in VR anywhere control; hence, drift is not a tremendous problem. Our zero-velocity detector does not depend on step detection; hence, it won't be fooled by sliding feet, etc.

As with any velocity drift control method, if accurate position is required, tracking must start in a known position. This is not an undue requirement for the use case of VR anywhere controls. The user is transitioning from AR mode into VR mode, and it makes sense that the user is an active participant in that process. To be thrown into VR mode with no warning would be very disconcerting and unsafe for a user. The start position and its benefits are:

Attention Position: Feet together, body upright. Arms can technically be anywhere, but at sides may help user to achieve the fully body upright posture.
This posture is trained for the user at the beginning of game play; hence, it is well known.
This posture is easy to detect by the orientation of the wearables and height of the head relative to the floor. Our system maps the environment, so we know this information.
The foot position is accurately known.
The foot orientation is accurately known; hence, magnetic field can be compensated for.
The player enters VR in a still and stable posture.
Neutral position is easy to move from.
Neutral position is good generic starting position in VR.

If the duration of time spent in VR Anywhere controls is long enough, positional drift of the ankle sensors may accrue enough such that it notably affects the feel of the weight shift motion controls. To combat this, we provide a simple and quick method for the user to reinitialize ankle sensor position. The user simply clicks their heels together. The user is required to make sharp contact of the sides of the feet so that a sufficiently large signal is detectable on the sensor of each ankle. Such motions are easily detectable with well-known gesture recognition algorithms. For larger players who are not able to make contact between the feet, the same gesture is possible, but it may require a short pause with the feet in attention position in order for the system to successfully detect the gesture.

Although the separate portions of attention position detection are not new, the combination of gesture detection with orientations from the ankle and torso sensor combined with the absolute position of the head relative to the floor is new.

Stance Detection

In VR Anywhere control the user is free to move his feet around inside the limited control area. Only when the user places his feet in the proper relative position should the weight shift commands become available. There are two version of weight shift commands, one for forward/backward motion and one for side-to-side motion. In either case, there is minimum distance requirement between the feet. This ensures that user intent is properly understood by the system (i.e., pivoting or taking small steps to turn should not be misconstrued as weight shift commands). For a user to move forward/backward, the system must be able to detect a front foot. Side-to-side motion is performed when no front foot is detected.

To detect which form of motion control is enabled, the following stance detection algorithm suffices.
1. Label the feet as left and right.
2. The location of the foot is taken as the location of the sensor on the respective ankle wearable.
3. The orientation of the foot is the yaw as determined from the ankle sensor. There is a nearly fixed offset between foot orientation and yaw measured this way.
4. Measure the distance between the left and right feet. If this distance exceeds a minimum threshold, $D_{T1}$, then motion controls of some form are enabled, else terminate algorithm.
5. Draw a line perpendicular to the orientation of the left foot passing through the location of the front foot.
6. Measure the perpendicular distance of this line to the location of the right foot. Call this distance $D_L$.
7. If $D_L$ exceeds a threshold, $D_{T2}$, then it is a candidate to be a front foot.
8. Repeat steps 5 through 7 for the right front to get $D_R$.
9. If one of $D_L$ or $D_R$ exceeds the threshold $D_{T2}$, then that foot is the front foot. Motion controls for forward/backward motion are enabled.
10. If neither or both of $D_L$ and $D_R$ exceed the threshold $D_{T2}$, then no front foot is detected. Side-to-side motion controls are enabled.

Steering and Relative Forward Direction

While a player is in VR anywhere control performing weight shift motion control, they may be facing in any direction. Direction in VR is relative to the current stance of the user. The user must provide a relative forward direction that the angle of the chest can be compared against to determine the degree to which the user turns. Entering the stance for weight shift motion control requires thought/intent from the user. Therefore, it is not unreasonable to expect that they would want to control which way is relative forward. In forward/backward motion control the orientation of the front foot determines the relative forward direction. Users learn to control foot orientation to achieve a comfortable forward direction.

In side-to-side motion the average foot orientation is used to determine movement direction. Neutral movement is ninety degrees to this average direction. Obviously, feet parallel is a very intuitive orientation for this purpose because the chest forward is then lined up with the toes in the neutral position, but this is not required.

We are uniquely able to use foot orientation to determine the forward direction. The direction of the magnetic field near the floor, compared to true north, can change significantly depending on the building materials used. The direction of the magnetic field is not guaranteed to be constant within the confines of the VR anywhere control spot.

Natural Controls and Turning

In weight shift motion control for forward/backward motion, inside turns are far easier to perform than outside turns. Some users may feel a tremendous amount of strain on the front knee or in their back while performing a tight outside turn. For this reason, the user is permitted to change stance during controlled motion; the system detects the user is changing stance and holds the present velocity while the stance change is occurring.

To see why this makes sense, we must consider how the body motion differs for a user intending to stop moving versus changing stance. When a person is moving forward, more of his weight is on the front foot versus the back. To slow down, the user presses the front foot into the ground in order to shift the weight back. The heel of the front foot stays in contact with the floor. If, however, the user wishes to change stance quickly, the front heel comes off the floor immediately. These motion patterns can be broken by someone actively trying to circumvent them, but they are the motions that most users will find very natural.

The lift of the heel is a small motion and therefore it pays to discuss the behavior of the Kalman filter in its ability to track heal height accurately. The standard method of zero velocity detection for the ankle is to detect the heal strike on the ground. A zero-velocity measurement function is then run on the Kalman filter for that instant in time. If the foot remains in place the same measurement function is of no use since it can only be called after a foot strike. A statistical zero velocity detector would not be appropriate for the heel because of the detection lag time when the ankle sensor leaves the zero-velocity state, i.e., it takes too long to detect the heel has been lifted. Our zero-velocity detection method, however, does not suffer from significant lag; hence, we are well suited to detect the heel lift in time to correctly identify the stance change, thus not negatively affecting the user experience by making the user's avatar behavior change in manner contrary to the user's intent.

Velocity Control

Velocity of the avatar is controlled by the degree of weight shift in the direction of control vector. In forward/backward motion, the control vector points in the same direction as the forward vector as defined by the front foot. In side-to-side motion control, the control vector is ninety degrees to the average of the orientations of the feet. Zero velocity is achieved by the user being in a neutral stance, i.e., weight evenly distributed between the legs. This weight distribution is indirectly measured by the position and orientation of the foot sensors and the waist sensors. In essence, it is a specialized pose detection algorithm, with its own unique set of constraints. To be useful, very small differential changes in position must be detectable. On the other hand, absolute position detection must be good but due to limitations of the average user, it need not be perfect. The ability of the average person to accurately sense his weight distribution is limited. The average person can, however, tell if he moved, even a little. We use these facts to our advantage.

We break velocity control into two parts, gross control and fine control.

Gross Control: For large changes to velocity.
  User decides how quickly he wishes to move and make the best estimate of foot position and weight shift to enter this velocity.
  System detects this with good accuracy. For the sake of example, let us assume a position location accuracy of about 1 cm. Accuracy such as this is achievable because we can accurately initialize waist position and foot position.
  System feedback tells the user how fast the avatar is moving.
Fine Control: For incremental changes to velocity.
  Ankles are in zero velocity state, so pitch and roll angles can be very precisely measured.
  When waist is in zero velocity state, raw phase of zero velocity detector can be used to control the variance of the zero-velocity input into the Kalman filter.
  Together the above two fine measurements permit fine differential position measurements of the waist.

As an example, let the range of motion, for forward movement, of the waist along the direction of the control vector be 30 cm. This control is replacing a joystick on a standard game controller. A low dynamic range for such a joystick is 8 bits or 256 distinct values. Assuming half are used in the positive direction, the position accuracy required is approximately 2.34 mm. Even for this relatively coarse example, we see the need for fine control.

Holographic Mouse Stabilization Techniques

A user holds a Holographic Mouse; hence, no matter how accurately the mouse can be tracked, user error will always be present. The primary cause of user error is instability of the hand. For a standard computer mouse this instability is compensated for by friction between the mouse and the surface and by the fact that the user's arm is supported as well. Together this enables even those with very shaky hands to smoothly and accurately control a standard computer mouse. The standard method for providing the corollary to the 3-dimensional pointing device is via a joystick, trackpad, roller bar, etc. The simple idea is that the hand provides the stable base and the thumb is the actuator. Incorporated U.S. patent application Ser. No. 15/655,489 introduced two such control concepts, click to capture and the slicing plane.

The next level is to try to provide stability to the cursor of the mouse. There are two standard cases to consider, translation and rotation versus just rotation or equivalently non-stationary versus stationary.

Translation and Rotation: In this case the mouse is moving, i.e., not in a zero-velocity state. The position of the mouse must be taken into account on a real-time basis to place the cursor in the correct spot. The movement distance should be on the same order of the distance from mouse to cursor. Thus, the far field effect does not come into play. In other words, the mouse position must be considered along with the mouse orientation for a believable cursor position. The cursor lies on the virtual ray emanating from the end of the mouse.
Rotation Only: In this case the mouse is stationary. That is, its movement is small compared to the distance between the mouse and cursor. In this case the far field effect applies, a fixed position is chosen and only the orientation of the mouse is used to change the location of the cursor. In this case the cursor lies on the virtual ray emanating from the fixed position. The orientation of the virtual ray is controlled by the mouse orientation.

Both of these standard cases lead to acceptable cursor stability given the current state of the art in position and orientation detection. What is lacking is acceptable behavior for truly three-dimensional control experience. Consider the following simple example. The user wishes to move a hologram from one location to another using only the position and orientation of the mouse. Assume that the cursor is at a fixed distance of 1.5 meters from the mouse. When the cursor makes prolonged contact to the hologram, the hologram is grabbed and held by the cursor so that the hologram is now at a fixed distance of 1.5 meters from the mouse. During big movements, even though the position of the hologram may be in error, the error will not detract from the user experience. The problem is when the user slows down and wants to place the hologram in a specific location. Once the user slows down sufficiently, the present state of the art states to pick a location for the base of the virtual ray and only use orientation of the mouse. Unless the user is exceedingly skilled or lucky, the base of the virtual ray is highly unlikely to be precisely 1.5 meters from the location that the user wishes to place the hologram. Small translations of the mouse will have no effect on the position of the hologram. If the user moves slowly a sufficient amount, the base of the virtual ray may pop to a new location, which is also highly unlikely to be at the correct distance. If the user moves quickly or a large amount, control reverts to the less precise method the user started with in the first place.

This problem could be solved with the use of the thumb on the touch interface, but this violates the spirit of the mouse being a truly 3-dimensional pointing device. In fact, we argue that a pointing device is not truly a 3-dimensional pointing device unless it can perform the above example task via movement of the mouse alone.

We solve this problem by using our unique zero-velocity detector. By using this zero-velocity detector we can make very precise differential movements based on translations of the mouse. At the time that the zero-velocity state is entered, the positional error may in fact be large. But while in the zero-velocity state, we can detect the relative position of the mouse with great precision. This means that even though the position of the mouse may not be known with sufficient accuracy, the position of the placed hologram can be controlled with sufficient accuracy.

Holographic Mouse/Controller: Supported User Interface Use Cases

This section covers use cases of the mouse that are reasonably expected to be supported. In VR, cameras look at the user thus allowing arbitrary user motion to be supported. Below is a list of example user actions that are supportable in camera-based VR systems, but not in general by AR glasses.

Throwing Objects: It is very natural in throwing motions for the arm to move behind the head and be held there for an indeterminate amount of time. If the arm moves out of range of the sensors on the glasses, positional drift will quickly accumulate. IMUs are well known to suffer from drift and need some method to control drift.

Two Handed Objects: Some objects such as a pool cue or a bow (and arrow) are two handed. The hand in the back is generally not visible to the AR glass sensors. A sword is different in that the hands move together. In this case, it is common for both hands to go out of view of the sensors on the AR glasses.

Holstering: In many games a user may wish to holster his weapon with the intent of some game action taking place. The location of the holstered position could affect the behavior of the game (e.g., on the left side waist user could change weapon type, right side could be re-load, and front side could be a utility belt).

Sightless Aiming: Here sightless refers to the AR glasses not being able to see the controller with any of its sensors. Holding the controller near the waist or with arm extended out to the side are the most common examples. Pointing behind the back is another possibility.

Marshalling and Flag Semaphore Signals: Marshalling signals are used for instance by Marshallers to guide airplanes into the gate. Flag Semaphore Signals are a more general telegraphy method in order to convey information visually. In any case, the arms and hence controllers are out of view of the AR sensors the entire time.

Our system can support all of these features because of our unique zero velocity detection mechanism in combination with extended pose detection. Zero velocity detection does a good job of controlling positional drift while the controller is still. However, if the user is moving, then extended pose detection provides a better pose estimate of the mouse/controller.

The following features are supported in our system because the zero-velocity detection is state based instead of event based. Drift is well controlled during the event, and with the use of a Kalman filter, small relative changes in position are accurately detectable. This is the same fact that permits VR Anywhere controls to function. Here, the main thing it does for us is to break the far field assumption. In the far field assumption, the position of the device is fixed and the controlling ray is only affected by changes to the angle of the device.

Nudge: An object (hologram) can be nudged in any direction. With the far field assumption, the object can only be nudged on the surface of a sphere whose radius is the distance from the controlling device to the object.

Control Point Manipulation: Identical to nudging, but this time a control point is being finely manipulated in true 3D. Common use would be in manipulating the simplified model of the play zone. The user can manually adjust the walls, furniture, etc.

Fixed Length Grip: A hologram can be placed in a specific position by movement of the mouse alone. No user interface on the mouse is required to control movement. As stated previously this is a good definition for a true 3D mouse.

Holographic Mouse: User Interface Ideas

The following are new ideas for control and interaction in AR. The WCS is a common theme in these user interface ideas. Our WCS was described in the Coextensive Reality patent. For our purposes here, the following differentiates a World Coordinate System from the use of anchor points and legacy coordinate systems used in VR and computer games. There may be any number of other methods to describe a World Coordinate System. Anchor points are the legacy method of tying virtual content to the physical environment.

Differentiation with traditional anchor points:

A WCS permits an entity, local or not, to place content in the physical environment with just position coordinates and an orientation. A WCS is also self-healing and rebuildable. For our WCS, the resulting object is persistently associated with that location for as long as the defining physical markers for the WCS have not been moved. This is true even if the environment undergoes radical physical changes just as long as those changes do not affect the relative position of the WCS defining physical markers. See U.S. patent application Ser. No.

15/656,500 for details. On the other hand, if an anchor point is lost, all associated virtual content is decoupled from its position in the physical environment.

Differentiation with coordinate systems used in VR and legacy computer games:

In VR as well as legacy computer games, a world coordinate system is a primitive built into the core of the game itself. This is not so in AR. In AR, a world coordinate system requires a supporting object or objects for the coordinate system to exist. The supporting objects are either physical or derived from physical objects (e.g., anchor points). The coordinate system is not the primitive. The supporting object in legacy AR systems is the anchor point. The supporting objects in our WCS are the physical markers used to define the underlying coordinate system.

We can further define an Enhanced WCS.

Enhanced WCS: Our World Coordinate System (WCS) is an enhanced WCS. Any physical object with a compliant Wi-Fi interface can be tracked and locatable in our WCS without the physical object having to be seen by the AR glasses. That increases the extensibility of our overall system because additional devices can be tracked.

Technically, enhanced WCS permits native physical objects and non-native physical objects to be located in the same coordinate system.

Native physical objects are those designed to work with AR glasses and the LPS system. This includes the Holographic Mouse and Reavire wearables.

Non-native physical objects are those designed to work solely with AR glasses. For instance, this includes the Hololens and an MS VR controller or Magic Leap and a pointing device.

The LPS system can find any system that has a compliant Wi-Fi interface and the LPS system will locate that object within the WCS.

This definition does not preclude a camera-based Enhanced WCS. In that case, just about any object is locatable, including tracking body parts (e.g., for avatars).

An AR system that supports a WCS has the following unique capabilities:

Extending WCS: Having a persistent WCS means that one can project persistent virtual objects outside of the physical confines of the LPS Zone. In this case it may be impossible to tie the object to an anchor point at an appropriate distance from the anchor point. The lever arm effect of individual anchor points means that a hologram should be at most a few meters from the anchor point. The WCS suffers from the level arm effect as well, but to a lesser extent because of averaging, training and self-healing.

WCS to True North: Because the WCS is persistent, the relationship between WCS north and true north is fixed. This difference can be measured using, for instance, magnetic field measurements and rough location on the earth.

Haptics based on WCS location: In VR, haptics can be triggered by anything, including where any part of the avatar is located. This is because in VR the avatar is in a world coordinate system. For this to work in AR in a similar manner, a WCS must be available. For this to work with arbitrary body parts, an Enhanced WCS must be available.

Enhanced WCS Position Based Controls: There are two variants of position-based controls as listed below:

Interaction with a virtual object: Here we must be very careful because it is already common for users of AR glasses to interact with holograms with their hands. In this case the hands of the user must be observable by the glasses. By requiring an Enhanced WCS the controlling object does not need to be in view of the AR glasses for the control to occur.

Behavior of device based on location: The user interface of the device and/or gestures made by the device can have different meaning based on WCS location or region. A fine gesture such as twisting the mouse in a specific location could mean to unlock a lock; whereas, that gesture might be meaningless elsewhere. Similarly, the buttons may take on specific meaning in a region, even rendering them nonfunctional in a specific region is possible.

View Based Controls: View based controls means that the behavior of the mouse or controller depends on where the user is located and which direction he is looking. The user need not necessarily be looking at a hologram.

Auto Lock: In this concept, when a hologram is brought into focus, the UI of the mouse/controller takes on the special behavior for this specific hologram. Because the number of different types of controls is essentially unbounded, the AR glasses can project instructions near the hologram, near the mouse or both. The most common type of instruction would be an icon depicting what an input does. Each button, D-pad, etc. would get its own icon. In order to support gestures, Auto Lock needs the Enhanced WCS because it should function even if the mouse is not in view of the glasses. In this scenario, it is possible that the cursor of the mouse pops to a location on the hologram with cursor movement becoming relative to the last position of the mouse before the cursor popped. This method is different than the click to capture concept presented in U.S. patent application Ser. No. 15/655,489 because the user must continue looking at the hologram. This concept is also different than the cursor being controlled by AR glasses, as in Hololens. The hologram is in focus when it is in a viewing frustum. This small difference is critical when it comes to user comfort.

Mouse Over Select: In the mouse over select concept the mouse cursor must be touching the hologram to indicate user intent to interact with the hologram, as well as the hologram being in view. This is different than the click to capture concept presented in the U.S. patent application Ser. No. 15/655,489. In click to capture, a button is pushed and then the pose of the mouse no longer matters with regards to control of the object. In mouse over select the cursor must stay over the hologram, that is the manual selection, not a button-press or other UI action. The hologram-specific UI is used while the cursor is touching the hologram.

By keeping view-based controls in the WCS, the user can be either be physically in front of the hologram or visiting from another location (in VR mode).

Having described certain embodiments, numerous alternative embodiments or variations can be made. Further, although features have been shown and described with reference to particular embodiments hereof, such features may be included and hereby are included in any of the disclosed embodiments and their variants. Thus, it is understood that features disclosed in connection with any embodiment are included in any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as media 850 and 1150 in FIGS. 8 and 15). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and should not be construed as limiting.

Those skilled in the art will therefore understand that various changes in form and detail may be made to the embodiments disclosed herein without departing from the scope of the following claims.

What is claimed is:

1. A method of tracking wearable sensors attached to respective body parts of a user, the method comprising:
   acquiring multiple yaw measurements from a wearable sensor by measurement circuitry within the wearable sensor;
   calculating errors in the yaw measurements based on comparisons of the yaw measurements with one or more yaw references; and
   correcting the yaw measurements by removing the errors.

2. The method of claim 1, wherein said one or more yaw references includes a direction of motion of the user in a physical space, and wherein calculating the errors in the yaw measurements includes:
   determining, by a head-mounted display (HMD) worn by the user, the direction of motion of the user in the physical space; and
   comparing the yaw measurements to the determined direction of motion.

3. The method of claim 2, wherein determining the direction of motion of the user includes testing whether the user is moving forward along a smooth path, said testing including:
   determining a height of the HMD;
   confirming, based on the determined height of the HMD, that the user is in an upright position; and
   confirming that the HMD is moving forward at a rate that exceeds a threshold rate.

4. The method of claim 3, wherein the wearable sensors include first and second sensors placed adjacent to respective ankles of the user, and wherein said testing further includes confirming that a peak acceleration measured by each of the first and second sensors aligns with the direction of motion to within a predetermined difference.

5. The method of claim 2, wherein said one or more yaw references includes a measure of orientation of the wearable sensor determined based on imaging of the wearable sensor by a camera.

6. The method of claim 5, further comprising:
   storing yaw errors in yaw measurements made by the wearable sensor in a data structure based on three-dimensional location in the physical space;
   updating a yaw error at a particular location in the physical space based on a direction of motion of the user as determined by the HMD; and
   updating the yaw error at the particular location in the physical space based and a measure of orientation of the wearable sensor acquired by imaging the wearable sensor using the camera.

7. The method of claim 2, wherein the wearable sensors include first and second sensors placed adjacent to respective ankles of the user, and wherein the method further comprises determining positions of the first and second sensors responsive to the user clicking together the user's heels.

8. The method of claim 1, further comprising detecting a weight-shifting action of the user based on measuring respective locations of sensors on respective body parts of the user.

9. The method of claim 8, wherein the wearable sensors include first and second ankle sensors and a waist sensor, and wherein detecting the weight-shifting action includes comparing positions of the first and second ankle sensors to a position of the waist sensor.

10. The method of claim 9, further comprising enabling detection of weight-shifting actions based on determining that the first and second ankle sensors are separated in space by greater than a predetermined distance.

11. The method of claim 10, further comprising detecting a heel lift of the user based on detecting that one of the first and second ankle sensors has exited a dead-stop state, the dead-stop state based at least in part on wireless signals detected by said one of the first and second ankle sensors.

12. The method of claim 1, further comprising building a body model of the user responsive to detecting a zero-velocity state for at least one of the wearable sensors.

13. The method of claim 12, wherein building the body model is further responsive to directing the user to assume a predefined pose and measuring yaw by each of a set of the wearable sensors with the user assuming the predefined pose.

14. A method of tracking wearable sensors attached to respective body parts of a user, the method comprising:
   acquiring multiple yaw measurements from a wearable sensor by measurement circuitry within the wearable sensor;

calculating errors in the yaw measurements based on comparisons of the yaw measurements with a direction of motion of the user in a physical space; and correcting the yaw measurements by removing the errors.

15. The method of claim 14, wherein determining the direction of motion of the user includes tracking motion of the user by a head-mounted display (HMD) worn by the user.

16. The method of claim 15, further comprising:

storing yaw errors in yaw measurements made by the wearable sensor in a data structure organized based on three-dimensional locations in the physical space; and updating a yaw error at a particular location in the physical space based on a direction of motion of the user as determined by the HMD.

17. The method of claim 16, further comprising further updating the yaw error at the particular location in the physical space based on a direction of motion of a second user as determined by an HMD worn by the second user, responsive to a wearable sensor of the second user entering the particular location in the physical space.

18. The method of claim 17, wherein further updating the yaw error at the particular location includes averaging the yaw error at the particular location with a new yaw error based on a new yaw measurement made by the wearable sensor of the second user.

19. The method of claim 16, wherein the wearable sensors include first and second ankle sensors, and wherein the method further comprises determining yaw errors near a floor of the physical space based on yaw measurements made by ankle sensors worn by the user.

\* \* \* \* \*